(12) United States Patent
Huang et al.

(10) Patent No.: US 10,170,738 B2
(45) Date of Patent: Jan. 1, 2019

(54) BATTERY PACK FOR MOBILE DEVICES

(71) Applicant: mophie, inc., Tustin, CA (US)

(72) Inventors: Daniel Huang, Irvine, CA (US); Matthew Brand, Brooklyn, NY (US)

(73) Assignee: mophie inc., Tustin, CA (US)

( * ) Notice: Subject to any disclaimer, the term of this patent is extended or adjusted under 35 U.S.C. 154(b) by 0 days.

(21) Appl. No.: 15/686,770

(22) Filed: Aug. 25, 2017

(65) Prior Publication Data
US 2018/0076428 A1    Mar. 15, 2018

Related U.S. Application Data

(60) Continuation of application No. 14/569,229, filed on Dec. 12, 2014, now Pat. No. 9,748,535, which is a
(Continued)

(51) Int. Cl.
*H02J 7/00* (2006.01)
*H01M 2/10* (2006.01)
(Continued)

(52) U.S. Cl.
CPC ...... *H01M 2/1022* (2013.01); *G01R 31/3606* (2013.01); *G06F 1/1626* (2013.01);
(Continued)

(58) Field of Classification Search
CPC ....... H02J 7/0042; H02J 7/0044; H02J 7/0045
(Continued)

(56) References Cited

U.S. PATENT DOCUMENTS 3,851,126 A    11/1974  Keller
4,028,515 A     6/1977  Desio et al.
(Continued)

FOREIGN PATENT DOCUMENTS

CN    2506579      8/2002
CN    201033643    3/2008
(Continued)

OTHER PUBLICATIONS

Reexamination Control No. 90/013,319, filed Sep. 18, 2014.
(Continued)

*Primary Examiner* — Edward Tso
*Assistant Examiner* — Aaron Piggush
(74) *Attorney, Agent, or Firm* — Knobbe, Martens, Olson & Bear, LLP

(57) ABSTRACT

A battery pack is provided for a mobile communication device, comprising a casing defining a cavity that conforms, at least partially, to the outer shape of the mobile communication device and one or more rechargeable power cells housed within the thickness of the casing. An internal interface engages a corresponding interface on the mobile communication device to provide power from the one or more rechargeable cells to the mobile communication device. An external interface is electrically coupled to the internal interface in order to transmit signals from the mobile communication device to an external device and may further serve to recharge the one or more rechargeable power cells. The battery pack may also serve as an extendible platform by providing additional integrated communication interfaces and/or processors that can be utilized by the mobile communication device to extend its communication and/or processing capabilities.

30 Claims, 46 Drawing Sheets

Related U.S. Application Data continuation of application No. 12/938,351, filed on Nov. 2, 2010, now Pat. No. 8,971,039, which is a division of application No. 12/357,262, filed on Jan. 21, 2009, now Pat. No. 8,367,235.

(60) Provisional application No. 61/021,897, filed on Jan. 18, 2008.

(51) Int. Cl.
| H04M 1/02 | (2006.01) |
|---|---|
| G06F 1/16 | (2006.01) |
| H04B 1/3888 | (2015.01) |
| H04B 1/3883 | (2015.01) |
| H01M 10/48 | (2006.01) |
| G01R 31/36 | (2006.01) |
| H01M 10/46 | (2006.01) |

(52) U.S. Cl.
CPC .......... *G06F 1/1632* (2013.01); *H01M 10/46* (2013.01); *H01M 10/488* (2013.01); *H02J 7/0042* (2013.01); *H02J 7/0044* (2013.01); *H02J 7/0045* (2013.01); *H02J 7/0047* (2013.01); *H02J 7/0052* (2013.01); *H04B 1/3883* (2013.01); *H04B 1/3888* (2013.01); *H04M 1/0254* (2013.01); *H04M 1/0262* (2013.01); *H04M 1/0283* (2013.01); *H01M 2220/30* (2013.01); *H02J 2007/005* (2013.01); *H02J 2007/0062* (2013.01); *Y10T 29/49108* (2015.01)

(58) Field of Classification Search
USPC .......... 320/103, 108, 113, 114, 115
See application file for complete search history.

(56) References Cited

U.S. PATENT DOCUMENTS

| | | |
|---|---|---|
| D267,795 S | 2/1983 | Mallon |
| 4,479,596 A | 10/1984 | Swanson |
| 4,515,272 A | 5/1985 | Newhouse |
| D284,372 S | 6/1986 | Carpenter |
| 4,951,817 A | 8/1990 | Barletta et al. |
| D312,534 S | 12/1990 | Nelson et al. |
| 5,001,772 A | 3/1991 | Holcomb et al. |
| D322,719 S | 12/1991 | Jayez |
| D327,868 S | 7/1992 | Oka |
| 5,360,108 A | 11/1994 | Alagia |
| 5,368,159 A | 11/1994 | Doria |
| 5,383,091 A | 1/1995 | Snell |
| 5,386,084 A | 1/1995 | Risko |
| D357,918 S | 5/1995 | Doria |
| 5,508,123 A | 4/1996 | Fan |
| D372,896 S | 8/1996 | Nagele et al. |
| 5,586,002 A | 12/1996 | Notarianni |
| 5,604,050 A | 2/1997 | Brunette et al. |
| 5,610,979 A | 3/1997 | Yu |
| D384,327 S | 9/1997 | Nakui |
| 5,708,707 A | 1/1998 | Halttlunen et al. |
| 5,711,013 A | 1/1998 | Collett et al. |
| D392,248 S | 3/1998 | Johansson |
| D392,939 S | 3/1998 | Finke-Anlauff |
| 5,786,106 A | 7/1998 | Armani |
| 5,816,459 A | 10/1998 | Armistead |
| D400,495 S | 11/1998 | Deslyper et al. |
| D400,496 S | 11/1998 | Barber et al. |
| 5,859,481 A | 1/1999 | Banyas |
| 5,864,766 A | 1/1999 | Chiang |
| D405,801 S | 2/1999 | Nagele et al. |
| D407,063 S | 3/1999 | Reis et al. |
| 5,876,351 A | 3/1999 | Rohde |
| D407,708 S | 4/1999 | Nagele et al. |
| 5,896,277 A | 4/1999 | Leon et al. |
| 5,932,855 A | 8/1999 | Wang et al. |
| 5,959,433 A | 9/1999 | Rohde |
| 5,973,477 A | 10/1999 | Chang |
| D417,189 S | 11/1999 | Amero, Jr. et al. |
| 6,043,626 A | 3/2000 | Snyder et al. |
| 6,051,957 A | 4/2000 | Klein |
| D424,512 S | 5/2000 | Ho |
| 6,069,332 A | 5/2000 | Suchanek et al. |
| 6,081,595 A | 6/2000 | Picaud |
| D428,019 S | 7/2000 | Amron |
| 6,082,535 A | 7/2000 | Mitchell |
| 6,171,138 B1 | 1/2001 | Lefebvre et al. |
| D438,004 S | 2/2001 | Watson et al. |
| 6,184,654 B1 | 2/2001 | Bachner, III et al. |
| D439,218 S | 3/2001 | Yu |
| 6,201,867 B1 | 3/2001 | Koike |
| 6,208,115 B1 | 3/2001 | Binder |
| 6,266,539 B1 | 7/2001 | Pardo |
| D446,497 S | 8/2001 | Yu |
| 6,273,252 B1 | 8/2001 | Mitchell |
| D447,462 S | 9/2001 | Kosiba |
| 6,313,982 B1 | 11/2001 | Hino |
| 6,317,313 B1 | 11/2001 | Mosgrove et al. |
| 6,324,380 B1 | 11/2001 | Kiuchi et al. |
| 6,346,791 B1 | 2/2002 | Berguirdjian |
| 6,377,811 B1 | 4/2002 | Sood et al. |
| 6,405,056 B1 | 6/2002 | Altschul et al. |
| D460,411 S | 7/2002 | Wang |
| D460,761 S | 7/2002 | Croley |
| 6,415,138 B2 | 7/2002 | Sirola et al. |
| 6,434,371 B1 | 8/2002 | Claxton |
| 6,434,404 B1 | 8/2002 | Claxton et al. |
| 6,441,588 B1 | 8/2002 | Yagi et al. |
| 6,445,577 B1 | 9/2002 | Madsen et al. |
| 6,471,056 B1 | 10/2002 | Tzeng |
| D469,427 S | 1/2003 | Ma et al. |
| 6,536,589 B2 | 3/2003 | Chang |
| 6,538,413 B1 | 3/2003 | Beard et al. |
| D472,384 S | 4/2003 | Richardson |
| 6,552,513 B1 | 4/2003 | Li |
| 6,555,990 B1 | 4/2003 | Yang |
| 6,583,601 B2 | 6/2003 | Simoes et al. |
| 6,594,472 B1 | 7/2003 | Curtis et al. |
| 6,614,722 B2 | 9/2003 | Polany et al. |
| 6,626,362 B1 | 9/2003 | Steiner et al. |
| D481,716 S | 11/2003 | He et al. |
| D482,529 S | 11/2003 | Hardigg et al. |
| 6,646,864 B2 | 11/2003 | Richardson |
| D484,874 S | 1/2004 | Chang et al. |
| D485,834 S | 1/2004 | Davetas |
| 6,681,003 B2 | 1/2004 | Linder et al. |
| 6,701,159 B1 | 3/2004 | Powell |
| 6,708,887 B1 | 3/2004 | Garrett et al. |
| 6,714,802 B1 | 3/2004 | Barvesten |
| 6,785,566 B1 | 8/2004 | Irizarry |
| 6,794,849 B2 | 9/2004 | Mori et al. |
| 6,819,549 B1 | 11/2004 | Lammers-Meis et al. |
| D500,041 S | 12/2004 | Tsujimoto |
| 6,842,708 B2 | 1/2005 | Odaohhara |
| D506,612 S | 6/2005 | Rosa et al. |
| D508,495 S | 8/2005 | Bone et al. |
| D513,123 S | 12/2005 | Richardson et al. |
| 6,980,777 B2 | 12/2005 | Shepherd et al. |
| D513,451 S | 1/2006 | Richardson et al. |
| 6,992,461 B2 | 1/2006 | Liang et al. |
| D514,808 S | 2/2006 | Morine et al. |
| D516,309 S | 3/2006 | Richardson et al. |
| D516,553 S | 3/2006 | Richardson et al. |
| D516,554 S | 3/2006 | Richardson et al. |
| D516,807 S | 3/2006 | Richardson et al. |
| D517,007 S | 3/2006 | Yong-Jian et al. |
| D520,744 S | 5/2006 | Pangrec et al. |
| 7,050,841 B1 | 5/2006 | Onda |
| 7,059,769 B1 | 6/2006 | Potega |
| 7,069,063 B2 | 6/2006 | Halkosaari et al. |
| D525,582 S | 7/2006 | Chan |
| 7,072,699 B2 | 7/2006 | Eiden |
| 7,079,879 B1 | 7/2006 | Sylvester et al. |
| 7,081,736 B2 | 7/2006 | Seil et al. |

(56) References Cited

U.S. PATENT DOCUMENTS

| | | |
|---|---|---|
| D526,780 S | 8/2006 | Richardson et al. |
| D526,958 S | 8/2006 | Shimizu |
| D530,079 S | 10/2006 | Thomas et al. |
| D535,252 S | 1/2007 | Sandnes |
| 7,158,376 B2 | 1/2007 | Richardson et al. |
| 7,166,987 B2 | 1/2007 | Lee et al. |
| D537,063 S | 2/2007 | Kim et al. |
| 7,176,654 B2 | 2/2007 | Meyer et al. |
| 7,180,735 B2 | 2/2007 | Thomas et al. |
| 7,180,754 B2 | 2/2007 | Qin et al. |
| 7,194,291 B2 | 3/2007 | Peng |
| D540,539 S | 4/2007 | Gutierrez |
| 7,203,467 B2 | 4/2007 | Siddiqui |
| D542,286 S | 5/2007 | Taniyama et al. |
| D542,524 S | 5/2007 | Richardson et al. |
| D543,541 S | 5/2007 | Chung et al. |
| D544,486 S | 6/2007 | Hussaini et al. |
| 7,230,823 B2 | 6/2007 | Richardson et al. |
| D547,056 S | 7/2007 | Griffin et al. |
| D547,057 S | 7/2007 | Griffin et al. |
| D550,455 S | 9/2007 | Barnhart |
| D551,252 S | 9/2007 | Andre et al. |
| 7,266,391 B2 | 9/2007 | Warren |
| D551,856 S | 10/2007 | Ko et al. |
| D553,857 S | 10/2007 | Pendergraph et al. |
| D556,679 S | 12/2007 | Weinstein et al. |
| D556,681 S | 12/2007 | Kim |
| D557,205 S | 12/2007 | Kim |
| D557,264 S | 12/2007 | Richardson et al. |
| D557,494 S | 12/2007 | Mayette et al. |
| D557,897 S | 12/2007 | Richardson et al. |
| 7,312,984 B2 | 12/2007 | Richardson et al. |
| D558,667 S | 1/2008 | Park et al. |
| D558,757 S | 1/2008 | Andre et al. |
| D558,972 S | 1/2008 | Oh |
| D558,973 S | 1/2008 | Hussaini et al. |
| D559,267 S | 1/2008 | Griffin |
| D560,229 S | 1/2008 | Yagi |
| D561,092 S | 2/2008 | Kim |
| 7,336,973 B2 | 2/2008 | Goldthwaite et al. |
| D563,093 S | 3/2008 | Nussberger |
| 7,343,184 B2 | 3/2008 | Rostami |
| D565,291 S | 4/2008 | Brandenburg et al. |
| 7,397,658 B2 | 7/2008 | Finke-Anlauff et al. |
| 7,400,917 B2 | 7/2008 | Wood et al. |
| D574,326 S | 8/2008 | Lim |
| D574,819 S | 8/2008 | Andre et al. |
| D575,056 S | 8/2008 | Tan |
| 7,428,427 B2 | 9/2008 | Brunstrom et al. |
| D577,904 S | 10/2008 | Sasaki |
| D581,151 S | 11/2008 | Aipa |
| D581,155 S | 11/2008 | Richardson et al. |
| D581,421 S | 11/2008 | Richardson et al. |
| D582,149 S | 12/2008 | Tan |
| 7,464,814 B2 | 12/2008 | Carnevali |
| D584,732 S | 1/2009 | Cho et al. |
| 7,479,759 B2 | 1/2009 | Vilanov et al. |
| D587,008 S | 2/2009 | Richardson et al. |
| D587,896 S | 3/2009 | Aipa |
| D589,016 S | 3/2009 | Richardson et al. |
| D589,953 S | 4/2009 | Turner |
| 7,521,935 B2 | 4/2009 | Uchida |
| 7,536,099 B2 | 5/2009 | Dalby et al. |
| D593,319 S | 6/2009 | Richardson et al. |
| D593,746 S | 6/2009 | Richardson et al. |
| D594,849 S | 6/2009 | Ko |
| 7,541,780 B2 | 6/2009 | Nagasawa |
| 7,554,289 B2 | 6/2009 | Idzik et al. |
| 7,555,325 B2 | 6/2009 | Goros |
| D597,089 S | 7/2009 | Khan et al. |
| 7,562,813 B2 | 7/2009 | Humphrey et al. |
| D597,301 S | 8/2009 | Richardson et al. |
| D598,407 S | 8/2009 | Richardson et al. |
| 7,577,462 B2 | 8/2009 | Kumar |
| D600,640 S | 9/2009 | Stein et al. |
| D600,908 S | 9/2009 | Richardson et al. |
| D601,955 S | 10/2009 | Ekmekdje |
| D601,959 S | 10/2009 | Lee et al. |
| D601,960 S | 10/2009 | Dai |
| 7,609,512 B2 | 10/2009 | Richardson et al. |
| D603,602 S | 11/2009 | Richardson et al. |
| D603,603 S | 11/2009 | Laine et al. |
| 7,612,997 B1 | 11/2009 | Diebel et al. |
| D605,850 S | 12/2009 | Richardson et al. |
| D606,528 S | 12/2009 | Khan et al. |
| D606,529 S | 12/2009 | Ferrari et al. |
| 7,635,086 B2 | 12/2009 | Spencer, II |
| 7,638,969 B2 | 12/2009 | Woud |
| 7,647,082 B2 | 1/2010 | Holmberg |
| D609,228 S | 2/2010 | Ferrari et al. |
| D609,463 S | 2/2010 | Bullen |
| D610,538 S | 2/2010 | Wu et al. |
| 7,656,120 B2 | 2/2010 | Neu et al. |
| 7,663,878 B2 | 2/2010 | Swan et al. |
| 7,667,433 B1 | 2/2010 | Smith |
| D610,807 S | 3/2010 | Bau |
| D611,042 S | 3/2010 | Ferrari et al. |
| D611,478 S | 3/2010 | Richardson et al. |
| 7,669,829 B2 | 3/2010 | Ogatsu |
| D613,282 S | 4/2010 | Richardson et al. |
| D615,077 S | 5/2010 | Richardson et al. |
| D615,535 S | 5/2010 | Richardson et al. |
| D615,536 S | 5/2010 | Richardson et al. |
| D615,967 S | 5/2010 | Richardson et al. |
| D616,360 S | 5/2010 | Huang |
| D616,361 S | 5/2010 | Huang |
| D617,753 S | 6/2010 | Cheng |
| D617,784 S | 6/2010 | Richardson et al. |
| D617,785 S | 6/2010 | Richardson et al. |
| D617,786 S | 6/2010 | Richardson et al. |
| D617,787 S | 6/2010 | Richardson et al. |
| D618,231 S | 6/2010 | Fahrendorff et al. |
| 7,733,637 B1 | 6/2010 | Lam |
| D619,573 S | 7/2010 | Khan et al. |
| D619,574 S | 7/2010 | Richardson et al. |
| D619,991 S | 7/2010 | Huang |
| D620,000 S | 7/2010 | Bau |
| D620,487 S | 7/2010 | Richardson et al. |
| D621,394 S | 8/2010 | Richardson et al. |
| D621,395 S | 8/2010 | Richardson et al. |
| D621,821 S | 8/2010 | Richardson et al. |
| D621,822 S | 8/2010 | Richardson et al. |
| 7,778,023 B1 | 8/2010 | Mohoney |
| 7,782,610 B2 | 8/2010 | Diebel et al. |
| D623,179 S | 9/2010 | Richardson et al. |
| D623,180 S | 9/2010 | Diebel |
| D623,638 S | 9/2010 | Richardson et al. |
| D623,639 S | 9/2010 | Richardson et al. |
| D623,640 S | 9/2010 | Freeman |
| D624,317 S | 9/2010 | Wenchel et al. |
| D624,533 S | 9/2010 | Richardson et al. |
| D624,908 S | 10/2010 | Huskinson |
| D624,909 S | 10/2010 | Huskinson |
| D624,910 S | 10/2010 | Richardson et al. |
| D625,303 S | 10/2010 | Kim |
| D626,120 S | 10/2010 | Richardson et al. |
| D626,121 S | 10/2010 | Richardson et al. |
| D626,538 S | 11/2010 | Brown et al. |
| D626,539 S | 11/2010 | Brown et al. |
| D626,540 S | 11/2010 | Brown et al. |
| D626,964 S | 11/2010 | Richardson et al. |
| D628,568 S | 12/2010 | Richardson et al. |
| D628,994 S | 12/2010 | Griffin, Jr. et al. |
| 7,859,222 B2 | 12/2010 | Woud |
| D631,246 S | 1/2011 | Boettner |
| 7,863,856 B2 | 1/2011 | Sherman et al. |
| 7,863,862 B2 | 1/2011 | Idzik et al. |
| 7,872,448 B2 | 1/2011 | Taniguchi et al. |
| D631,877 S | 2/2011 | Rak et al. |
| D632,648 S | 2/2011 | Yang |
| D632,683 S | 2/2011 | Richardson et al. |
| D632,684 S | 2/2011 | Richardson et al. |
| D632,685 S | 2/2011 | Richardson et al. |
| D632,686 S | 2/2011 | Magness et al. |

(56) References Cited

U.S. PATENT DOCUMENTS

| | | |
|---|---|---|
| 7,889,489 B2 | 2/2011 | Richardson et al. |
| 7,889,498 B2 | 2/2011 | Diebel et al. |
| D634,704 S | 3/2011 | Tieleman et al. |
| D634,741 S | 3/2011 | Richardson et al. |
| 7,899,397 B2 | 3/2011 | Kumar |
| 7,907,394 B2 | 3/2011 | Richardson et al. |
| 7,911,530 B2 | 3/2011 | Sawachi |
| D636,386 S | 4/2011 | Richardson et al. |
| D636,387 S | 4/2011 | Willes et al. |
| 7,930,011 B2 | 4/2011 | Shi et al. |
| 7,933,122 B2 | 4/2011 | Richardson et al. |
| D637,588 S | 5/2011 | Richardson et al. |
| D637,589 S | 5/2011 | Willes et al. |
| D637,590 S | 5/2011 | Michie et al. |
| D637,591 S | 5/2011 | Willes et al. |
| D637,592 S | 5/2011 | Magness et al. |
| D637,952 S | 5/2011 | Tan |
| D638,005 S | 5/2011 | Richardson et al. |
| D638,411 S | 5/2011 | Willes et al. |
| D638,413 S | 5/2011 | Magness et al. |
| D638,414 S | 5/2011 | Magness et al. |
| D638,828 S | 5/2011 | Melanson et al. |
| D638,829 S | 5/2011 | Melanson et al. |
| D638,830 S | 5/2011 | Magness et al. |
| D639,731 S | 6/2011 | Sun |
| D640,679 S | 6/2011 | Willes et al. |
| D640,680 S | 6/2011 | Magness et al. |
| 7,957,524 B2 | 6/2011 | Chipping |
| D641,013 S | 7/2011 | Richardson et al. |
| D641,014 S | 7/2011 | Smith et al. |
| D641,974 S | 7/2011 | Stampfli |
| D642,169 S | 7/2011 | Andre et al. |
| D642,170 S | 7/2011 | Johnson et al. |
| D642,171 S | 7/2011 | Melanson et al. |
| 7,983,862 B2 | 7/2011 | Zhang |
| D642,558 S | 8/2011 | Magness |
| D643,029 S | 8/2011 | Feng |
| D643,424 S | 8/2011 | Richardson et al. |
| D644,215 S | 8/2011 | Dong |
| D644,216 S | 8/2011 | Richardson et al. |
| D644,219 S | 8/2011 | Sawada |
| 7,988,010 B2 | 8/2011 | Yang et al. |
| 8,004,962 B2 | 8/2011 | Yang et al. |
| D644,635 S | 9/2011 | Richardson et al. |
| D644,639 S | 9/2011 | Weller et al. |
| D647,084 S | 10/2011 | Fathollahi |
| D647,108 S | 10/2011 | Lee |
| 8,028,794 B1 | 10/2011 | Freeman |
| 8,046,039 B2 | 10/2011 | Lee et al. |
| D648,714 S | 11/2011 | Jones, III et al. |
| D648,715 S | 11/2011 | Jones, III et al. |
| D648,716 S | 11/2011 | Jones, III et al. |
| D648,717 S | 11/2011 | Fahrendorff et al. |
| D649,143 S | 11/2011 | Jones, III et al. |
| D649,539 S | 11/2011 | Hong |
| 8,063,606 B2 | 11/2011 | Veselic |
| D650,810 S | 12/2011 | Lemelman et al. |
| 8,073,131 B2 | 12/2011 | Bodkin et al. |
| 8,084,987 B2 | 12/2011 | Hurtz |
| D652,827 S | 1/2012 | Fahrendorff et al. |
| D652,828 S | 1/2012 | Fahrendorff et al. |
| D653,202 S | 1/2012 | Hasbrook et al. |
| D653,659 S | 2/2012 | Fahrendorff et al. |
| D654,069 S | 2/2012 | Kwon |
| D654,483 S | 2/2012 | Richardson et al. |
| D654,931 S | 2/2012 | Lemelman et al. |
| D655,281 S | 3/2012 | Turocy |
| D655,699 S | 3/2012 | Bau |
| D656,134 S | 3/2012 | Melville et al. |
| D656,135 S | 3/2012 | Swartz et al. |
| D656,495 S | 3/2012 | Andre et al. |
| D658,165 S | 4/2012 | Freeman |
| 8,150,485 B2 | 4/2012 | Lee |
| D658,643 S | 5/2012 | Fahrendorff et al. |
| 8,167,127 B2 | 5/2012 | Martin et al. |
| D662,923 S | 7/2012 | Piedra et al. |
| D662,924 S | 7/2012 | Melanson et al. |
| D663,263 S | 7/2012 | Gupta et al. |
| D663,319 S | 7/2012 | Chen et al. |
| D663,724 S | 7/2012 | Lee |
| D664,091 S | 7/2012 | Pliner et al. |
| 8,224,408 B2 | 7/2012 | Tomasini et al. |
| D665,386 S | 8/2012 | Fathollahi |
| D665,735 S | 8/2012 | Kang et al. |
| 8,245,842 B2 | 8/2012 | Bau |
| 8,247,102 B2 | 8/2012 | Hua |
| 8,255,176 B2 | 8/2012 | Plestid |
| D667,783 S | 9/2012 | Zhang et al. |
| D670,281 S | 11/2012 | Corpuz et al. |
| D670,689 S | 11/2012 | Wang |
| D671,105 S | 11/2012 | Rothbaum et al. |
| D671,106 S | 11/2012 | Rothbaum et al. |
| D671,493 S | 11/2012 | Hasbrook et al. |
| 8,321,619 B2 | 11/2012 | Kular et al. |
| D671,930 S | 12/2012 | Akana et al. |
| 8,328,008 B2 | 12/2012 | Diebel et al. |
| D673,937 S | 1/2013 | Cheng et al. |
| D674,394 S | 1/2013 | Kajimoto |
| D674,789 S | 1/2013 | Wen |
| 8,342,325 B2 | 1/2013 | Rayner |
| 8,355,515 B2 | 1/2013 | Mao et al. |
| D675,603 S | 2/2013 | Melanson et al. |
| D676,032 S | 2/2013 | Stump et al. |
| D676,432 S | 2/2013 | Hasbrook et al. |
| 8,367,235 B2 | 2/2013 | Huang et al. |
| 8,380,264 B2 | 2/2013 | Hung et al. |
| D677,249 S | 3/2013 | Li et al. |
| D677,251 S | 3/2013 | Melanson et al. |
| D678,262 S | 3/2013 | Prato |
| D678,869 S | 3/2013 | Diebel |
| 8,390,255 B1 | 3/2013 | Fathollahi |
| 8,393,466 B2 | 3/2013 | Rayner |
| D679,271 S | 4/2013 | Liu |
| D679,684 S | 4/2013 | Baker et al. |
| D679,695 S | 4/2013 | Fahrendorff et al. |
| D679,699 S | 4/2013 | Piedra et al. |
| D681,020 S | 4/2013 | Magness et al. |
| D682,196 S | 5/2013 | Leung |
| D682,815 S | 5/2013 | Chang |
| D683,338 S | 5/2013 | Wilson et al. |
| 8,439,191 B1 | 5/2013 | Lu |
| 8,452,242 B2 | 5/2013 | Spencer, II |
| D684,554 S | 6/2013 | Park |
| 8,457,701 B2 | 6/2013 | Diebel |
| D685,356 S | 7/2013 | Diebel |
| D685,737 S | 7/2013 | de Jong et al. |
| D686,152 S | 7/2013 | Lee et al. |
| D686,586 S | 7/2013 | Cho |
| D686,606 S | 7/2013 | Hong |
| 8,483,758 B2 | 7/2013 | Huang |
| D687,426 S | 8/2013 | Requa |
| D688,233 S | 8/2013 | Dong |
| 8,499,933 B2 | 8/2013 | Ziemba |
| 8,505,718 B2 | 8/2013 | Griffin, Jr. et al. |
| 8,509,864 B1 | 8/2013 | Diebel |
| 8,509,865 B1 | 8/2013 | LaColla et al. |
| 8,523,124 B2 | 9/2013 | Yuan et al. |
| 8,531,833 B2 | 9/2013 | Diebel et al. |
| D691,990 S | 10/2013 | Rayner |
| 8,560,014 B1 | 10/2013 | Hu et al. |
| D693,801 S | 11/2013 | Rayner |
| 8,579,172 B2 | 11/2013 | Monaco et al. |
| 8,583,955 B2 | 11/2013 | Lu et al. |
| D696,234 S | 12/2013 | Wright |
| D696,238 S | 12/2013 | Murchison et al. |
| D696,240 S | 12/2013 | Kim et al. |
| D697,502 S | 1/2014 | Chu et al. |
| D697,504 S | 1/2014 | Yang |
| D697,902 S | 1/2014 | Fathollahi |
| D698,774 S | 2/2014 | Wardy |
| D698,775 S | 2/2014 | Huang |
| D703,649 S | 4/2014 | Wikel et al. |
| D703,652 S | 4/2014 | Melanson et al. |
| D704,182 S | 5/2014 | Smith |

(56) References Cited

U.S. PATENT DOCUMENTS

| | | |
|---|---|---|
| D704,688 S | 5/2014 | Reivo et al. |
| D705,768 S | 5/2014 | Melanson et al. |
| D706,253 S | 6/2014 | Simmer |
| D706,255 S | 6/2014 | Akana et al. |
| D706,256 S | 6/2014 | Ward et al. |
| D706,272 S | 6/2014 | Poon |
| D709,058 S | 7/2014 | Hemesath et al. |
| D709,439 S | 7/2014 | Ferber et al. |
| D709,485 S | 7/2014 | Bishop |
| 8,788,852 B2 | 7/2014 | Chun et al. |
| D710,344 S | 8/2014 | Smith et al. |
| D710,347 S | 8/2014 | Esses |
| D710,795 S | 8/2014 | Gupta et al. |
| D710,839 S | 8/2014 | Chang |
| D711,312 S | 8/2014 | Tien |
| D711,362 S | 8/2014 | Poon |
| D711,863 S | 8/2014 | Wen |
| D714,274 S | 9/2014 | Jung |
| D714,278 S | 9/2014 | Case et al. |
| D714,295 S | 9/2014 | Fujioka |
| 8,837,156 B2 | 9/2014 | Sun et al. |
| 8,841,798 B2 | 9/2014 | Tuukkanen et al. |
| D716,312 S | 10/2014 | Fujioka |
| D716,784 S | 11/2014 | Wen |
| D716,785 S | 11/2014 | White |
| D717,781 S | 11/2014 | Kim |
| D718,230 S | 11/2014 | To et al. |
| D718,289 S | 11/2014 | Brand |
| D718,291 S | 11/2014 | Hong |
| D718,293 S | 11/2014 | Namminga et al. |
| D718,754 S | 12/2014 | To et al. |
| D718,755 S | 12/2014 | To et al. |
| D718,757 S | 12/2014 | Jaffee |
| D718,758 S | 12/2014 | Jaffee |
| D719,947 S | 12/2014 | Kobayashi |
| D720,341 S | 12/2014 | Sharudenko |
| 8,917,506 B2 | 12/2014 | Diebel et al. |
| D720,738 S | 1/2015 | Rodriguez et al. |
| D720,740 S | 1/2015 | Wicks et al. |
| D721,356 S | 1/2015 | Hasbrook et al. |
| D721,357 S | 1/2015 | Johnson |
| D721,685 S | 1/2015 | Hasbrook et al. |
| D721,687 S | 1/2015 | To et al. |
| 8,933,659 B2 | 1/2015 | Sakai |
| D722,043 S | 2/2015 | Requa |
| D722,312 S | 2/2015 | Tages et al. |
| D723,018 S | 2/2015 | White |
| 8,954,117 B2 | 2/2015 | Huang |
| 8,955,678 B2 | 2/2015 | Murphy et al. |
| D723,530 S | 3/2015 | Namminga et al. |
| D724,065 S | 3/2015 | Fathollahi |
| D724,574 S | 3/2015 | Williams |
| D725,091 S | 3/2015 | Wen |
| 8,971,039 B2 | 3/2015 | Huang et al. |
| D727,883 S | 4/2015 | Brand et al. |
| D728,468 S | 5/2015 | Ferber et al. |
| 9,026,187 B2 | 5/2015 | Huang |
| D732,012 S | 6/2015 | Tsai et al. |
| 9,073,437 B2 | 7/2015 | Matsumoto et al. |
| 9,077,013 B2 | 7/2015 | Huang et al. |
| 9,088,028 B2 | 7/2015 | Huang et al. |
| 9,088,029 B2 | 7/2015 | Huang et al. |
| D738,365 S | 9/2015 | Melanson et al. |
| D739,394 S | 9/2015 | Rayner et al. |
| 9,123,935 B2 | 9/2015 | Huang |
| 9,142,985 B2 | 9/2015 | Arai et al. |
| D740,797 S | 10/2015 | Daniel |
| D741,844 S | 10/2015 | Rayner et al. |
| 9,153,985 B1 | 10/2015 | Gjøvik et al. |
| 9,172,070 B2 | 10/2015 | Huang et al. |
| D744,472 S | 12/2015 | Lerenthal |
| D744,989 S | 12/2015 | Lee |
| D744,993 S | 12/2015 | Diebel |
| D744,995 S | 12/2015 | Lerenthal |
| D746,273 S | 12/2015 | Herbst |
| D746,275 S | 12/2015 | Mohammad |
| D746,801 S | 1/2016 | Pan |
| D748,612 S | 2/2016 | Chan et al. |
| D749,557 S | 2/2016 | Feng |
| D751,058 S | 3/2016 | Cocchia et al. |
| D751,059 S | 3/2016 | Cocchia et al. |
| D751,542 S | 3/2016 | Daniel |
| 9,276,421 B2 | 3/2016 | Weissinger, Jr. et al. |
| 9,313,305 B1 | 4/2016 | Diebel |
| 9,319,501 B2 | 4/2016 | Huang |
| D756,909 S | 5/2016 | Gupta et al. |
| D756,910 S | 5/2016 | Gupta et al. |
| 9,356,267 B1 | 5/2016 | To et al. |
| D759,641 S | 6/2016 | Lai et al. |
| 9,402,452 B2 | 8/2016 | Diebel et al. |
| 9,406,913 B2 | 8/2016 | Huang et al. |
| D765,628 S | 9/2016 | Watt et al. |
| D765,636 S | 9/2016 | Kanazawa |
| D766,819 S | 9/2016 | Gjøvik et al. |
| D767,485 S | 9/2016 | To et al. |
| D768,612 S | 10/2016 | Wright et al. |
| 9,477,288 B2 | 10/2016 | Yang |
| D772,855 S | 11/2016 | Ju |
| 9,495,375 B2 | 11/2016 | Huang et al. |
| 9,576,178 B2 | 2/2017 | Pope et al. |
| 9,577,695 B2 | 2/2017 | Huang |
| 9,583,792 B2 | 2/2017 | Bulur et al. |
| D781,839 S | 3/2017 | Kim et al. |
| 9,748,535 B2 | 8/2017 | Huang et al. |
| D797,091 S | 9/2017 | To et al. |
| D797,092 S | 9/2017 | To et al. |
| D797,093 S | 9/2017 | To et al. |
| 9,751,423 B2 | 9/2017 | Niioka et al. |
| 9,755,444 B2 | 9/2017 | To et al. |
| 9,793,750 B2 | 10/2017 | Miller et al. |
| 9,876,522 B2 | 1/2018 | Huang et al. |
| 9,997,933 B2 | 6/2018 | Huang et al. |
| 2001/0054148 A1 | 12/2001 | Hoornaert et al. |
| 2002/0065054 A1 | 5/2002 | Humphreys et al. |
| 2002/0111189 A1 | 8/2002 | Chou |
| 2002/0147035 A1 | 10/2002 | Su |
| 2002/0193136 A1 | 12/2002 | Halkosaari et al. |
| 2002/0197965 A1 | 12/2002 | Peng |
| 2003/0000984 A1 | 1/2003 | Vick, III |
| 2003/0006998 A1 | 1/2003 | Kumar |
| 2003/0096642 A1 | 5/2003 | Bessa et al. |
| 2003/0151890 A1 | 8/2003 | Huang et al. |
| 2003/0217210 A1 | 11/2003 | Carau, Sr. |
| 2003/0218445 A1 | 11/2003 | Behar |
| 2003/0228866 A1 | 12/2003 | Pezeshki |
| 2004/0096054 A1 | 5/2004 | Nuovo |
| 2004/0097256 A1 | 5/2004 | Kujawski |
| 2004/0104268 A1 | 6/2004 | Bailey |
| 2004/0247113 A1 | 12/2004 | Akatsu |
| 2004/0268005 A1 | 12/2004 | Dickie |
| 2005/0049016 A1 | 3/2005 | Cho et al. |
| 2005/0088141 A1 | 4/2005 | Lee et al. |
| 2005/0090301 A1 | 4/2005 | Lange et al. |
| 2005/0093510 A1 | 5/2005 | Seil et al. |
| 2005/0116684 A1 | 6/2005 | Kim |
| 2005/0130721 A1 | 6/2005 | Gartrell |
| 2005/0228281 A1 | 10/2005 | Nefos |
| 2005/0231159 A1 | 10/2005 | Jones et al. |
| 2005/0247787 A1 | 11/2005 | Von Mueller et al. |
| 2005/0248312 A1 | 11/2005 | Cao et al. |
| 2005/0286212 A1 | 12/2005 | Brignone et al. |
| 2006/0003709 A1 | 1/2006 | Wood |
| 2006/0010588 A1 | 1/2006 | Schuster et al. |
| 2006/0052064 A1 | 3/2006 | Goradesky |
| 2006/0058073 A1 | 3/2006 | Kim |
| 2006/0063569 A1 | 3/2006 | Jacobs et al. |
| 2006/0099999 A1 | 5/2006 | Park |
| 2006/0105722 A1 | 5/2006 | Kumar |
| 2006/0105824 A1 | 5/2006 | Kim et al. |
| 2006/0125445 A1 | 6/2006 | Cao et al. |
| 2006/0140461 A1 | 6/2006 | Kim |
| 2006/0166043 A1 | 7/2006 | Eom et al. |
| 2006/0197674 A1 | 9/2006 | Nakajima |

(56) References Cited

U.S. PATENT DOCUMENTS

| | | |
|---|---|---|
| 2006/0205381 A1* | 9/2006 | Beart .................. G06F 1/1632 455/343.1 |
| 2006/0205447 A1 | 9/2006 | Park et al. |
| 2006/0208694 A1 | 9/2006 | Fee |
| 2006/0250108 A1 | 11/2006 | Pettigrew et al. |
| 2006/0255493 A1 | 11/2006 | Fouladpour |
| 2007/0004450 A1 | 1/2007 | Parikh |
| 2007/0019804 A1 | 1/2007 | Kramer |
| 2007/0093140 A1 | 4/2007 | Begic et al. |
| 2007/0123316 A1 | 5/2007 | Little |
| 2007/0142097 A1 | 6/2007 | Hamasaki et al. |
| 2007/0152633 A1 | 7/2007 | Lee |
| 2007/0161404 A1 | 7/2007 | Yasujima et al. |
| 2007/0167190 A1 | 7/2007 | Moosavi et al. |
| 2007/0184879 A1 | 8/2007 | Nakai |
| 2007/0187563 A1* | 8/2007 | Ogatsu ................ B60R 11/0241 248/346.03 |
| 2007/0223182 A1 | 9/2007 | Swan et al. |
| 2007/0225031 A1 | 9/2007 | Bodkin et al. |
| 2007/0236180 A1* | 10/2007 | Rodgers ................ H02J 7/0044 320/115 |
| 2007/0261978 A1 | 11/2007 | Sanderson |
| 2007/0297149 A1 | 12/2007 | Richardson et al. |
| 2008/0007214 A1 | 1/2008 | Cheng |
| 2008/0026794 A1 | 1/2008 | Warren |
| 2008/0026803 A1 | 1/2008 | Demuynck |
| 2008/0032758 A1 | 2/2008 | Rostami |
| 2008/0053770 A1 | 3/2008 | Tynyk |
| 2008/0058010 A1 | 3/2008 | Lee |
| 2008/0096620 A1 | 4/2008 | Lee et al. |
| 2008/0108395 A1 | 5/2008 | Lee et al. |
| 2008/0119244 A1 | 5/2008 | Malhotra |
| 2008/0123287 A1 | 5/2008 | Rossell et al. |
| 2008/0132289 A1 | 6/2008 | Wood et al. |
| 2008/0139258 A1 | 6/2008 | Park et al. |
| 2008/0150367 A1 | 6/2008 | Oh et al. |
| 2008/0238356 A1 | 10/2008 | Batson et al. |
| 2009/0009945 A1 | 1/2009 | Johnson et al. |
| 2009/0017883 A1 | 1/2009 | Lin |
| 2009/0051319 A1 | 2/2009 | Fang et al. |
| 2009/0069050 A1 | 3/2009 | Jain et al. |
| 2009/0073650 A1 | 3/2009 | Huang et al. |
| 2009/0096417 A1 | 4/2009 | Idzik et al. |
| 2009/0108800 A1 | 4/2009 | Woud |
| 2009/0111543 A1 | 4/2009 | Tai et al. |
| 2009/0114556 A1 | 5/2009 | Tai et al. |
| 2009/0117955 A1 | 5/2009 | Lo |
| 2009/0128092 A1 | 5/2009 | Woud |
| 2009/0143104 A1 | 6/2009 | Loh et al. |
| 2009/0144456 A1 | 6/2009 | Gelf et al. |
| 2009/0146898 A1 | 6/2009 | Akiho et al. |
| 2009/0152089 A1 | 6/2009 | Hanes |
| 2009/0160399 A1 | 6/2009 | Woud |
| 2009/0160400 A1 | 6/2009 | Woud |
| 2009/0181729 A1 | 7/2009 | Griffin, Jr. et al. |
| 2009/0205983 A1 | 8/2009 | Estlander |
| 2009/0247244 A1 | 10/2009 | Mittleman et al. |
| 2009/0284216 A1 | 11/2009 | Bessa et al. |
| 2009/0301289 A1 | 12/2009 | Gynes |
| 2009/0312058 A9 | 12/2009 | Wood et al. |
| 2009/0314400 A1 | 12/2009 | Liu |
| 2009/0325657 A1 | 12/2009 | Ramsdell et al. |
| 2010/0001684 A1 | 1/2010 | Eastlack |
| 2010/0005225 A1 | 1/2010 | Honda et al. |
| 2010/0013431 A1 | 1/2010 | Liu |
| 2010/0022277 A1 | 1/2010 | An et al. |
| 2010/0026589 A1 | 2/2010 | Dou et al. |
| 2010/0048267 A1 | 2/2010 | Lin |
| 2010/0056054 A1 | 3/2010 | Yamato et al. |
| 2010/0064883 A1 | 3/2010 | Gynes |
| 2010/0066311 A1 | 3/2010 | Bao et al. |
| 2010/0078343 A1 | 4/2010 | Hoellwarth et al. |
| 2010/0088439 A1 | 4/2010 | Ang et al. |
| 2010/0093412 A1 | 4/2010 | Serra et al. |
| 2010/0096284 A1 | 4/2010 | Bau |
| 2010/0113106 A1 | 5/2010 | Supran |
| 2010/0121588 A1 | 5/2010 | Elder et al. |
| 2010/0132724 A1 | 6/2010 | Seidel et al. |
| 2010/0154062 A1 | 6/2010 | Baram et al. |
| 2010/0195279 A1 | 8/2010 | Michael |
| 2010/0200456 A1 | 8/2010 | Parkinson |
| 2010/0203931 A1 | 8/2010 | Hynecek et al. |
| 2010/0224519 A1 | 9/2010 | Kao |
| 2010/0243516 A1 | 9/2010 | Martin et al. |
| 2010/0302716 A1 | 12/2010 | Gandhi |
| 2010/0315041 A1 | 12/2010 | Tan |
| 2010/0328203 A1 | 12/2010 | Hsu |
| 2011/0021255 A1 | 1/2011 | Kim et al. |
| 2011/0034221 A1 | 2/2011 | Hung et al. |
| 2011/0049005 A1 | 3/2011 | Wilson et al. |
| 2011/0050164 A1 | 3/2011 | Partovi et al. |
| 2011/0055447 A1 | 3/2011 | Costa |
| 2011/0084081 A1 | 4/2011 | Chung et al. |
| 2011/0090626 A1 | 4/2011 | Hoellwarth et al. |
| 2011/0117974 A1 | 5/2011 | Spitalnik et al. |
| 2011/0136555 A1 | 6/2011 | Ramies et al. |
| 2011/0175569 A1 | 7/2011 | Austin |
| 2011/0199041 A1 | 8/2011 | Yang |
| 2011/0244930 A1 | 10/2011 | Kong et al. |
| 2011/0253569 A1 | 10/2011 | Lord |
| 2011/0259664 A1 | 10/2011 | Freeman |
| 2011/0261511 A1 | 10/2011 | Alderson et al. |
| 2011/0297578 A1 | 12/2011 | Stiehl et al. |
| 2011/0309728 A1 | 12/2011 | Diebel |
| 2012/0013295 A1 | 1/2012 | Yeh |
| 2012/0071214 A1 | 3/2012 | Ash, Jr. et al. |
| 2012/0088555 A1 | 4/2012 | Hu |
| 2012/0088558 A1 | 4/2012 | Song |
| 2012/0106037 A1 | 5/2012 | Diebel et al. |
| 2012/0115551 A1 | 5/2012 | Cho et al. |
| 2012/0119695 A1 | 5/2012 | Pin |
| 2012/0122520 A1 | 5/2012 | Phillips |
| 2012/0161696 A1 | 6/2012 | Cook et al. |
| 2012/0177967 A1 | 7/2012 | Wang |
| 2012/0209745 A1 | 8/2012 | Spencer, II |
| 2012/0282977 A1 | 11/2012 | Haleluk |
| 2012/0286741 A1 | 11/2012 | Seethaler et al. |
| 2012/0302294 A1 | 11/2012 | Hammond et al. |
| 2012/0305422 A1 | 12/2012 | Vandiver |
| 2012/0320501 A1 | 12/2012 | Ackloo |
| 2012/0325637 A1 | 12/2012 | Kikuchi |
| 2013/0007336 A1 | 1/2013 | Chun et al. |
| 2013/0020998 A1 | 1/2013 | Howard |
| 2013/0023313 A1 | 1/2013 | Kim |
| 2013/0045775 A1 | 2/2013 | Heywood |
| 2013/0052871 A1 | 2/2013 | Eklind |
| 2013/0082662 A1 | 4/2013 | Carre et al. |
| 2013/0084799 A1 | 4/2013 | Marholev et al. |
| 2013/0088815 A1 | 4/2013 | Hu et al. |
| 2013/0098790 A1 | 4/2013 | Hong |
| 2013/0125251 A1 | 5/2013 | Johnson |
| 2013/0146491 A1 | 6/2013 | Ghali et al. |
| 2013/0166928 A1 | 6/2013 | Yang |
| 2013/0189923 A1 | 7/2013 | Lewin |
| 2013/0210475 A1 | 8/2013 | Nylund |
| 2013/0248339 A1 | 9/2013 | Koepsell |
| 2013/0273983 A1 | 10/2013 | Hsu |
| 2013/0305528 A1 | 11/2013 | Anderson |
| 2013/0307818 A1 | 11/2013 | Pope et al. |
| 2013/0314030 A1 | 11/2013 | Fathollahi |
| 2013/0318282 A1 | 11/2013 | Wakutsu et al. |
| 2014/0035511 A1 | 2/2014 | Ferber et al. |
| 2014/0065948 A1 | 3/2014 | Huang |
| 2014/0069825 A1 | 3/2014 | MacRina et al. |
| 2014/0091765 A1 | 4/2014 | Law |
| 2014/0132205 A1 | 5/2014 | Paczkowski et al. |
| 2014/0141838 A1 | 5/2014 | Cai et al. |
| 2014/0152257 A1 | 6/2014 | Miller et al. |
| 2014/0165379 A1 | 6/2014 | Diebel et al. |
| 2014/0191033 A1 | 7/2014 | Wojcik et al. |
| 2014/0239916 A1 | 8/2014 | To et al. |
| 2014/0268518 A1 | 9/2014 | Huang et al. |
| 2014/0375182 A1 | 12/2014 | Li et al. |
| 2014/0375186 A1 | 12/2014 | Tarnow et al. |

(56) References Cited

U.S. PATENT DOCUMENTS

| | | |
|---|---|---|
| 2015/0028797 A1 | 1/2015 | Miller et al. |
| 2015/0141090 A1 | 5/2015 | Hwan et al. |
| 2015/0189053 A1 | 7/2015 | LaHam |
| 2015/0194648 A1 | 7/2015 | Fathollahi et al. |
| 2015/0194833 A1 | 7/2015 | Fathollahi et al. |
| 2015/0214993 A1 | 7/2015 | Huang |
| 2015/0215439 A1 | 7/2015 | Stanimirovic et al. |
| 2015/0256008 A1 | 9/2015 | Miller et al. |
| 2015/0281410 A1 | 10/2015 | Takahashi |
| 2015/0289615 A1 | 10/2015 | Welsch |
| 2015/0303722 A1 | 10/2015 | Li |
| 2015/0364875 A1 | 12/2015 | Ginsberg |
| 2015/0381226 A1 | 12/2015 | Mogol |
| 2016/0004896 A1 | 1/2016 | Pope et al. |
| 2016/0064963 A1 | 3/2016 | Huang et al. |
| 2016/0064979 A1 | 3/2016 | Huang et al. |
| 2016/0093122 A1 | 3/2016 | Chen |
| 2016/0112085 A1 | 4/2016 | Johnson |
| 2016/0181580 A1 | 6/2016 | To et al. |
| 2016/0254698 A1 | 9/2016 | Anderson |
| 2016/0267313 A1 | 9/2016 | Pope et al. |
| 2016/0329607 A1 | 11/2016 | Miyao |
| 2018/0019613 A1 | 1/2018 | Miller et al. |

FOREIGN PATENT DOCUMENTS

| | | |
|---|---|---|
| CN | 201054376 | 4/2008 |
| CN | 201114197 | 9/2008 |
| CN | 201146541 | 11/2008 |
| CN | 201252577 Y | 6/2009 |
| CN | 201447167 | 5/2010 |
| CN | 201573829 | 9/2010 |
| CN | 202364273 U | 8/2012 |
| CN | 202535667 U | 11/2012 |
| CN | 302510329 S | 7/2013 |
| CN | 302573150 S | 9/2013 |
| DE | 10 2007 021 988 | 11/2008 |
| EP | 1732291 A1 | 12/2006 |
| JP | 62-014133 | 1/1987 |
| JP | 8-18637 | 1/1996 |
| JP | 2000-175720 | 6/2000 |
| JP | 2005-93277 | 4/2005 |
| JP | 2005-234353 | 9/2005 |
| JP | 2005-236933 | 9/2005 |
| JP | 2007-116369 | 5/2007 |
| KR | 10-2005-0027961 | 3/2005 |
| KR | 10-2008-0017688 | 2/2008 |
| KR | 20-2010-0005030 | 5/2010 |
| KR | 10-2010-0132724 | 12/2010 |
| KR | 10-2011-0005507 | 1/2011 |
| KR | 10-2011-0062089 | 6/2011 |
| KR | 30-0650361 | 7/2012 |
| TW | D150044 | 11/2012 |
| TW | D156538 | 10/2013 |
| WO | WO 95/15619 | 6/1995 |
| WO | WO 97/33497 | 9/1997 |
| WO | WO 2000/13330 | 3/2000 |
| WO | WO 03/065227 A1 | 8/2003 |
| WO | WO 2004/17613 | 2/2004 |
| WO | WO 2007/079494 | 7/2007 |
| WO | WO 08/151362 A2 | 12/2008 |

OTHER PUBLICATIONS

U.S. Appl. No. 15/130,196 filed Apr. 15, 2016.
U.S. Appl. No. 29/382,515, dated Jan. 4, 2011.
U.S. Appl. No. 29/464,620, filed Aug. 19, 2013.
U.S. Appl. No. 29/478,391, filed Jan. 3, 2014.
U.S. Appl. No. 29/478,390, filed Jan. 3, 2014.
U.S. Appl. No. 29/478,383, filed Jan. 3, 2014.
U.S. Appl. No. 29/478,388, filed Jan. 3, 2014.
U.S. Appl. No. 29/499,868, filed Aug. 19, 2014.
U.S. Appl. No. 29/539,419, filed Sep. 14, 2015.
U.S. Appl. No. 29/523,209, filed Apr. 7, 2015.
U.S. Appl. No. 29/528,266, filed May 27, 2015.
U.S. Appl. No. 29/534,901, filed Jul. 31, 2015.
U.S. Appl. No. 15/233,683, filed Jul. 29, 2016.
U.S. Appl. No. 15/223,735, filed Jul. 29, 2016.
U.S. Appl. No. 29/556,805, filed Mar. 3, 2016
U.S. Appl. No. 29/556,807, filed Mar. 3, 2016.
U.S. Appl. No. 29/556,809, filed Mar. 3, 2016.
U.S. Appl. No. 29/626,999, filed Nov. 21, 2017.
U.S. Appl. No. 15/820,197, filed Nov. 21, 2017.
International Search Report and Written Opinion of the International Searching Authority for PCT/US2011/037244, dated Jul. 19, 2011.
International Preliminary Report on Patentability for PCT/US2011/037244, dated Nov. 29, 2012.
International Search Report and Written Opinion of the International Searching Authority for PCT/US2011/037249, dated Jul. 13, 2011.
International Preliminary Report on Patentability for PCT/US2011/037249, dated Nov. 29, 2012.
International Search Report and Written Opinion of the International Searching Authority for PCT/US2011/037254, dated Jul. 13, 2011.
International Preliminary Report on Patentability for PCT/US2011/037254, dated Nov. 29, 2012.
International Search Report and Written Opinion of the International Searching Authority for PCT/US2011/037257, dated Sep. 22, 2011.
International Preliminary Report on Patentability for PCT/US2011/037257, dated Nov. 29, 2012.
International Search Report and Written Opinion of the International Searching Authority for PCT/US2012/041768, dated Feb. 27, 2013.
International Preliminary Report on Patentability for PCT/US2012/041768, dated Dec. 27, 2013.
International Search Report and Written Opinion of the International Searching Authority for PCT/US2013/057276), dated Dec. 10, 2013.
International Preliminary Report on Patentability for PCT/US2013/057276, dated Mar. 3, 2015.
International Search Report and Written Opinion of the International Searching Authority for PCT/US2014/017781, dated Jun. 8, 2014.
International Preliminary Report on Patentability for PCT/US2014/017781, dated Aug. 25, 2015.
International Search Report and Written Opinion of the International Searching Authority for PCT/US2014/023592, dated Aug. 28, 2014.
International Preliminary Report on Patentability for PCT/US2014/023592, dated Sep. 15, 2015.
International Search Report and Written Opinion for PCT/US2014/067470, dated Mar. 31, 2015.
International Preliminary Report of Patentability for PCT/US2014/067470, dated Jun. 9, 2016.
International Search Report and Written Opinion for PCT/US2015/065800, dated Apr. 21, 2016.
International Preliminary Report on Patentability for PCT/US2015/065800, dated Jun. 29, 2017.
"Sandberg BatteryCase for iPhone 4/4S delivers more band for your buck," dated Mar. 15, 2012, http://www.gizmag.com/sanberg-batterycase-iphone/21839.
Shawn Brown, "Incase Power Slider battery doubles as a case," dated Nov. 19, 2008, http://www.iphonebuzz.com/incase-power-slider-battery-doubles-as-a-case-195224.php.
Nick Guy, "Incipio offGRID Battery Case for iPhone 5/5s," dated Oct. 9, 2013, http://www.ilounge.com/index.php/reviews/entry/incipio-offgrid-battery-case-for-iphone-5-5s/.
Jeremy Horwitz, "Mophie Juice Pack Plus for iPhone 5," dated May 21, 2013, http://www.ilounge.com/index.php/reviews/entry/mophie-juice-pack-plus-for-iphone-5/.
Nick Guy, "RND Power Solutions Sync & Charge Dock with Lightning Connector," dated Nov. 18, 2013, http://www.ilounge.com/index.php/reviews/entry/tylt-energi-sl.

(56) References Cited

OTHER PUBLICATIONS

Jeremy Horwitz, "Kensington Mini Battery Pack and Charger for iPhone and iPod," dated May 16, 2008, http://www.ilounge.com/index.php/reviews/entry/kensington-mini-battery-pack-and-charger-for-iphone-and-ipod/.
Kensington Mini Battery Pack and Charger for iPhone and iPod, dated Sep. 30, 2008, 1 Page.
Sven Rafferty, "Mybat External Battery for iPhone and iPod," dated May 18, 2008, http://svenontech.com/reviews/?p=74.
Dave Rees, "Richard Solo Backup Battery for iPhone/iPod Review," dated Jun. 16, 2008, http://the-gadgeteer.com/2008/06/16/richard_solo_backup_battery_for_iphone_ipod/.
Devin Coldewey, "Combination iPhone battery pack and flash from FastMac," dated Nov. 4, 2008, http://crunchgear.com/2008/11/04/combination-iphone-battery-pack-and-flash-from-fastmac/.
"Cheap DIY iPhone External Battery," dated Jul. 22, 2008, http://fastdad.wordpress.com/2008/07/22/cheap-diy-iphone-external-battery/.
Jeremy Horwitz, "iLuv i603 / i604 Rechargeable Lithium Polymer Batteries with Silicone Skin," dated Jun. 27, 2006, http://www.ilounge.com/index.php/reviews/entry/iluv-i603-rechargeable-lithium-polymer-battery-with-silicone-skin/.
Julie Strietelmeier, "Seidl° INNODock Desktop Cradle for Treo 650," dated Jul. 28, 2005, http://the-gadgeteer.com/2005/07/28/seidio_innodock_desktop_cradle-for_treo_650/.
Brian Nyhuis, "Mophie Juice Pack Battery Case for Samsung Galaxy S III Review," dated Nov. 28, 2012, http://www.legitreviews.com/mophie-juice-pack-battery-case-for-samsung-galaxy-s-iii-review_2084.
"PowerSkin Samsung Galaxy S3 Case with Backup Battery," dated Aug. 19, 2012 , http://gadgetsin.com/powerskin-samsung-galaxy-s3-case-with-backup-battery.htm.
"iPhone 4 Case with Battery Pack," dated Sep. 28, 2010, http://gadgetsin.com/iphone-4-case-with-battery-pack.htm.
Jonathan Pena, "iPhone 5 Cases, Round 3," dated Sep. 16, 2012, http://www.technologytell.com/apple/103833/iphone-5-cases-round-3/.
Jeremy Horwitz, "Mophie Juice Pack for iPhone," dated Dec. 7, 2007, http://www.ilounge.com/index.php/reviews/entry/mophie-juice-pack-for-iphone/.
Dr. Macenstein, "Review: Mophie Juice Pack for iPhone," dated Apr. 27, 2008, http://macenstein.com/default/archives/1314.
Wayne Schulz, "iPhone Extended Battery Review—Mophie Juice Pack," dated Jun. 17, 2008, http://www.geardiary.com/2008/06/17/iphone-extended-battery-review-mophie-juice-pack/.
Mophie Juice Pack iPhone 1G Product—Figures 1-7—Retrieved from http://www.mophie.com-product/juice-pack on Apr. 10, 2009.
Mophie Juice Pack iPhone 1G Product—Figure 8—Retrieved from http://www.mophie.com/pages/information/ on Apr. 10, 2009.
Mophie Juice Pack iPhone 1G Product—Figures 9-14—Retrieved from http://www.mophie.com/blog/Juice_Pack_FAQ on Apr. 10, 2009.
Mophie Juice Pack iPhone 1G Product—Figures 15-16—Retrieved from http://www.mophie.com/blogs/Juice_Pack_FAQ on Apr. 20, 2009. Figure 16 is dated May 1, 2008.
Tomas Ratas, "Mophie Juice Pack—iPhone 3G," dated Dec. 9, 2008, http://www.testfreaks.com/blog/review/mophie-juice-pack-iphone-3g/.
Dr. Macenstein, "Review: Mophie Juice Pack 3G for iPhone," dated Nov. 27, 2008, http://macenstein.com/default/archives/1820.
Ewdison Then, "Mophie Juice Pack iPhone 3G Review," dated Nov. 12, 2008, http://www.slashgear.com/mophie-juice-pack-iphone-3g-review-1222446/.
Mophie Juice Pack iPhone 3G Product—Figures 1-8—Retrieved from http://www.mophie.com/products/juice-pack-iphone-3g on Apr. 10, 2009.
Mophie Juice Pack iPhone 3G Product—Figures 9-10—Retrieved from http://www.mophie.com/pages/iphone-3g-details on Apr. 10, 2009.
Mophie Juice Pack iPhone 3G Product—Figures 11-14—Retrieved from http://mophie.com/blogs/Juice_Pack_3G_FAQ on Apr. 10, 2009.
Mophie Juice Pack iPhone 3G Product—Figures 15-16—Retrieved from http://mophie.com/blogs/press on Apr. 20, 2009. Figure 15 is dated Aug. 4, 2008, and Figure 16 is dated Nov. 10, 2008.
Mophie Juice Pack iPhone 3G User Manual—Retrieved from http://static3.shopify.com/s/files/1/0008/4942/assets/mophie juice_pack_3G_manual_rl.pdf on Apr. 10, 2009.
Panasonic Lithium Ion Batteries Technical Handbook, dated 2007.
Chris Foresman, "Several Backup Batteries Can Extend Your Daily iPhone 3G Use," dated Jul. 18, 2008, http://arstechnica.com/apple/2008/07/several-backup-batteries-can-extend-your-daily-iphone-3g-use/.
Using Your Treo 650 Smartphone by palmOne, dated 2005.
Lisa Gade, "Palm Treo 750," dated Jan. 17, 2007, http://www.mobiletechreview.com/phone/Treo-750.htm.
Incase Power Slider 3G for iPhone 3G Product Reference, alleged by Incase to be available on Nov. 28, 2008.
iPhone User's Guide, 2007.
"Power Slider," Web Archive Date Dec. 4, 2008, https://web.archive.org/web/20081204105303/http://goincase.com/products/detail/power-slider-ec20003/.
Simon Hill, "The 10 Best iPhone 6 Extended Battery Cases to Keep the Power Flowing", Digital Trends, posted Jul. 23, 2015, accessed May 29, 2018, https://www.digitaltrends.com/mobile/best-iphone-6-battery-cases/.
"The Best iPhone 6 and iPhone 6 Plus Battery Cases", Engadget, posted Jun. 12, 2015, accessed May 29, 2018, https://www.engadget.com/2015/06/12/the-best-iphone-6-and-iphone-6-plus-battery-case/.
Azadeh Ensha, "A Case for Filling the iPhone 3G's Power Vacuum," Dated Nov. 27, 2008.
Joseph Flatley, "Incase Power Slider for iPhone 3G Doubles the Juice, Lets You Sync," dated Nov. 17, 2008.
Darren Quick, "Mophie Juice Pack for iPhone 3G now shipping," dated Nov. 10, 2008, http://www.gizmag.com/mophie-juice-pack-iphone-3g/10342/.
Otterbox Catalog, 2006.
Jeremy Horwitz, "PhoneSuit MiLi Power Pack for iPhone," Jan. 29, 2009, http://www.ilounge.com/index.php/reviews/entry/phonesuit-mili-power-pack-for-iphone/.
Jeremy Horwitz, "FastMac TruePower iV Universal Battery Charger," Dec. 11, 2008, http://www.ilounge.com/index.php/reviews/entry/fastmac-truepower-iv-universal-battery-charger/.
Jeremy Horwitz, "Konnet PowerKZ Extended Power for iPhone," Apr. 2, 2009, http://www.ilounge.com/index.php/reviews/entry/konnet-powerkz-extended-power-for-iphone/.
Jeremy Horwitz, "Review: Anker's Ultra Slim Battery Case for iPhone 6 offers a surprising mix of thinness, power, and low pricing", 9to5Mac, posted Mar. 13, 2015, accessed May 29, 2018, https://9to5mac.com/2015/03/13/review-ankers-ultra-slim-battery-case-iphone-6/.
"Test: Batterie iPhone Skpad" with Machine English Translation, Feb. 2, 2009, http://iphonesofa.com/2009/02/02/test-batterie-iphone-skpad.
Kanamori et al., "USB battery-charger designs meet new industry standards," EDN pp. 63- 70, dated Feburary 21, 2008.
AVR458: Charging Lithium-Ion Batteries with ATAVRBC100, which appear to include a date of Aug. 2008.
Battery Charging Specification, dated Apr. 15, 2009.
BCM2033 Product Brief, 2 pages, dated Nov. 1, 2002.
"USB battery charger detector intelligently powers mobiles," Dec. 17, 2007, http://www.eetasia.com/ART_8800493819_765245_NP_10b171b6.HTMce#.
Webpage Archive, Mophie.com, Nov. 25, 2007.
Ben Kaufman, "Behind the Invention: The mophie Juice Pack," dated Dec. 31, 2013, https://medium.com/@benkaufman/behind-the-invention-the-mophie-juice-pack-a0620f74efcf.
Mophie Relo Recharge, dated Feb. 7, 2006, http://songsling.com/recharge.html.
Amazon.com, "Galaxy S6 Battery Case, i-Blason External Protective Battery Case/Cover for Samsung Galaxy S6 2015 Release."

(56) References Cited

OTHER PUBLICATIONS

Customer Review published Mar. 29, 2015. Retrieved from internet at <http://www.amazon.com/Case-i-Blason-External-Protective-Versions/dp/B00SNS4LME>, Apr. 28, 2016. 7 pages.
*Case-Ari, LLC* v. *mStation, Inc.*, Case No. 1:2010-CV-01874 in the United States District Court for the Northern District of Georgia, filed Jun. 17, 2010 (Docket).
*Daniel Huang* v. *GC Technology, LLC*, Case No. CV10-4705 CAS (VBKx) in the United States District Court for the Central District of California, filed Jun. 24, 2010 (Docket).
*Hali-Power, Inc.* v. *mStation Corp.*, Case No. 1:2010-CV-00773 in the United States District Court for the Northern District of New York, filed Jun. 30, 2010 (Docket).
*Mophie, Inc.* v. *Loza & Loza, LLP*, Case No. SACV11-00539 DOC (MLGx) in the United States District Court for the Central District of California, filed Apr. 7, 2011 (Docket).
Mophie's Complaint, filed Apr. 7, 2011 in *Mophie, Inc.* v. *Loza & Loza, LLP*, Case No. SACV11-00539 DOC (MLGx) in the United States District Court for the Central District of California.
*Mophie, Inc.* v. *Foreign Trade Corporation*, Case No. 8:12-CV-00292-JST-RNB in the United States District Court for the Central District of California, filed Feb. 24, 2012 (Docket).
*Mophie, Inc.* v. *Kdlinks Inc.*, Case No. 2:2012-CV-02639 in the United States District Court for the Central District of California, filed Mar. 27, 2012 (Docket).
*Otter Products, LLC* v. *Mophie, LLC*, Case No. 1:2012-CV-01969 in the United States District Court for the District of Colorado, filed Jul. 27, 2012 (Docket).
Mophie's Answer, filed Oct. 15, 2012 in *Otter Products, LLC* v. *Mophie, LLC*, Case No. 1:2012-CV-01969 in the United States District Court for the District of Colorado.
Otter's Motion for Summary Judgment of Infringement and Declaration in Support Thereof, filed May 13, 2013 in *Otter Products, LLC* v. *Mophie, LLC*, Case No. 1:2012-CV-01969 in the United States District Court for the District of Colorado.
Mophie's Opposition to Motion for Summary Judgment of Infringement, filed Jun. 6, 2013 in *Otter Products, LLC* v. *Mophie, LLC*, Case No. 1:2012-CV-01969 in the United States District Court for the District of Colorado.
Mophie's Claim Construction Brief, filed Jun. 14, 2013 in *Otter Products, LLC* v. *Mophie, LLC*, Case No. 1:2012-CV-01969 in the United States District Court for the District of Colorado.
Otter's Claim Construction Brief, filed Jun. 14, 2013 in *Otter Products, LLC* v. *Mophie, LLC*, Case No. 1:2012-CV-01969 in the United States District Court for the District of Colorado.
Mophie's Brief in Response to Otter's Claim Construction Brief, filed Jun. 24, 2013 in *Otter Products, LLC* v. *Mophie, LLC*, Case No. 1:2012-CV-01969 in the United States District Court for the District of Colorado.
Otter's Rebuttal Brief for Construction of Claim Terms and Declaration, filed Jun. 24, 2013 in *Otter Products, LLC* v. *Mophie, LLC*, Case No. 1:2012-CV-01969 in the United States District Court for the District of Colorado.
Otter's Reply in Support of Motion for Summary Judgment of Infringement, filed Jun. 24, 2013 in *Otter Products, LLC* v. *Mophie, LLC*, Case No. 1:2012-CV-01969 in the United States District Court for the District of Colorado.
Joint Claim Construction Statement, filed Jun. 26, 2013 in *Otter Products, LLC* v. *Mophie, LLC*, Case No. 1:2012-CV-01969 in the United States District Court for the District of Colorado.
*Incase Designs, Inc.* v. *Mophie, Inc.*, Case No. 3:2013-CV-00602 in the United States District Court for the Northern District of California, filed Feb. 12, 2013 (Docket).
Mophie's Amended Answer and Counterclaims, filed May 8, 2013 in *Incase Designs, Inc.* v. *Mophie, Inc.*, Case No. 3:2013-CV-00602 in the United States District Court for the Northern District of California.
Mophie's Opposition to Motion to Strike Amended Affirmative Defenses, Filed Jun. 12, 2013 in *Incase Designs, Inc.* v. *Mophie, Inc.*, Case No. 3:2013-CV-00602 in the United States District Court for the Northern District of California.
Mophie's Reply in Support of Motion to Stay and Supporting Declaration, filed Sep. 3, 2013 in *Incase Designs, Inc.* v. *Mophie, Inc.*, Case No. 3:2013-CV-00602 in the United States District Court for the Northern District of California.
*Incase Designs, Inc.* v. *Mophie, Inc.*, Case No. 3:2013-CV-03356 in the United States District Court for the Northern District of California, filed Jul. 18, 2013 (Docket).
*Incase Designs, Inc.* v. *Mophie, Inc.*, Case No. 3:2013-CV-04314 in the United States District Court for the Northern District of California, filed Sep. 18, 2013 (Docket).
Mophie Motion 1—To Be Accorded Benefit, filed Nov. 20, 2013 in Patent Interference No. 105,946(RES).
Declaration of John Feland, Ph.D, in Support of Mophie Motion 1 to Be Accorded Benefit, dated Nov. 20, 2013, in Patent Interference No. 105,946(RES).
Mophie Motion 2—for Judgment that Incase's Involved Claims Are Unpatentable, filed Nov. 20, 2013 in Patent Interference No. 105,946(RES).
Declaration of John Feland, Ph.D, in Support of Mophie Motion 2 for Judgement That Incase's Involved Claims Are Unpatentable, dated Nov. 20, 2013, in Patent Interference No. 105,946(RES).
Incase Motion 1—Motion for Benefit, filed Nov. 20, 2013 in Patent Interference No. 105,946(RES).
Incase Motion 2—Motion to Undesignate Claims, filed Nov. 20, 2013 in Patent Interference No. 105,946(RES).
Incase Motion 3—Motion for Judgment Based on Lack of Written Description, filed Nov. 20, 2013 in Patent Interference No. 105,946(RES).
Incase Motion 4—Motion for Unpatentability of Mophie Claims, filed Nov. 20, 2013 in Patent Interference No. 105,946(RES).
Declaration of Andrew Wolfe, filed Nov. 20, 2013 in Patent Interference No. 105,946(RES).
Declaration of Thomas Overthun, filed Nov. 20, 2013 in Patent Interference No. 105,946(RES).
Declaration of Gabriel Dan, filed Nov. 20, 2013 in Patent Interference No. 105,946(RES).
Mophie's Third Amended Complaint, filed Jun. 27, 2014, in *Mophie, Inc.* v. *Source Vista*, Case No. 8:13-CV-01321 in the United States District Court for the Central District of California.
LivingSocial's Answer to Mophie's Fifth Amended Complaint and Counterclaims, filed Sep. 24, 2014, in *Mophie, Inc.* v. *Source Vista*, Case No. 8:13-CV-01321 in the United States District Court for the Central District of California.
Shah's Answer, Affirmative Defenses, and Counterclaims to Plaintiff's Fifth Amended Complaint, filed Sep. 24, 2014, in *Mophie, Inc.* v. *Source Vista*, Case No. 8:13-CV-01321 in the United States District Court for the Central District of California.
Expert Report of Dr. David Munson, dated Aug. 28, 2014, in *Mophie, Inc.* v. *Source Vista*, Case No. 8:13-CV-01321 in the United States District Court for the Central District of California.
Expert Report of John Feland, Ph.D, dated Aug. 28, 2014, in *Mophie, Inc.* v. *Source Vista*, Case No. 8:13-CV-01321 in the United States District Court for the Central District of California.
Rebuttal Expert Report of John Feland, Ph.D, dated Sep. 25, 2014, in *Mophie, Inc.* v. *Source Vista*, Case No. 8:13-CV-01321 in the United States District Court for the Central District of California.
Rebuttal Expert Report of Dr. David Munson, dated Sep. 25, 2014, in *Mophie, Inc.* v. *Source Vista*, Case No. 8:13-CV-01321 in the United States District Court for the Central District of California.
Mophie's Second Amended Response to LivingSocial's Interrogatory No. 1[21], dated Aug. 28, 2014, in *Mophie, Inc.* v. *Source Vista*, Case No. 8:13-CV-01321 in the United States District Court for the Central District of California.
Mophie's Second Amended Response to Serve Global's Interrogatory No. 2, dated Aug. 28, 2014, in *Mophie, Inc.* v. *Source Vista*, Case No. 8:13-CV-01321 in the United States District Court for the Central District of California.
Defendant's Memorandum in Support of Motion for Partial Summary Judgement, dated Sep. 23, 2014, in *Mophie, Inc.* v. *Source Vista*, Case No. 8:13-CV-01321 in the United States District Court for the Central District of California.

(56) References Cited

OTHER PUBLICATIONS

Declaration of David Munson in Support of Defendant's Motion for Partial Summary Judgment, dated Sep. 22, 2014, in *Mophie, Inc.* v. *Source Vista*, Case No. 8:13-CV-01321 in the United States District Court for the Central District of California.
John Feland, Ph.D. Deposition Transcript, dated Sep. 30, 2014, in *Mophie, Inc.* v. *Source Vista*, Case No. 8:13-CV-01321 in the United States District Court for the Central District of California.
Matthew Brand Deposition Transcript, dated Jul. 23, 2014, in *Mophie, Inc.* v. *Source Vista*, Case No. 8:13-CV-01321 in the United States District Court for the Central District of California.
Dharmesh Shah Deposition Transcript, dated Jul. 11, 2014, in *Mophie, Inc.* v. *Source Vista*, Case No. 8:13-CV-01321 in the United States District Court for the Central District of California.
Defendants' Statement of Uncontroverted Material Fact and Contentions of Law, filed Sep. 22, 2014 in *Mophie, Inc.* v. *Source Vista*, Case No. 8:13-CV-01321 in the United States District Court for the Central District of California.
Memorandum of Points and Authorities in Support of Mophie's Motion for Summary Judgment, filed Sep. 22, 2014, in *Mophie, Inc.* v. *Source Vista*, Case No. 8:13-CV-01321 in the United States District Court for the Central District of California.
Statement of Uncontroverted Facts and Conclusions of Law in Support of Mophie's Motion for Summary Judgment, filed Sep. 22, 2014, in *Mophie, Inc.* v. *Source Vista*, Case No. 8:13-CV-01321 in the United States District Court for the Central District of California.
Mophie's Opposition to Shah and Serve Global's Motion for Partial Summary Judgment, dated Oct. 3, 2014, in *Mophie, Inc.* v. *Source Vista*, Case No. 8:13-CV-01321 in the United States District Court for the Central District of California.
Statement of Genuine Disputes of Material Fact in Opposition to Shah and Serve Global's Motion for Partial Summary Judgment, filed Oct. 3, 2014, in *Mophie, Inc.* v. *Source Vista*, Case No. 8:13-CV-01321 in the United States District Court for the Central District of California.
Opposition of LivingSocial to Mophie's Motion for Summary Judgment, dated Oct. 3, 2014, in *Mophie, Inc.* v. *Source Vista*, Case No. 8:13-CV-01321 in the United States District Court for the Central District of California.
Defendants' Opposition to Plaintiff's Motion for Summary Judgment, filed Oct. 3, 2014, in *Mophie, Inc.* v. *Source Vista*, Case No. 8:13-CV-01321 in the United States District Court for the Central District of California.
Defendants' Response to Plaintiffs Statement of Uncontroverted Material Fact and Contentions of Law, filed Oct. 3, 2014, in *Mophie, Inc.* v. *Source Vista*, Case No. 8:13-CV-01321 in the United States District Court for the Central District of California.
David Munson Deposition Transcript, dated Sep. 29, 2014, in *Mophie, Inc.* v. *Source Vista*, Case No. 8:13-CV-01321 in the United States District Court for the Central District of California.
Mophie's First Amended Complaint, filed Jun. 25, 2014, in *Mophie, Inc.* v. *Unu Electronics Inc.*, Case No. 8:13-CV-01705 in the United States District Court for the Central District of California.
Unu's Answer and Counterclaims, filed Jul. 10, 2014, in *Mophie, Inc.* v. *Unu Electronics Inc.*, Case No. 8:13-CV-01705 in the United States District Court for the Central District of California.
Mophie's Responses to Defendant's Third Set of Interrogatories (No. 12), dated Aug. 21, 2014, in *Mophie, Inc.* v. *Unu Electronics Inc.*, Case No. 8:13-CV-01705 in the United States District Court for the Central District of California.
Mophie's Responses to Defendant's First set of Requests for Admissions (Nos. 1-46), dated Aug. 19, 2014, in *Mophie, Inc.* v. *Unu Electronics Inc.*, Case No. 8:13-CV-01705 in the United States District Court for the Central District of California.
Mophie's Responses to Defendant's Second set of Requests for Admissions (Nos. 47-109), dated Aug. 19, 2014, in *Mophie, Inc.* v. *Unu Electronics Inc.*, Case No. 8:13-CV-01705 in the United States District Court for the Central District of California.

Request for Ex Parte Reexamination of U.S. Pat. No. 8,367,235, filed Aug. 14, 2014.
Corrected Request for Ex Parte Reexamination of U.S. Pat. No. 8,367,235, filed Sep. 18, 2014.
Declaration of John Feland, Ph.D. In Support of Mophie's Opposition to Defendants Motion for Partial Summary Judgment, filed Oct. 3, 2014, in *Mophie, Inc.* v. *Source Vista*, Case No. 8:13-CV-01321 in the United States District Court for the Central District of California.
LivingSocial's Reply in Support of Motion for Summary Judgment, Filed Oct. 10, 2014, in *Mophie, Inc.* v. *Source Vista*, Case No. 8:13-Cv-01321 in the United States District Court for the Central District of California.
Defendants' Reply in Support of Motion for Partial Summary Judgment, Filed Oct. 10, 2014, in *Mophie, Inc.* v. *Source Vista*, Case No. 8:13-CV-01321 in the United States District Court for the Central District of California.
Reply in Support of Mophie's Motion for Summary Judgment, Filed Oct. 10, 2014, in *Mophie, Inc.* v. *Source Vista*, Case No. 8:13-CV-01321 in the United States District Court for the Central District of California.
Mophie's Reply to Counterclaims of LivingSocial, filed Oct. 14, 2014, in *Mophie, Inc.* v. *Source Vista*, Case No. 8:13-CV-01321 in the United States District Court for the Central District of California.
Mophie's Reply to Counterclaims of Shah, filed Oct. 14, 2014, in *Mophie, Inc.* v. *Source Vista*, Case No. 8:13-CV-01321 in the United States District Court for the Central District of California.
Defendant's Response to Mophie's Fourth Set of Interrogatories, dated Sep. 23, 2014, in *Mophie, Inc.* v. *Unu Electronics Inc.*, Case No. 8:13-CV-01705 in the United States District Court for the Central District of California.
Plaintiff Mophie's Preliminary Claim Constructions and Identification of Extrinsic Evidence, dated Oct. 14, 2014, in *Mophie, Inc.* v. *Unu Electronics Inc.*, Case No. 8:13-CV-01705 in the United States District Court for the Central District of California.
Defendant's Preliminary Claim Constructions and Extrinsic Evidence, dated Oct. 14, 2014, in *Mophie, Inc.* v. *Unu Electronics Inc.*, Case No. 8:13-CV-01705 in the United States District Court for the Central District of California.
Plaintiff Mophie's Opening Brief on Claim Construction, filed Oct. 29, 2014, in *Mophie, Inc.* v. *Unu Electronics Inc.*, Case No. 8:13-CV-01705 in the United States District Court for the Central District of California.
Declaration of John Feland, Ph.D. In Support of Plaintiff's Preliminary Claim Constructions, filed Oct. 29, 2014, in *Mophie, Inc.* v. *Unu Electronics Inc.*, Case No. 8:13-CV-01705 in the United States District Court for the Central District of California.
Supplemental Declaration of John Feland, Ph.D. In Support of Plaintiff's Claim Constructions, filed Oct. 29, 2014, in *Mophie, Inc.* v. *Unu Electronics Inc.*, Case No. 8:13-CV-01705 in the United States District Court for the Central District of California.
Declaration of Sheila N. Swaroop in Support of Mophie's Opening Claim Construction Brief, filed Oct. 29, 2014, in *Mophie, Inc.* v. *Unu Electronics Inc.*, Case No. 8:13-CV-01705 in the United States District Court for the Central District of California.
Transcript of Deposition of John Feland, dated Oct. 21, 2014, in *Mophie, Inc.* v. *Unu Electronics Inc.*, Case No. 8:13-CV-01705 in the United States District Court for the Central District of California.
Defendant's Opening Claim Construction Brief, dated Oct. 29, 2014, in *Mophie, Inc.* v. *Unu Electronics Inc.*, Case No. 8:13-CV-01705 in the United States District Court for the Central District of California.
Order Granting Request for Ex Parte Reexamination of U.S. Pat. No. 8,367,235, in Reexamination Control No. 90/013,319, dated Oct. 24, 2014.
Order Re LivingSocial's Motion for Summary Judgment, Mophie's Motion for Summary Judgment, Source Vista and Shah's Motion for Partial Summary Judgment, and Mophie's Motion to Bifurcate, dated Nov. 12, 2014, in *Mophie, Inc.* v. *Source Vista*, Case No. 8:13-CV-01321 in the United States District Court for the Central District of California.

(56) References Cited

OTHER PUBLICATIONS

Mophie's Memorandum in Support of its Motion for Reconsideration, filed Nov. 19, 2014, in *Mophie, Inc. v. Source Vista*, Case No. 8:13-CV-01321 in the United States District Court for the Central District of California.
Declaration of Sheila N. Swaroop in Support of Mophie's Motion for Reconsideration, filed Nov. 19, 2014, in *Mophie, Inc. v. Source Vista*, Case No. 8:13-CV-01321 in the United States District Court for the Central District of California.
Order Denying Plaintiff's Motion for Reconsideration, dated Nov. 21, 2014, in *Mophie, Inc. v. Source Vista*, Case No. 8:13-CV-01321 in the United States District Court for the Central District of California.
Defendants Dharmesh Shah and Serve Global, LLC's Memorandum of Points and Authorities in Support of Defendants's Motion for Attorney's Fees, filed Mar. 21, 2015, in *Mophie, Inc. v. Source Vista*, Case No. 8:13-CV-01321 in the United States District Court for the Central District of California.
Memorandum of Points and Authorities in Support of Livingsocial, Inc.'s Motion for Legal Fees and Costs, filed Mar. 20, 2015, in *Mophie, Inc. v. Source Vista*, Case No. 8:13-CV-01321 in the United States District Court for the Central District of California.
Plaintiff Mophie, Inc.'s Opposition to Defendants Dharmesh Shah and Serve Global, LLC's Motion for Attorneys' Fees, filed Apr. 3, 2015, in *Mophie, Inc. v. Source Vista*, Case No. 8:13-CV-01321 in the United States District Court for the Central District of California.
Plaintiff Mophie, Inc.'s Opposition to Defendant Livingsocial, Inc.'s Motion for Attorneys' Fees, filed Apr. 3, 2015, in *Mophie, Inc. v. Source Vista*, Case No. 8:13-CV-01321 in the United States District Court for the Central District of California.
Reply to Plaintiff's Opposition to Defendants Dharmesh Shah and Serve Global, LLC's Motion for Attorney's Fees, filed Apr. 10, 2015, in *Mophie, Inc. v. Source Vista*, Case No. 8:13-CV-01321 in the United States District Court for the Central District of California.
Reply in Support of Livingsocial, Inc.'s Motion for Legal Fees and Costs, filed Apr. 10, 2015, in *Mophie, Inc. v. Source Vista*, Case No. 8:13-CV-01321 in the United States District Court for the Central District of California.

Amended Final Judgment and Permanent Injunction, dated Dec. 11, 2015, in *Mophie, Inc. v. Source Vista*, Case No. 8:13-CV-01321 in the United States District Court for the Central District of California.
Order Re Motions for Attorneys' Fees, Motion to Amend Permanent Injunction, Motions for Judgment as a Matter of Law, Motion for Relief From Judgment, and Motion for New Trial, dated Dec. 11, 2015, in *Mophie, Inc. v. Source Vista*, Case No. 8:13-CV-01321 in the United States District Court for the Central District of California.
Mophie's Complaint, filed Dec. 16, 2015, in *Mophie, Inc. v. Cute Mobile Inc.*, Case No. 8:15-cv-02086 in the United States District Court for the Central District of California.
Daniel Huang Deposition Transcript (Redacted) with Exhibit 121, dated Aug. 21, 2014, in *Mophie, Inc. v. Source Vista*, Case No. 8:13-CV-01321 in the United States District Court for the Central District of California.
Mophie's First Amended Complaint, filed May 25, 2016 in *Mophie, Inc. v. Cute Mobile Inc.*, Case No. 8:15-cv-02086 in the United States District Court for the Central District of California.
Mophie's Complaint for Patent Infringement, filed Dec. 15, 2017 in *Zagg Inc. and Mophie, Inc. v. Anker Technology Co.*, Case No. 8:17-CV-2193 in the United States District Court for the Central District of California.
Anker's Answer, filed Mar. 12, 2018 in *Zagg Inc. and Mophie, Inc. v. Anker Technology Co.*, Case No. 8:17-CV-2193 in the United States District Court for the Central District of California.
Fantasia's Answer, filed Mar. 12, 2018 in *Zagg Inc. and Mophie, Inc. v. Anker Technology Co.*, Case No. 8:17-CV-2193 in the United States District Court for the Central District of California.
Mophie's Answer to Counterclaims of Anker, filed Apr. 2, 2018 in in *Zagg Inc. And Mophie, Inc. v. Anker Technology Co.*, Case No. 8:17-CV-2193 in the United States District Court for the Central District of California.
Mophie's Answer to Counterclaims of Fantasia, filed Apr. 2, 2018 in in *Zagg Inc. and Mophie, Inc. v. Anker Technology Co.*, Case No. 8:17-CV-2193 in the United States District Court for the Central District of California.
Preliminary Joint Claim Construction Chart, dated Jun. 4, 2018 in *Zagg Inc. and Mophie, Inc. v. Anker Technology Co.*, Case No. 8:17-CV-2193 in the United States District Court for the Central District of California.
Mophie's Amended Complaint, filed May 25, 2016, in *Mophie, Inc. v. Cute Mobile Inc.*, Case No. 8:15-cv-02086 in the United States District Court for the Central District of California.

* cited by examiner

BATTERY PACK FOR MOBILE DEVICES

CROSS-REFERENCE TO RELATED APPLICATIONS

This application is a continuation of U.S. patent application Ser. No. 14/569,229, titled BATTERY PACK AND HOLSTER FOR MOBILE DEVICES, filed on Dec. 12, 2014, which is a continuation of U.S. patent application Ser. No. 12/938,351, titled BATTERY PACK, HOLSTER, AND EXTENDIBLE PROCESSING AND INTERFACE PLATFORM FOR MOBILE DEVICES, filed on Nov. 2, 2010, which is a divisional of U.S. patent application Ser. No. 12/357,262, titled BATTERY PACK, HOLSTER, AND EXTENDIBLE PROCESSING AND INTERFACE PLATFORM FOR MOBILE DEVICES, filed on Jan. 21, 2009, which claims the benefit under 35 U.S.C. § 119(e) to U.S. Provisional Patent Application No. 61/021,897, titled BATTERY PACK AND HOLSTER FOR MOBILE DEVICES, and filed Jan. 18, 2008, the disclosures of which are hereby expressly incorporated by reference for all purposes.

FIELD

One embodiment relates to battery packs and/or holsters and, more particular, to an external battery pack and/or holster for mobile electronic devices.

BACKGROUND

Many mobile devices (e.g., mobile phones, digital assistants, mobile communication devices, handheld computing devices, personal music/video/content players and storage devices) are often powered by battery power sources. Such battery power sources are often housed within the mobile device and may be changed and/or recharged as needed. However, as more powerful mobile devices are designed, these tend to consume power more quickly, thereby shortening the time between charges. This tends to limit the usefulness of the mobile device since the user must find a power source to recharge the battery source and wait until it is recharged.

Additionally, after a certain number of recharges, a battery source may need to be replaced as it may no longer hold a charge. Oftentimes, it is not easy to replace a battery source as the mobile device may need to be disassembled or opened to reach the battery source.

Therefore, a way is needed to extend the time between charges of mobile devices and/or continue to power the mobile device even after an internal power source has been depleted.

SUMMARY

According to one embodiment, a battery pack for a mobile communication device is provided comprising a casing and one or more rechargeable power cells. The casing may define a cavity that conforms, at least partially, to the outer shape of the mobile communication device. Additionally, the casing may further define one or more access openings to permit access to integrated interfaces (e.g., power button, camera lens, audio jack, etc.) of the mobile communication device.

The one or more rechargeable power cells may be housed within the thickness of the casing. For example, the power cells may be housed within the thickness of a back plane of the casing. The casing may secure the mobile communication device within the cavity while at least one surface of the mobile communication device remains exposed.

The battery pack may also include an internal interface and/or external interface. The internal interface may engage a corresponding interface on the mobile communication device to provide power from the one or more rechargeable cells to the mobile communication device. The external interface may be electrically coupled to the internal interface in order to transmit signals from the mobile communication device to an external device. The external interface may further serve to recharge the one or more rechargeable power cells.

The battery pack may further comprise a recharging device integrated within the battery pack that wirelessly recharges the one or more rechargeable power cells. This may include an inductive electrical recharging system that requires no direct contact or can recharge at a distance.

According to one aspect, the battery pack may also include additional communication interfaces and/or processors. For instance, a plurality of communication interfaces may be coupled to the internal interface, wherein the mobile communication device can transmit and receive signals via the communication interfaces. Likewise, at least one processor within the battery pack may be coupled to the internal interface and adapted to collect information via one or more interfaces of the battery pack and provide the collected information to the mobile communication device. In one example, the at least one processor may be adapted to execute one or more instructions under the control of the mobile communication device.

The battery pack may also include a display interface integrated into the battery pack to display information to a user. Such display interface may allow expanding the display from the mobile communication device to the display interface.

According to one aspect, the thickness of the battery pack may be approximately or substantially the same as the thickness of the mobile communication device. For this purpose, the battery pack may be slim and/or have an ergonomic shape so that it does not significantly increase the thickness and/or size of the mobile communication device. Consequently, mobile communication device can be used within the battery pack for extended periods of time since the battery pack does not significantly increase the bulkiness of the mobile communication device.

According to one embodiment, a battery pack for a mobile device is provided, comprising: a back plane, a first and second sides, a bottom side, and one or more battery cells housed within the thickness of the back plane. The back plane and first, second and bottom sides may define a cavity for mounting the mobile device. The one or more battery cells may be rechargeable while a mobile device is mounted within the cavity. The battery pack may also include an internal interface that electrically couples the one or more battery cells to the mobile device.

Additionally, the battery pack may include one or more speakers housed within the thickness of the back plane. The speakers may be electrically coupled to an interface to allow a mobile device mounted in the cavity to send audio signals through the one or more speakers. Similarly, the battery pack may include one or more microphones housed within the thickness of the back plane and electrically coupled to an interface to allow a mobile device mounted in the cavity to receive audio signals from the one or more microphones.

According to yet another aspect, the battery pack may include a plurality of communication interfaces coupled to the internal interface, wherein the mobile communication device can transmit and receive signals via the communication interfaces. The battery pack may also include at least one processor coupled to the internal interface and adapted to collect information via one or more of the plurality of communication interfaces and provide the collected information to the mobile communication device.

The thickness of the battery pack may be less than twice the thickness of the mobile communication device.

According to yet another feature a battery pack is provided comprising: (a) a holster defining a cavity that conforms, at least partially, to the outer shape of the mobile communication device; (b) one or more rechargeable power cells; and/or (c) an electrical connector to provide power from the one or more rechargeable power cells to the mobile communication device.

DETAILED DESCRIPTION

In the following detailed description of the invention, numerous specific details are set forth in order to provide a thorough understanding of the invention. However, the invention may be practiced without these specific details. In other instances, well known methods, procedures, and/or components have not been described in detail so as not to unnecessarily obscure aspects of the invention.

Various embodiments provide battery packs shaped to conform to the external shape of a mobile device, thereby providing a permanent or long-term replacement power source without significantly affecting the size and usability of the mobile device.

According to one feature, the battery pack may provide recharge power to the mobile device while also providing an external signaling and/or charging interface to the mobile device. This way, the mobile device need not be removed from the battery pack in order to charge it or provide data (e.g., synchronization, etc.).

According to yet another feature, the battery pack may include one or more different types of communication interfaces to extend the communication capabilities of the mobile device. This allows the mobile device to communicate via other interfaces that may not be built into the mobile device.

According to yet another feature, the battery pack may include one or more processors to extend the processing capabilities of the battery pack. For instance, the one or more processors may increase the processing capabilities of the battery pack and/or provide purpose-specific processors. That is, the interface between the battery pack and mobile device may allow the mobile device to use the one or more processors to execute application on the battery pack. Now that such applications may, in some instances, continue to operate even if the mobile device is detached from the battery pack.

According to yet another feature, the battery pack may include and inductive recharging device or a near-distance recharging device so that its power cells may be recharged without actually physically plugging it to a recharge power source.

First Embodiment of Battery Pack

Figure 1:
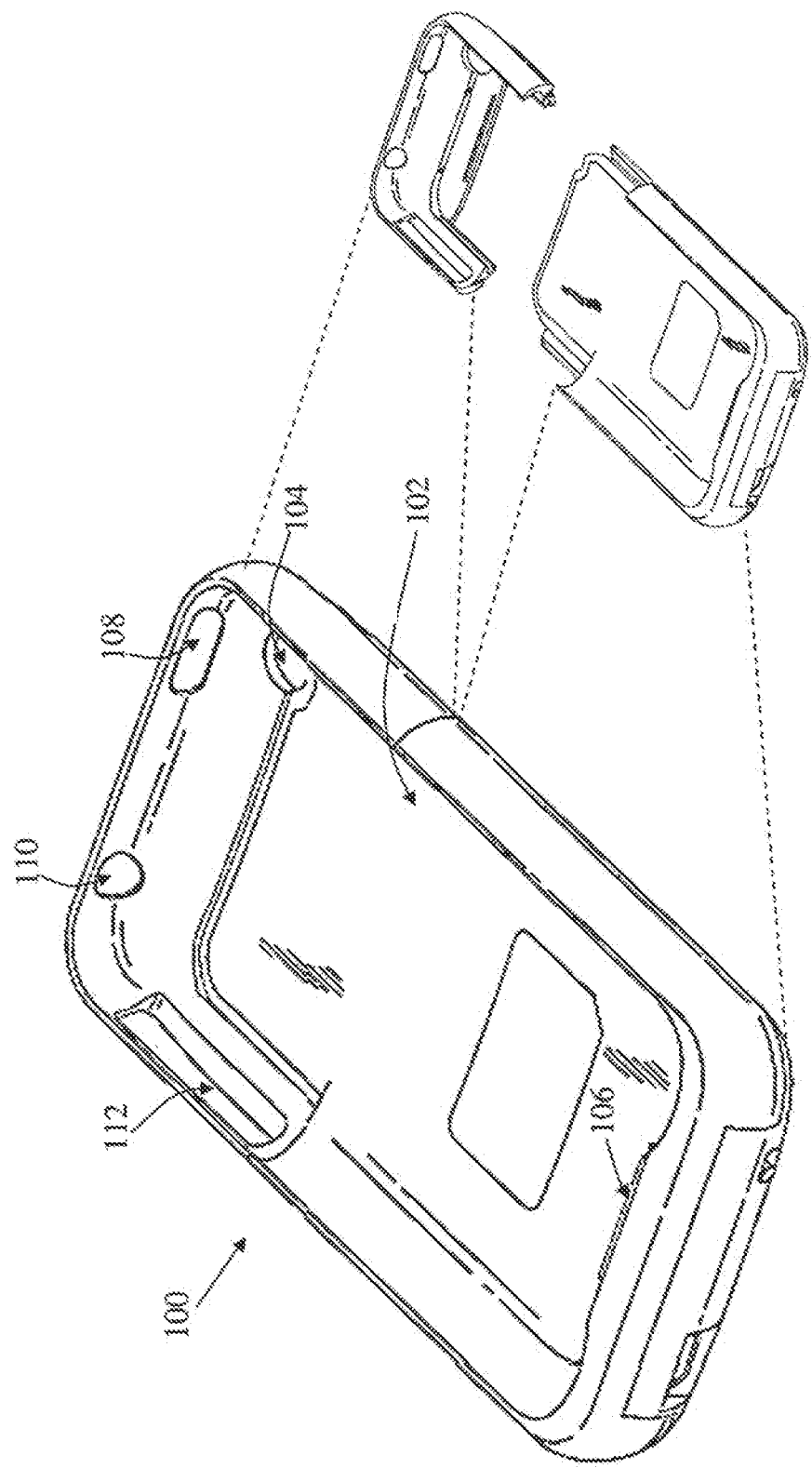
FIG. 1 illustrates a perspective view of a battery pack for a mobile device according to one example.

FIG. 1 illustrates a perspective view of a battery pack for a mobile device according to one example. In this example, the battery pack 100 is shaped to receive or house a mobile phone within a contoured cavity 102. The battery pack 100 has an integrated rechargeable power cell capable of providing power to operate and/or recharge a mobile device (e.g., iPhone' by Apple Inc., etc.).

Figure 2:
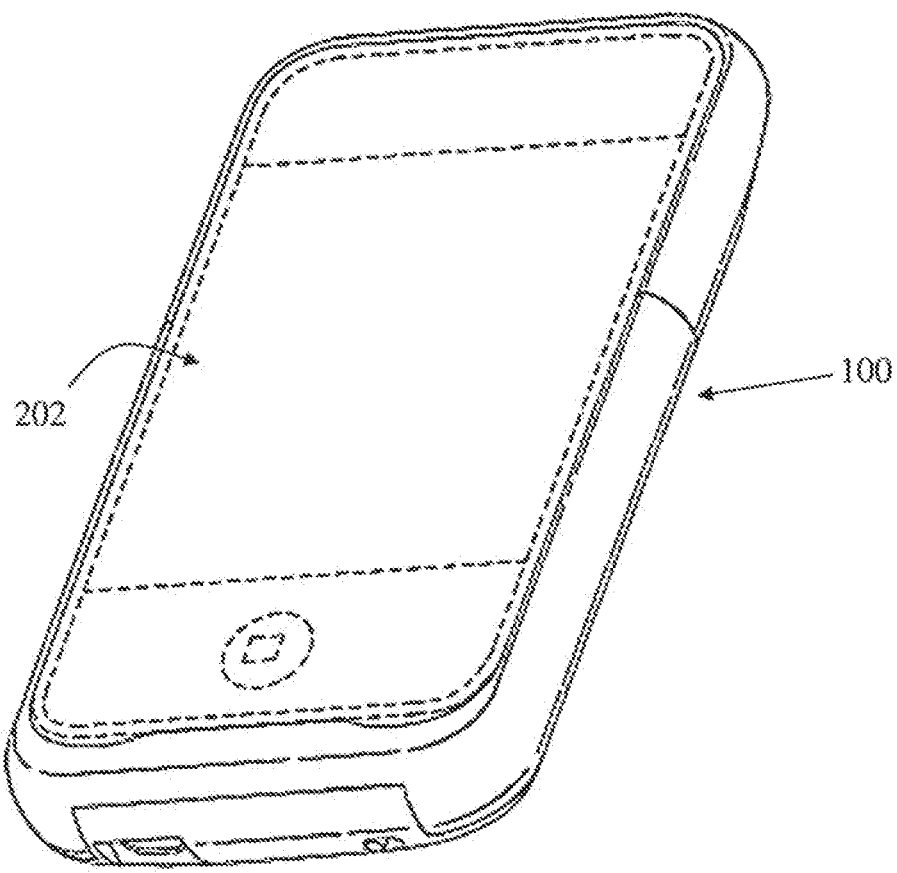
FIG. 2 illustrates how a mobile device can be housed within the battery pack of FIG. 1.

FIG. 2 illustrates how a mobile device can be housed within the battery pack 100 of FIG. 1. As can be appreciated from this figure, the battery pack 100 is shaped to closely wrap around the mobile device 202 and serves as a protective case for the mobile device 100.

Figure 3:
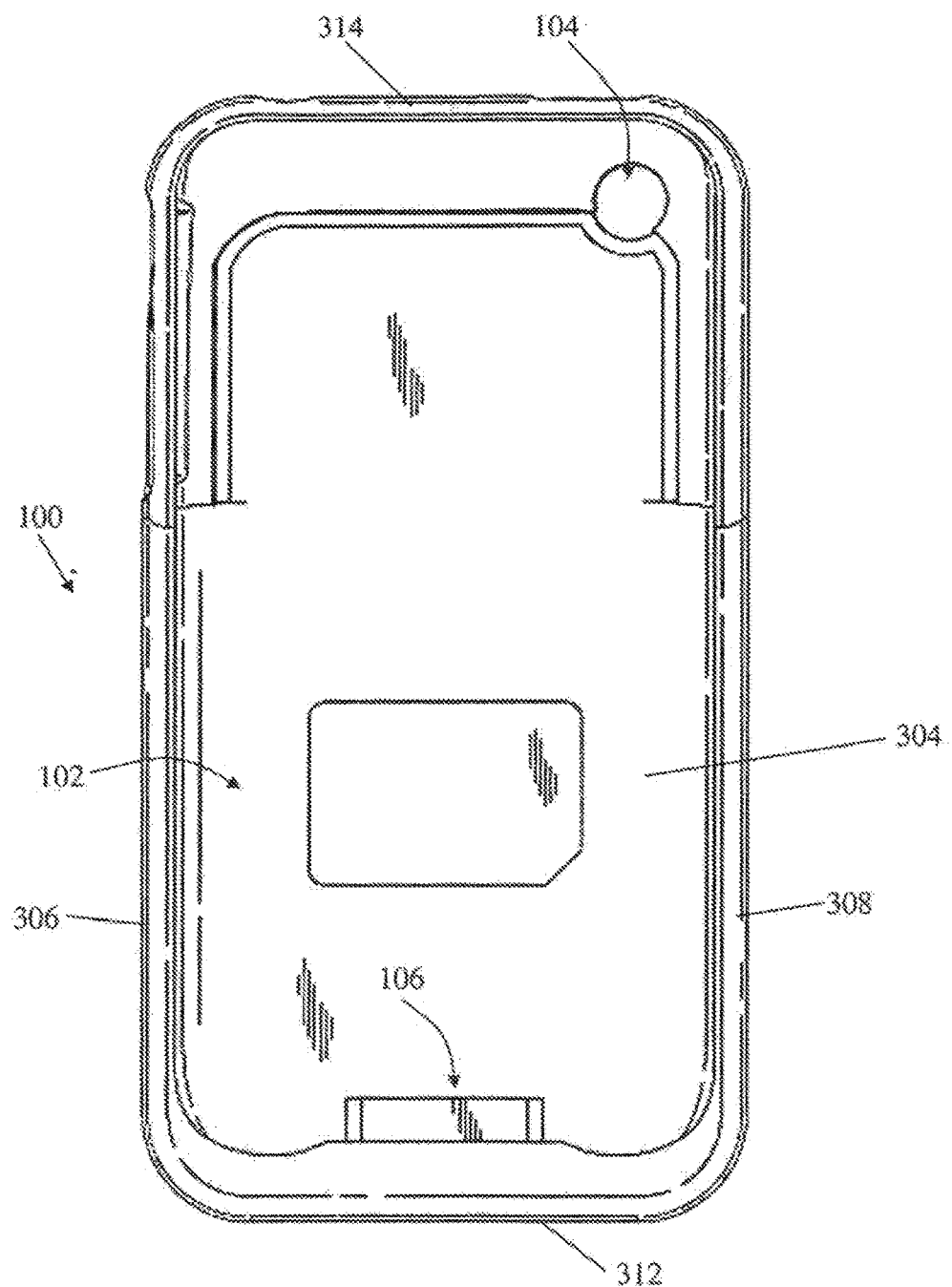
FIG. 3 illustrates a front view of the battery pack of FIG. 1.

FIG. 3 illustrates a front view of the battery pack 100 of FIG. 1. The battery pack 100 includes a back plane 304, first and second sides 306 and 308, a bottom side 312, and a top side 314. The back plane 304, first and second sides 306, bottom side 312 and top side 314 may be shaped to form a pocket or cavity 102 in which a mobile device to be powered can be housed. The top side 314 of the battery pack 100 may slide out to allow insertion and removal of the mobile device.

Referring again to FIG. 1, the battery pack 100 may include one or more openings 104, 108, 110, and 112 to facilitate access to various features of the mobile phone. For instance, a first opening 104 on the back plane 304 of the battery pack 100 may allow unobstructed view for a camera lens on the back of the mobile device. A second Opening 108 may provide access to a screen on/off switch for the mobile device. A third opening 110 may provide access to an audio jack on the mobile device. A fourth opening 112 on the first side 306 may provide access to a volume control sliding switch.

The battery pack 100 may also include a connector or interface 106 within the cavity 102 (e.g., on the bottom side 312) through which power can be provided to the mobile device from the internal power cell of the battery pack 100. Additionally, the connector 106 may be coupled to an external interface to provide input and/or output signals to the mobile device.

From FIG. 1, it can be appreciated that the battery pack may include two sections that separate to allow insertion of the mobile device and can then be coupled together to secure the mobile device in place. The size and shape of the battery pack 100 may be approximately that of the external contour of a mobile device to which it is intended to provide power.

Figure 4:
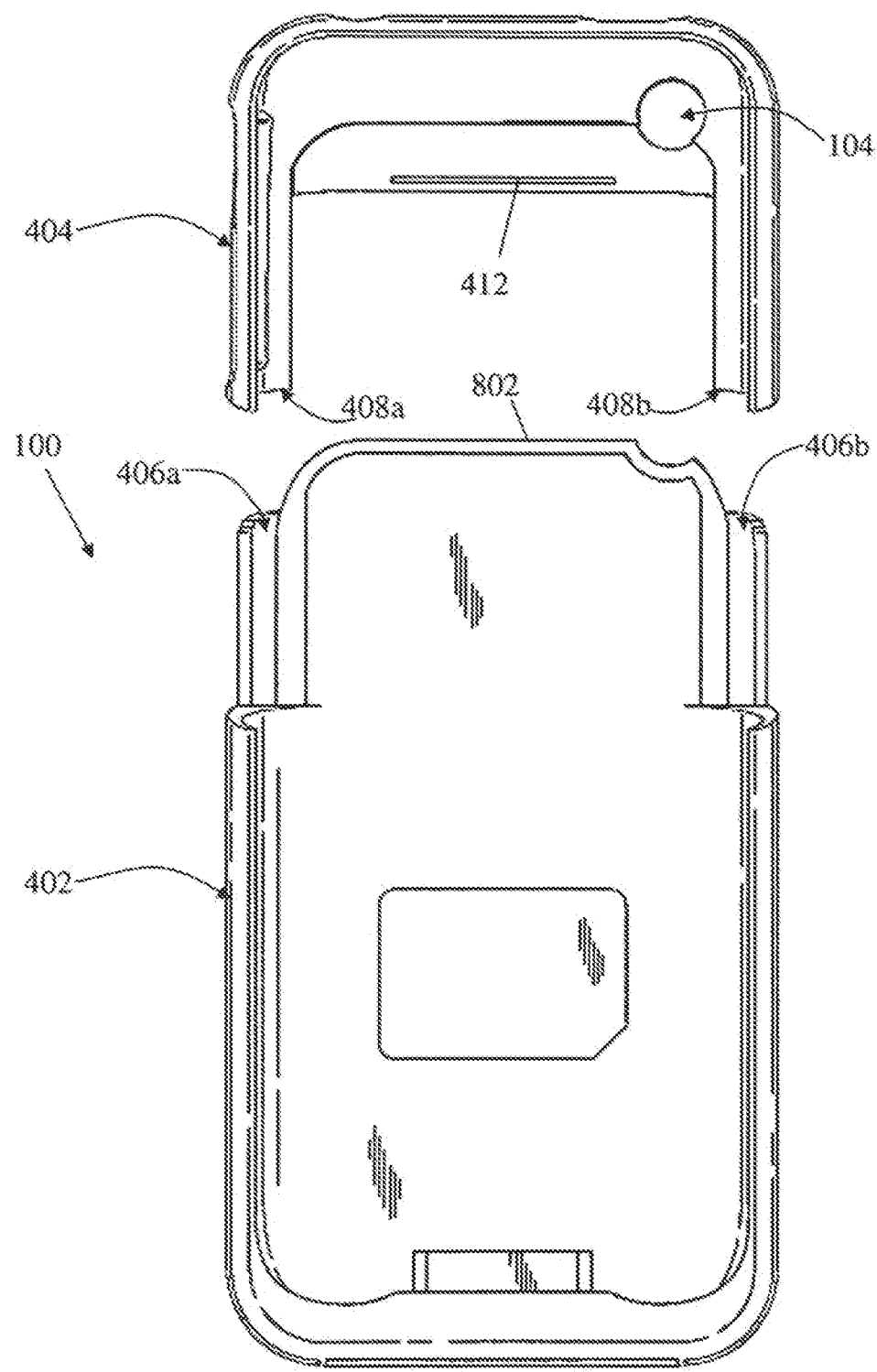
FIG. 4 illustrates the battery pack of FIG. 1 in an open configuration.

FIG. 4 illustrates the battery pack of FIG. 1 in an open configuration. The battery pack 100 may include a bottom section 402 and a top section 404 that can be separated from each other to insert a mobile device within the battery pack 100 and can then be coupled together secure the mobile device in place. For example, the bottom section 402 may include receiving grooves 406*a* and 406*b* that receive rails 408*a* and 408*b* from the top section 404. In this manner, the top section 404 can be coupled to the bottom section 402 by pressure fit. For example, a tongue section 802 (FIG. 8) may slide on to the top section 404 such that an engaging tab 412 couples into a receiving groove 804 (FIG. 8) to secure the top section 404 to the bottom section 402.

Figure 5:
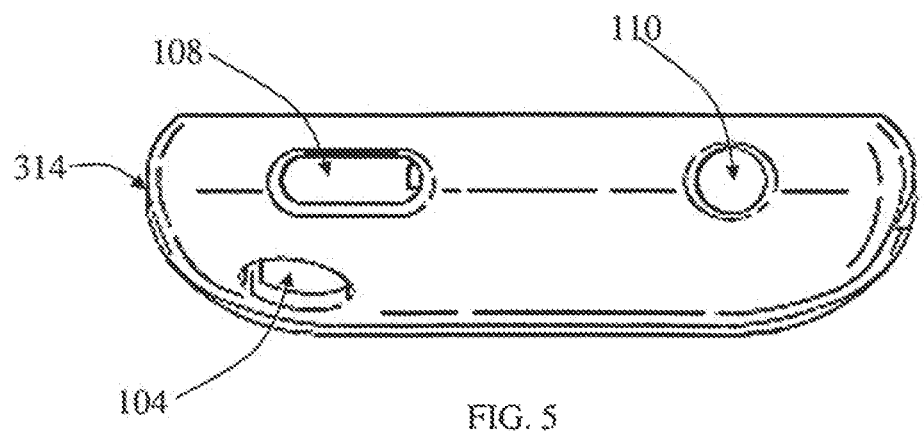
FIG. 5 illustrates a top view of the battery pack of FIG. 1.

FIG. 5 illustrates a top view of the battery pack 100 of FIG. 1. In this view, the top side 314 of the battery pack 100 is shown and the first opening 104, second opening 108, and third opening 110 can be appreciated.

Figure 6:
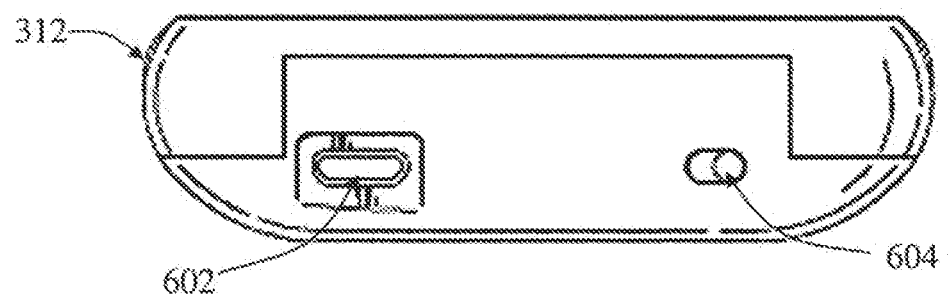
FIG. 6 illustrates a bottom view of the battery pack of FIG. 1.

FIG. 6 illustrates a bottom view of the battery pack 100 of FIG. 1. In this view, the bottom side 312 of the battery pack 100 is shown. In this view, an external interface 602 (e.g., micro USB connector) is shown. This external interface 602 may serve to recharge the internal power cell of the battery pack. Additionally, the external interface 602 may also provide a pass-through signaling interface for the internal connector or interface 106, thereby allowing the mobile device to communicate via the external interface 602. A switch 604 may also be located on the bottom side 312 of the battery pack and can function to switch power from the battery pack On or Off. That is, when the mobile device has sufficient power on its own, the power cell of the battery pack is not needed and can be switched Off until it is needed.

Figure 7:
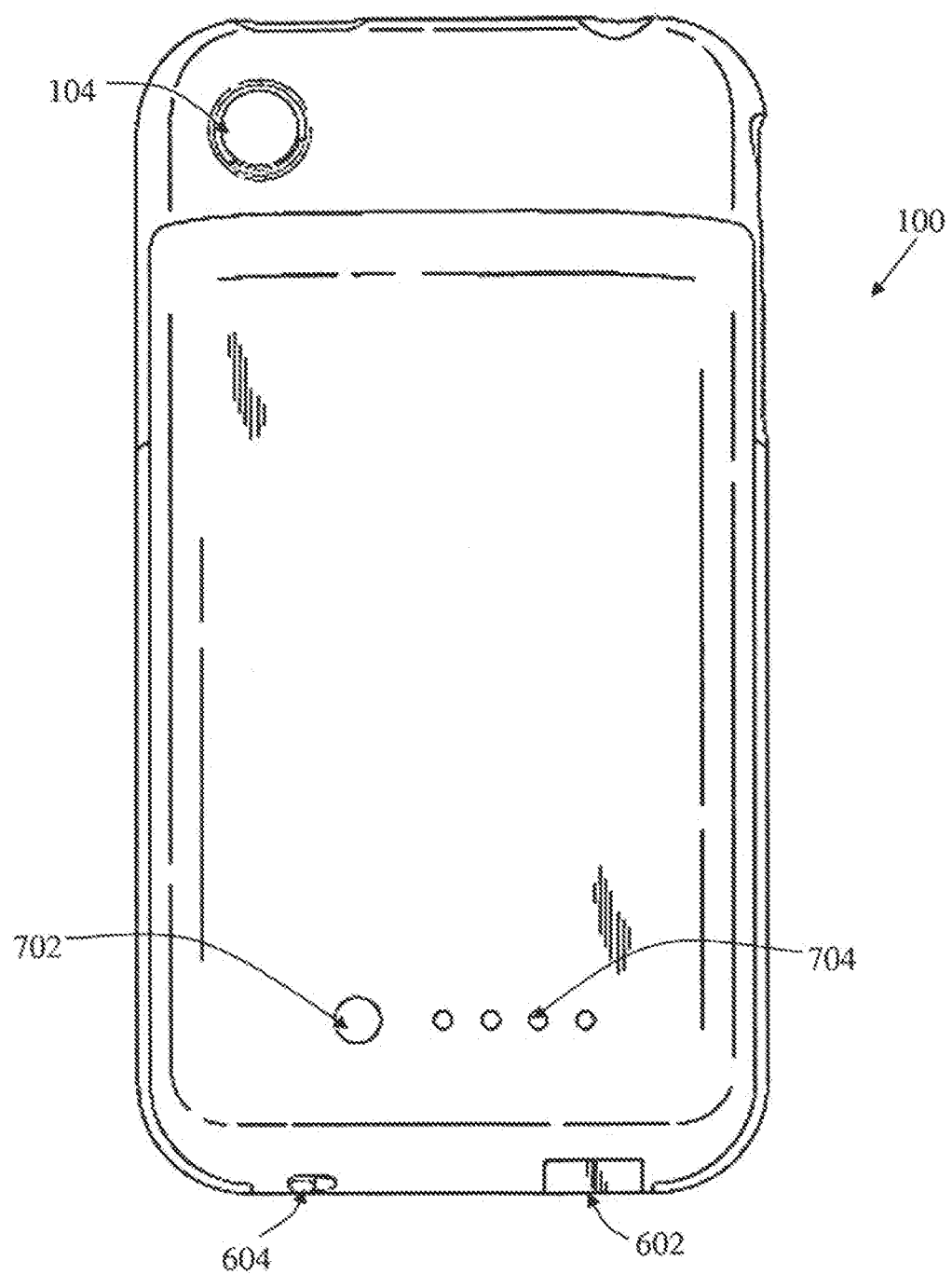
FIG. 7 illustrates a back view of the battery pack of FIG. 1.

FIG. 7 illustrates a back view of the battery pack 100 of FIG. 1. In this example, a test button 702 is provided that, when pushed, causes plurality of LED lights 704 to indicate the power or charge level of the internal power cell of the battery pack 100.

Figure 8:
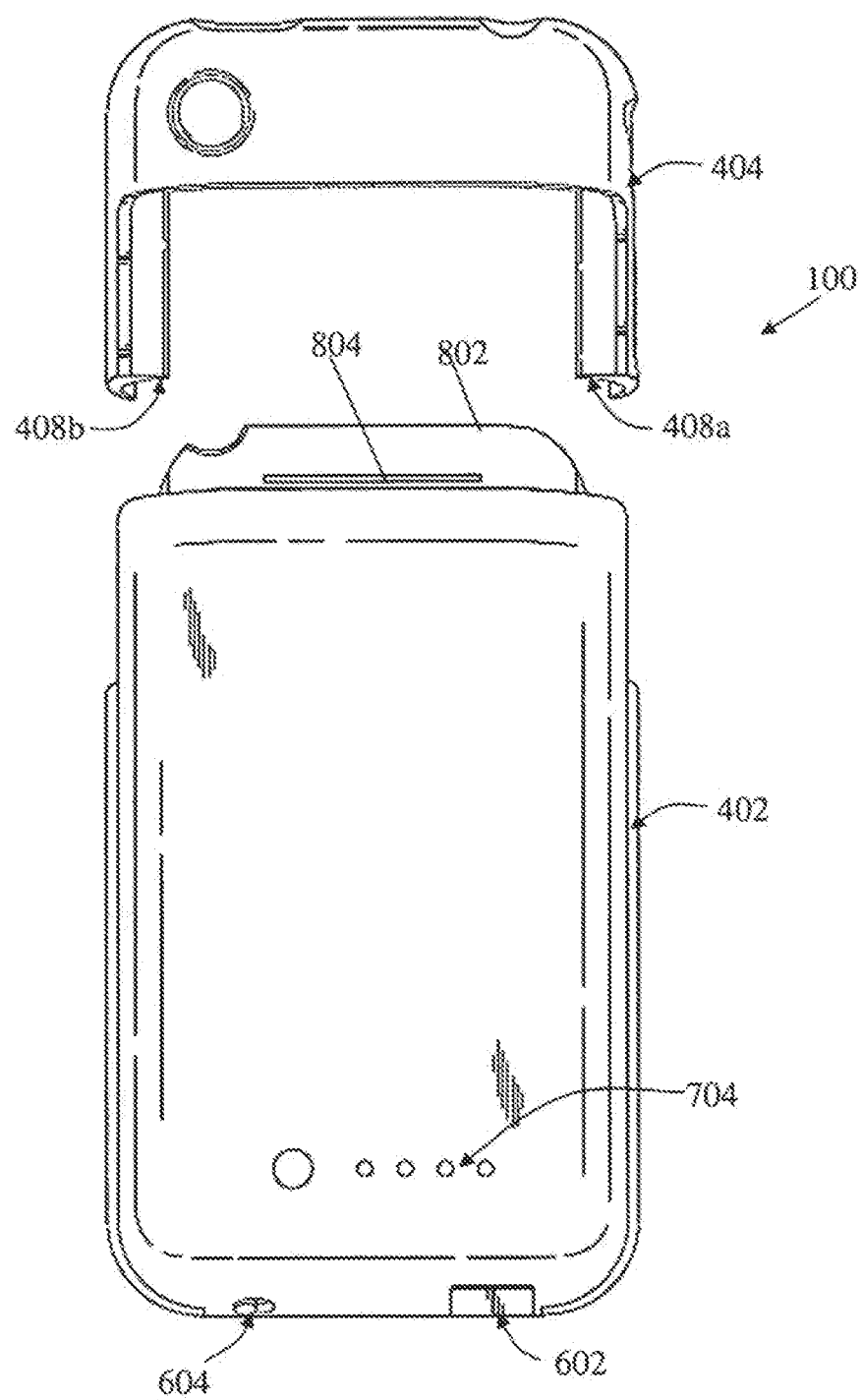
FIG. 8 illustrates back view of the battery pack of FIG. 1 in an open position.

FIG. 8 illustrates back view of the battery pack 100 of FIG. 1 in an open position.

Figure 9:
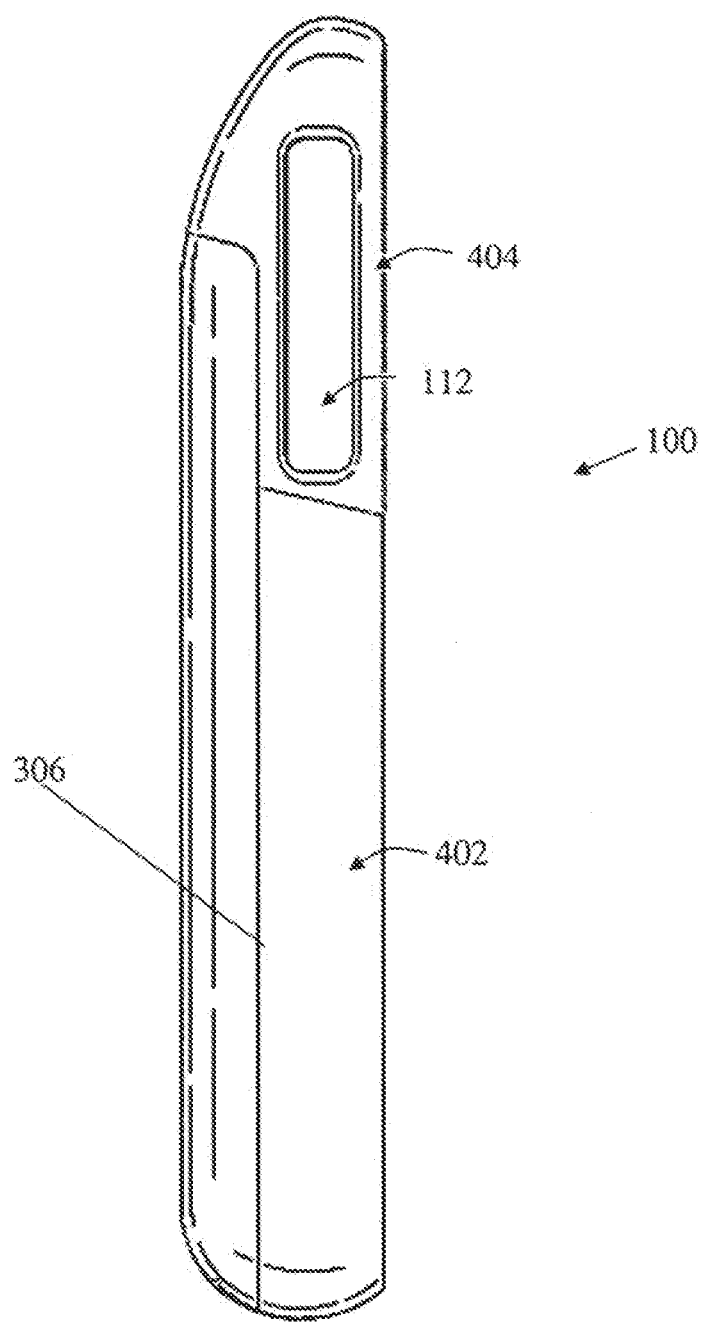
FIG. 9 illustrates a first side view of the battery pack of FIG. 1.

FIG. 9 illustrates a first side view of the battery pack of FIG. 1.

Figure 10:
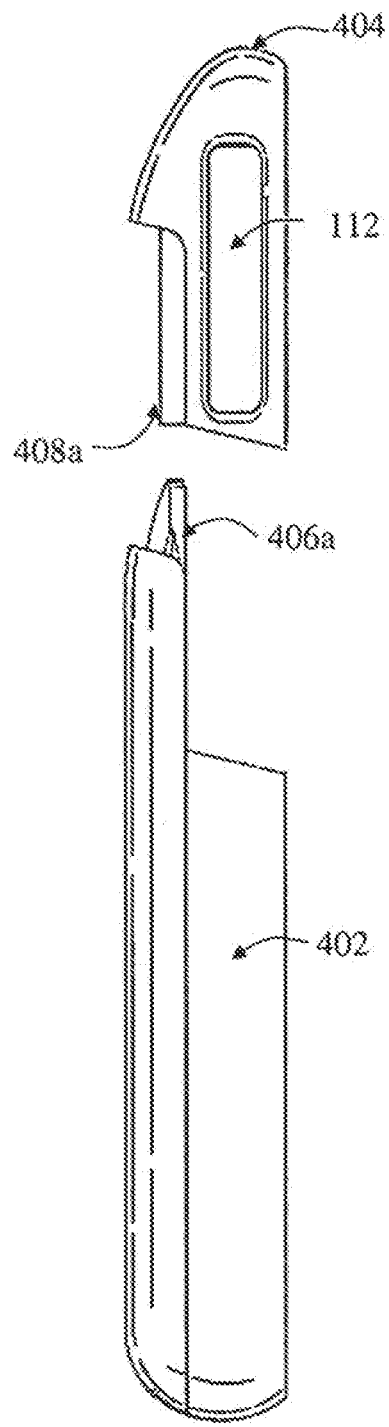
FIG. 10 illustrates the first side view of the battery pack of FIG. 1 in an open position.

FIG. 10 illustrates the first side view of the battery pack of FIG. 1 in an open position.

Figure 11:
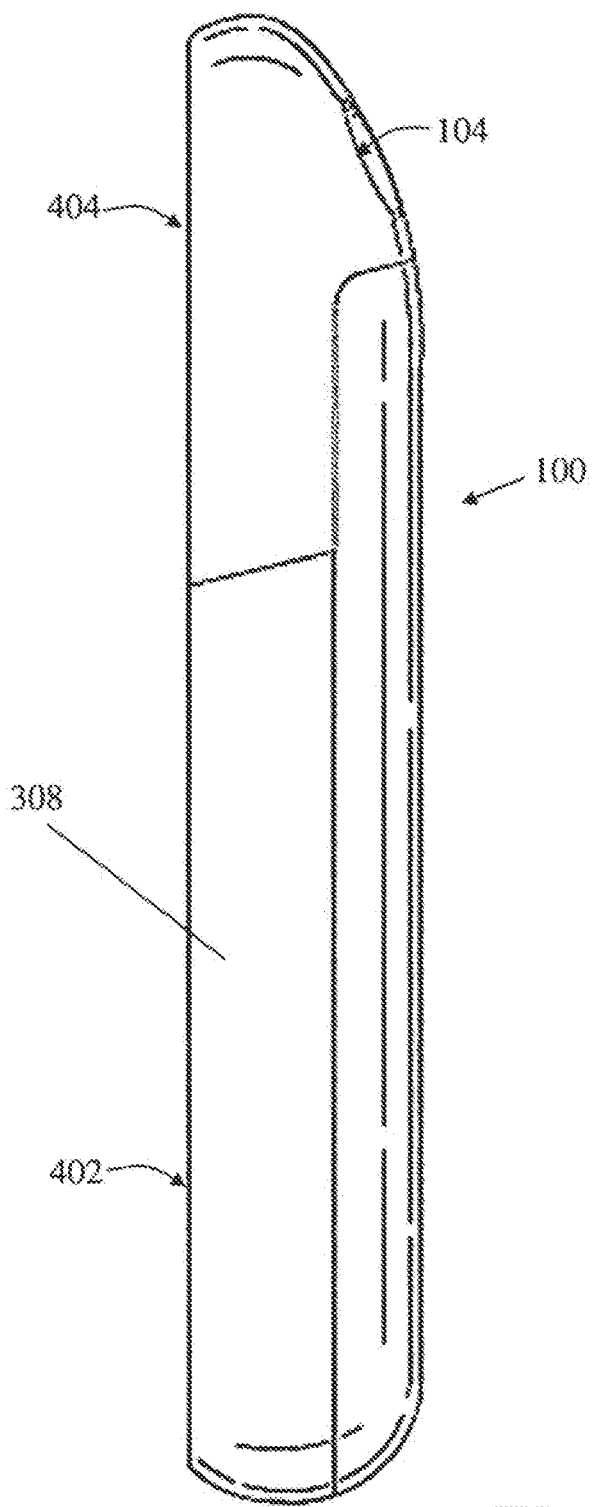
FIG. 11 illustrates a second side view of the battery pack of FIG. 1.

FIG. 11 illustrates a second side view of the battery pack of FIG. 1.

Figure 12:
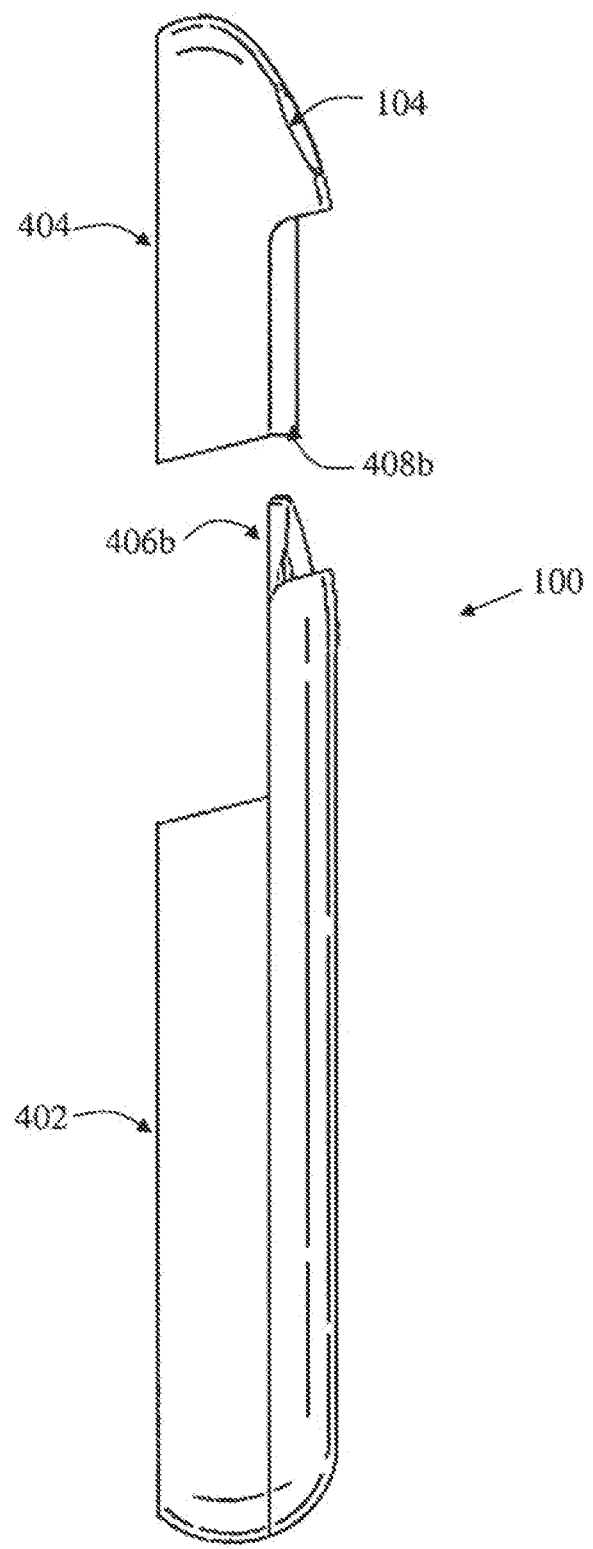
FIG. 12 illustrates the second side view of the battery pack of FIG. 1 in an open position.

FIG. 12 illustrates the second side view of the battery pack of FIG. 1 in an open position.

Figure 13:
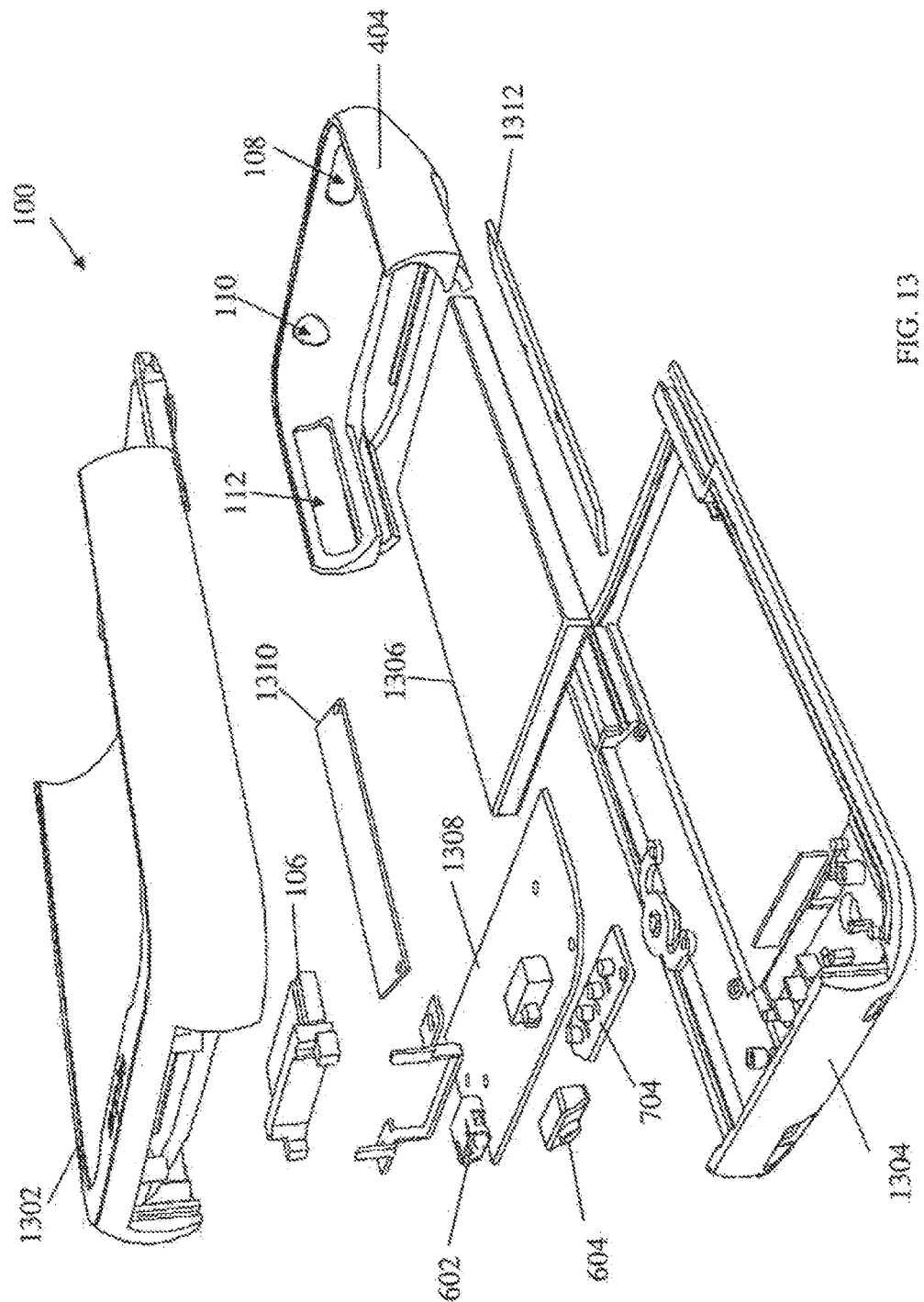
FIG. 13 is an exploded view of components of the battery pack of FIG. 1.

FIG. 13 is an exploded view of components of the battery pack of FIG. 1. In this example, the battery pack may include a first bottom section 1302 and a second bottom section 1304 which form a top and bottom shell in between which one or more circuit boards 1308, 1310, and/or 1312 and/or one or more power cells 1306 are housed. That is, the circuits hoards 1308, 1310, 1312 and/or power cell(s) 1306 are sandwiched between the top and bottom sections 1302 and 1304 of the battery pack 100. Consequently, the rechargeable power cell(s) 1306 may be housed within the thickness of the back plane of the battery pack.

In some instance, the circuit boards and or power cell of the battery pack may cause interference with the antenna or signaling of the mobile device which is in close proximity. Consequently, one aspect provides for reducing the size of a primary circuit hoard 1308 by adding secondary circuit boards 1310 and 1312 which are electrically coupled to the primary circuit hoard 1308. This allows reducing the size of the circuit board 1308 thereby reducing interference to the antenna of the mobile device. Additionally, the ground for the power cell 1306 may be coupled to the ground for the mobile device (via the internal interface 106) to reduce interference to the mobile device.

Figure 14:
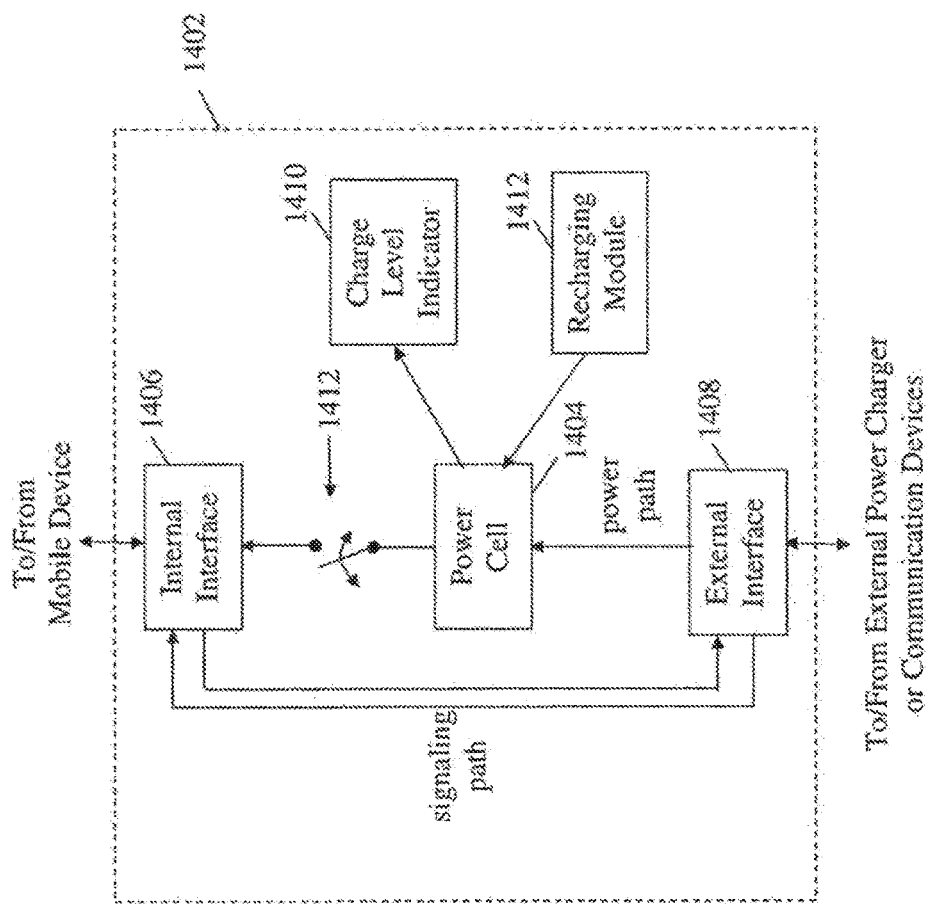
FIG. 14 illustrates a block diagram for the battery pack of FIG. 1.

FIG. 14 illustrates a block diagram for the battery pack 100 of FIG. 1. The battery pack 1402 may include a power cell 1404, an internal interface 1406, an external interface 1408, and charge level indicator 1410. The internal interface 1406 may be adapted to provide a mobile device power from the power cell 1404 as well as passing signal to/from the mobile device to the external interface 1408. The external interface 1408 may allow recharging of the power cell 1404 as well as passing signals to/from the mobile device via the internal interlace 1406. A switch 1412 may allow switching power from the power cell 1404 to the mobile device On and Off as desired. Also, a charge level indicator 1410 permits displaying of the charge level of the power cell 1404. Additionally, a recharging module 1412 serves to recharge to power cell 1404 when needed.

Second Embodiment of Battery Pack

FIGS. 15-16 and 18-22 illustrate yet another embodiment of the power pack. In this embodiment, the power pack may operate as previously disclosed but does not include a top section. By removing the top section, the battery pack is more compact in size and ergonomic so that it does not significantly increase or change the size, thickness, and/or shape of mobile communication device 1602 secured thereto.

Figure 15:
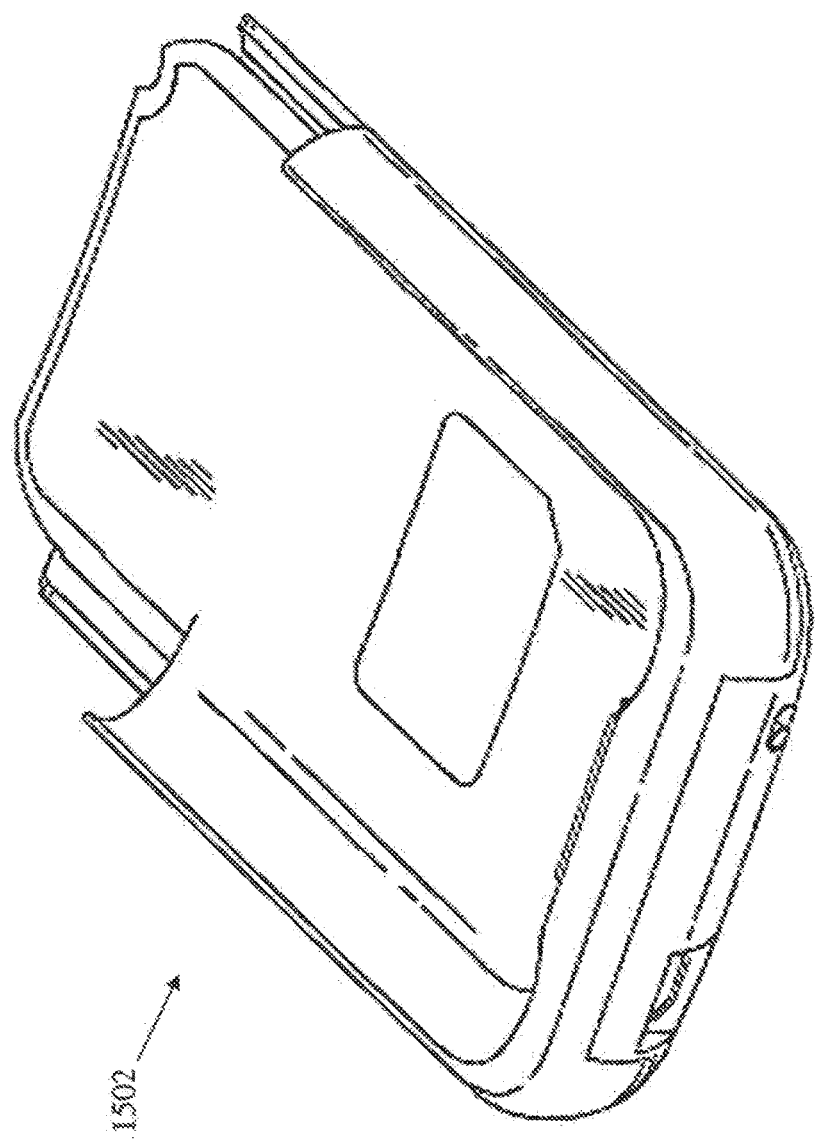
FIG. 15 illustrates a perspective view of the battery pack.

FIG. 15 illustrates a perspective view of the battery pack 1502.

Figure 16:
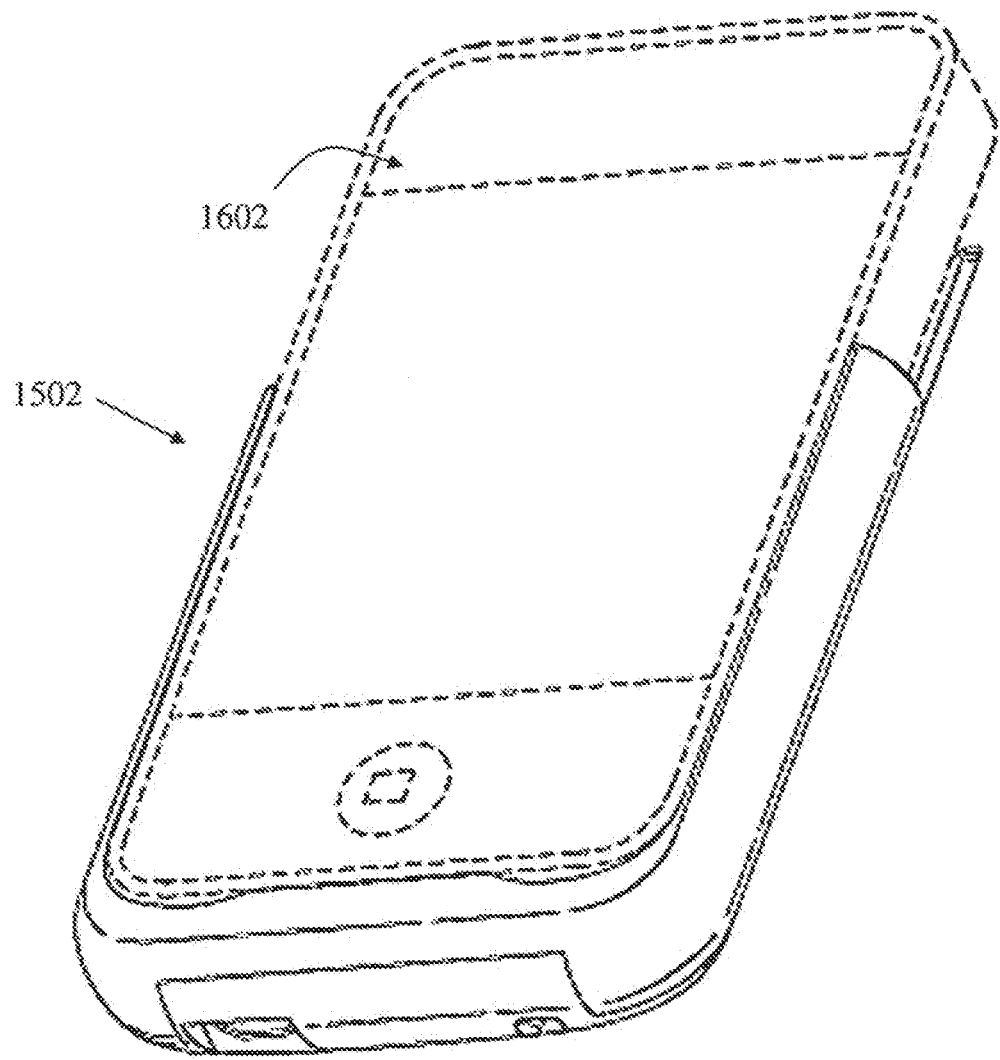
FIG. 16 illustrates a perspective view of the battery pack with a mobile device 1602 inserted therein.

FIG. 16 illustrates a perspective view of the battery pack 1502 with a mobile device 1602 inserted therein.

Figure 18:
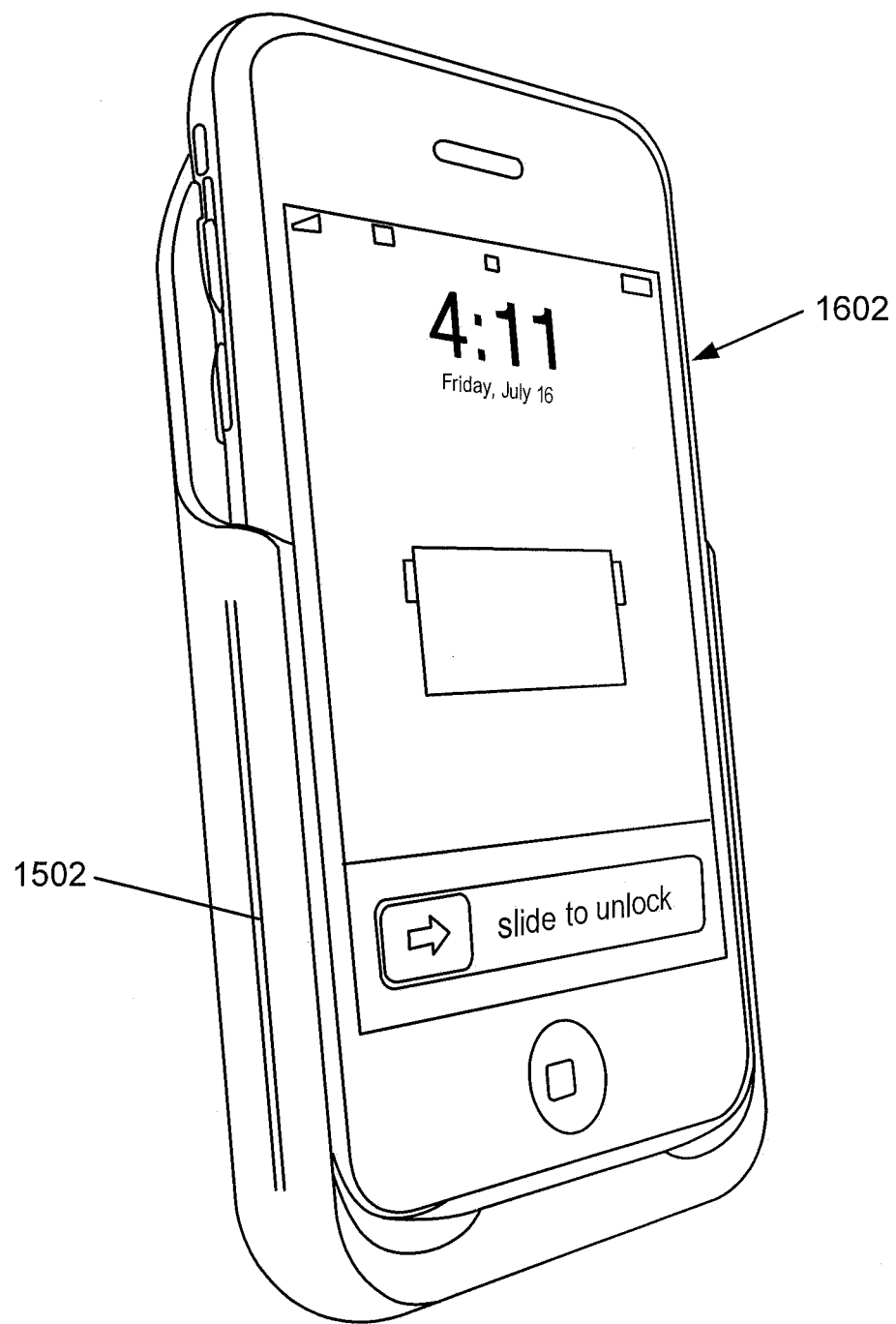
FIG. 18 illustrates another perspective view of the battery pack.

FIG. 18 illustrates another perspective view of the battery pack 1502.

Figure 19:
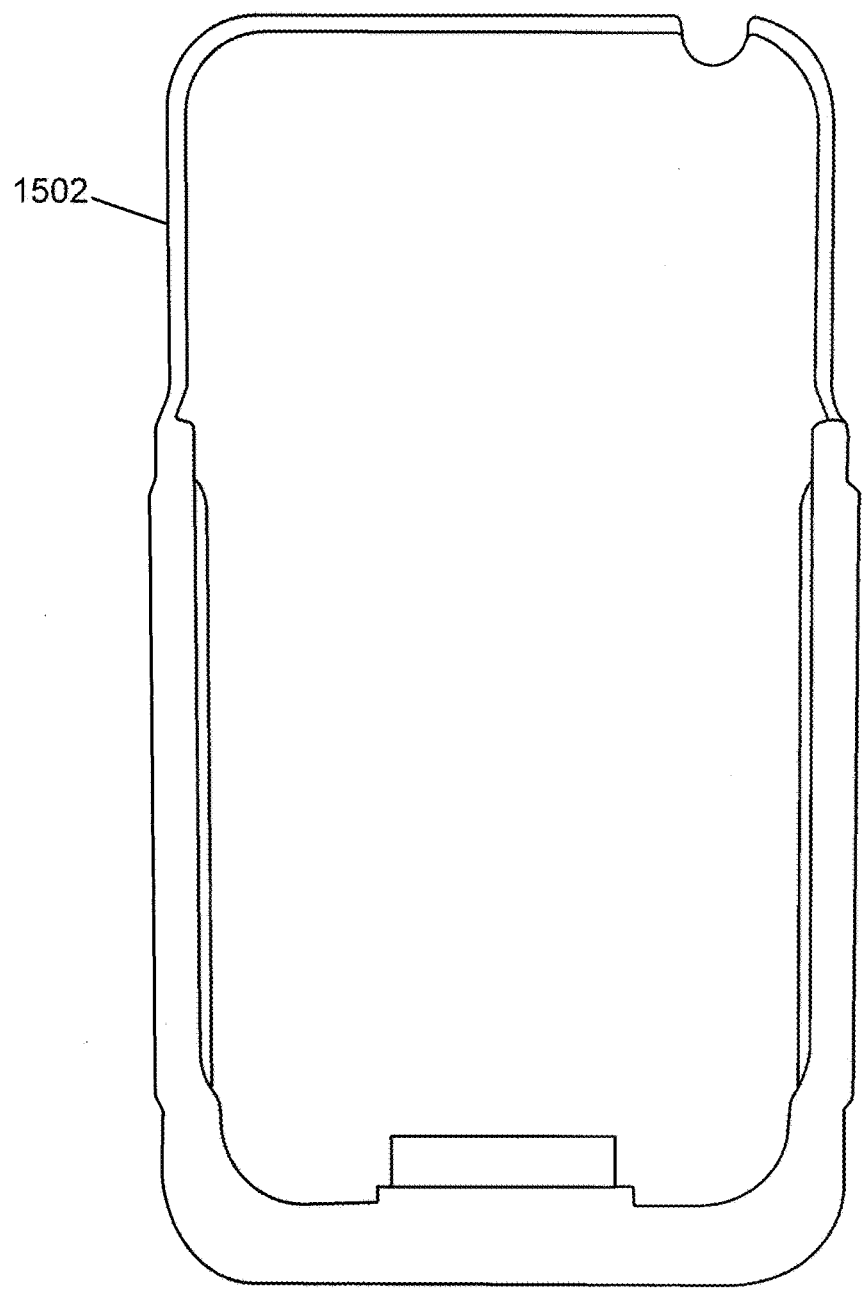
FIG. 19 illustrates a front view of the battery pack.

FIG. 19 illustrates a front view of the battery pack 1502.

Figure 20:
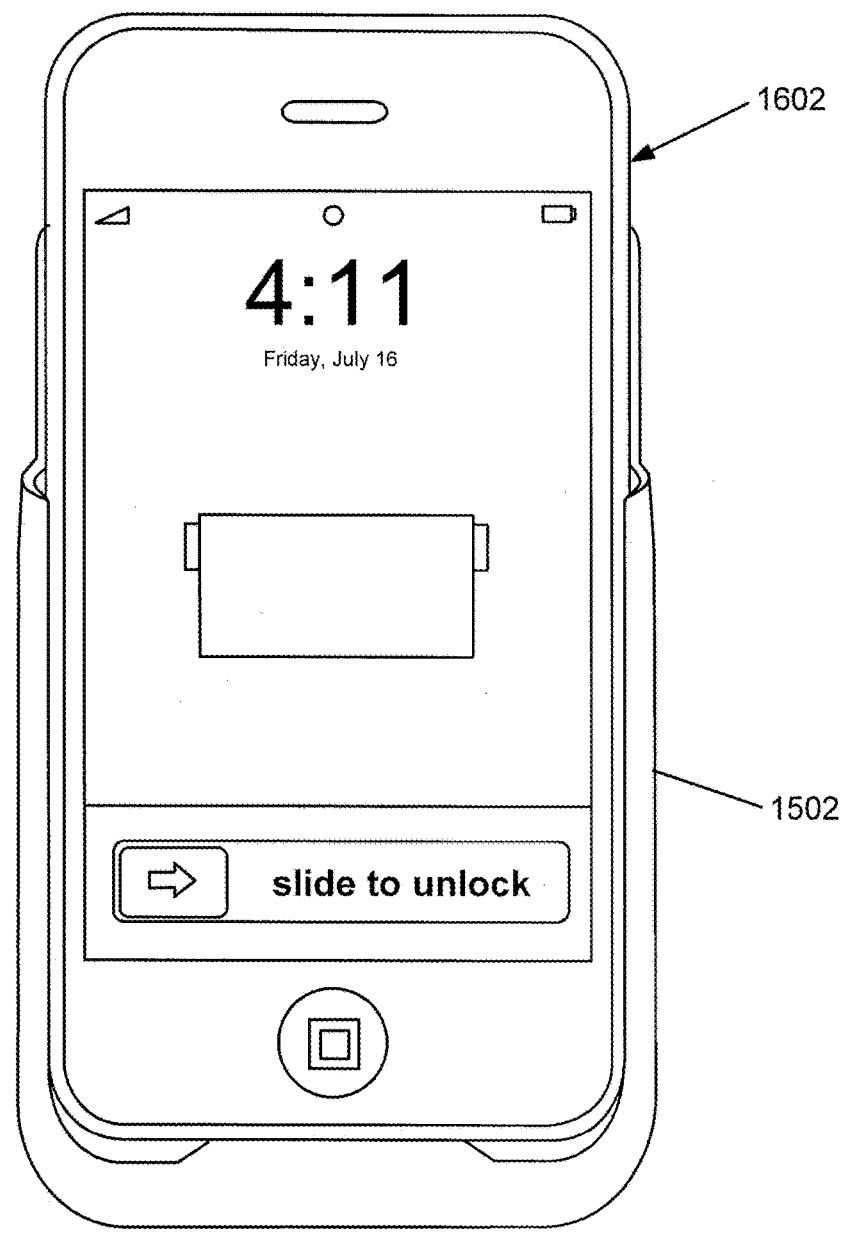
FIG. 20 illustrates a front view of the battery pack 1502 with the mobile device inserted therein.

FIG. 20 illustrates a front view of the battery pack 1502 with the mobile device inserted therein.

Figure 21:
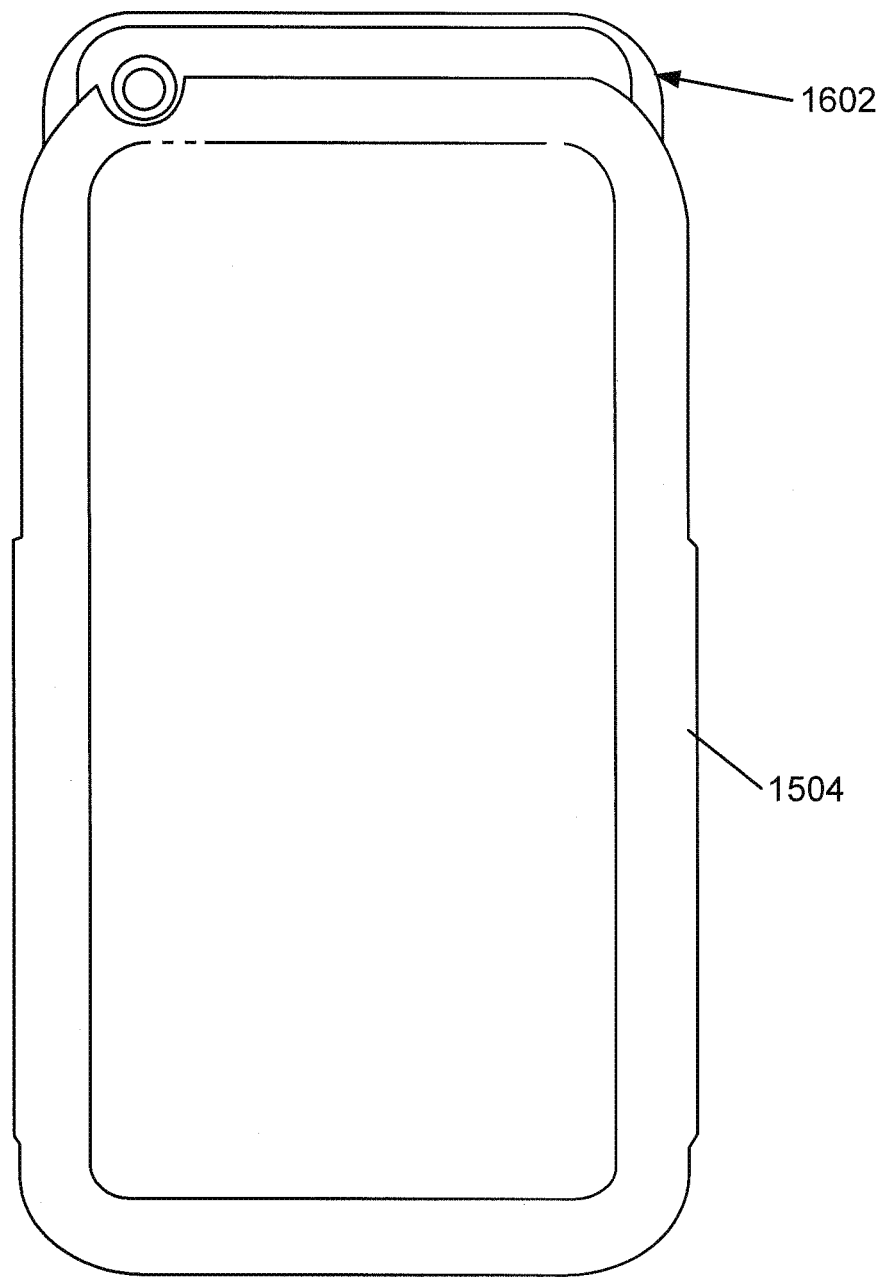
FIG. 21 illustrates a back view of the battery pack with the mobile device inserted therein.

FIG. 21 illustrates a back view of the battery pack 1502 with the mobile device 1602 inserted therein.

Figure 22:
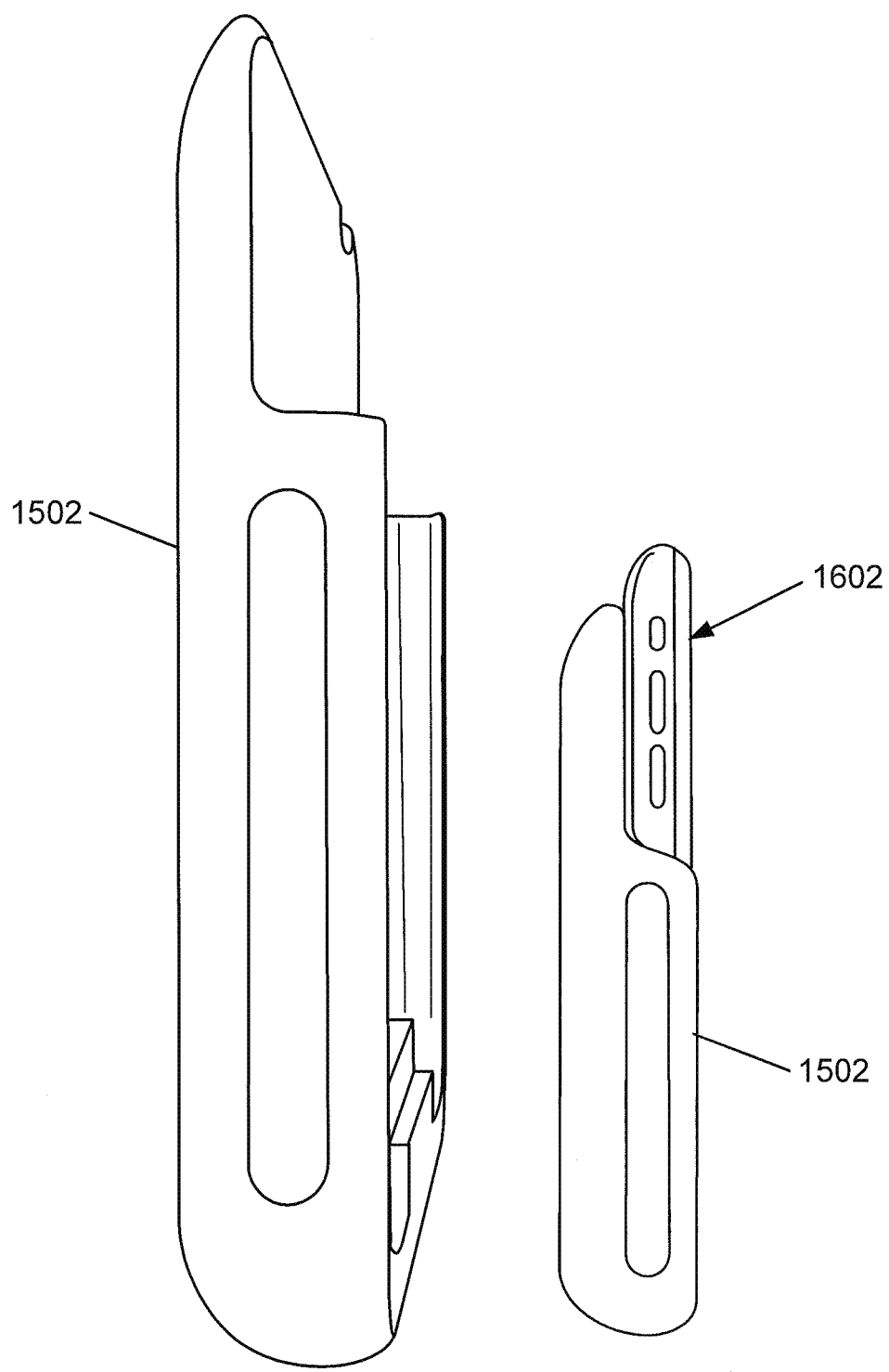
FIG. 22 illustrates a side view of the battery pack with and without the mobile device.

FIG. 22 illustrates a side view of the battery pack 1502 with and without the mobile device 1602. Note that, in some embodiments, the left and right sides may be symmetrical.

Extendible Processing and Interfacing Platform

Figure 17:
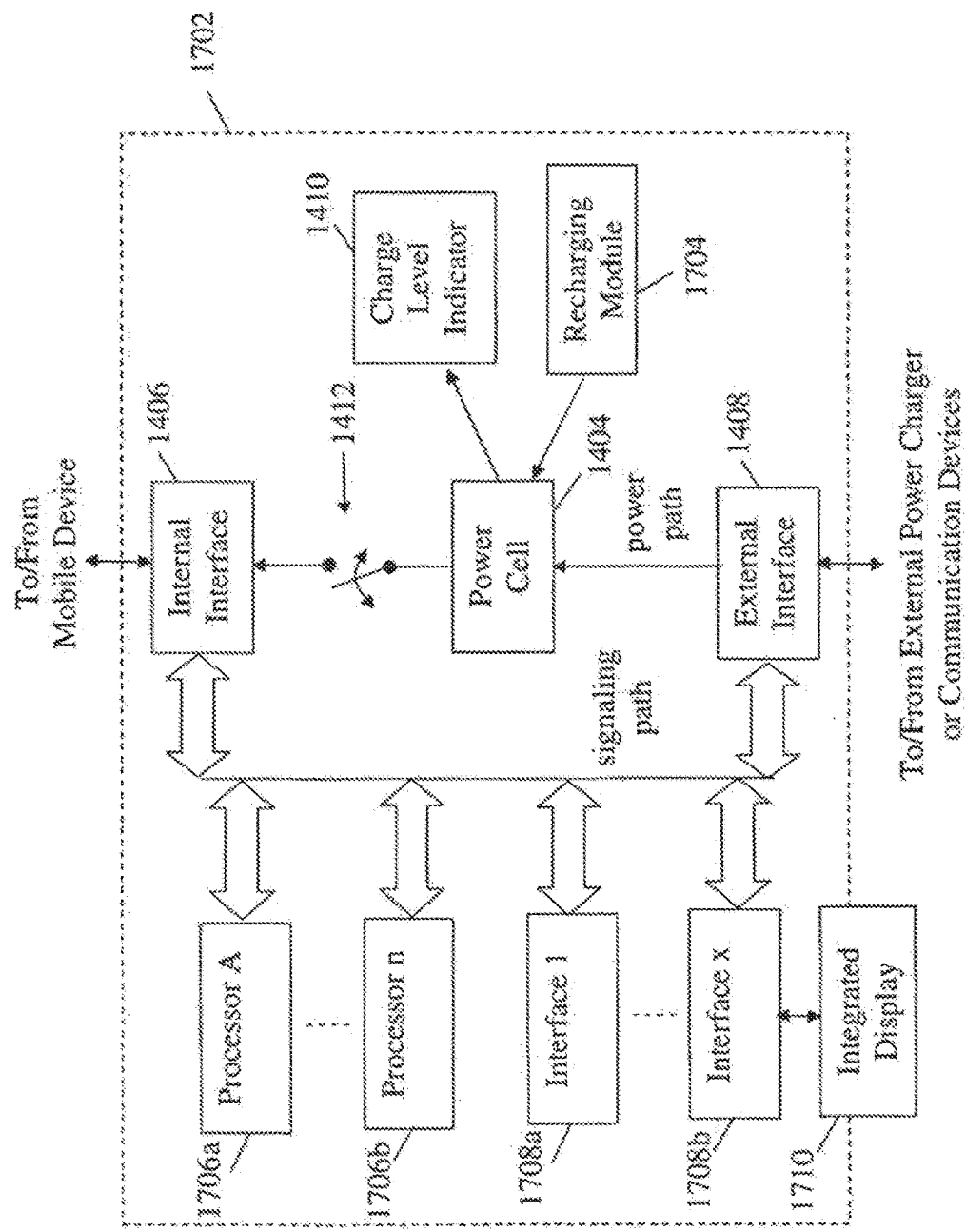
FIG. 17 illustrates a battery pack that also operates as an extendible processing and/or interfacing platform for a mobile device.

FIG. 17 illustrates a battery pack that also operates as an extendible processing and/or interfacing platform for a mobile device. In one example, the battery pack 1702 may operate as described with reference to FIG. 14. In addition, the battery pack may also include one or more processors 1706 and/or one or more interfaces 1708. The one or more processors 1706a and 1706b may allow a mobile device coupled to the internal interface 1406 to extend its processing capabilities. For instance, the mobile device may cause one or more applications to be executed on the one or more processors 1706 while using a user display on the mobile device as an output interface. Additionally, the processors 1706a and/or 1706b may be purpose-specific processors that allow the mobile device to perform particular tasks not otherwise possible on its own. For example, the processors 1706 may provide analog-to-digital conversion, audio signal sampling, temperature measuring, etc., which may not be available to the standard mobile device.

The one or more interfaces 1708a and 1708b may also provide the mobile device a means by which to communicate or acquire signals. These interfaces 1708 may effectively expand the communication interfaces available to the mobile device by providing wired and/or wireless communication interfaces for various types of signals (e.g., audio, infrared, etc.).

The battery pack 1702 may also include a recharging module 1704 that facilitates recharging of the power cell 1404. For example, the recharging module 1704 may be a wireless or cordless charging device that inductively or otherwise facilitates recharging of the power cell 1404.

In one example implementation, the battery pack 1702 may be adapted to function as a Medical Processing Unit which may have build-in capabilities for monitoring real-time health conditions (e.g., alcohol levels in breath, pulse, temperature, blood pressure, test and/or diagnose diabetes, etc.) via build-in test port. Consequently, the battery pack 1702 can collect and/or process such collected data and store it in the mobile device. Note that the processing of such data may be directed by an application that operates either on the one or more processors of the battery pack 1702 and/or the processor(s) of the mobile device. According to one feature, if an abnormal health condition occurs (e.g., a heart attack, fainting, seizure, etc.), the Medical Processing Unit may detect this condition and automatically activate the mobile device (e.g., cellular phone) to send urgent text message or entails to a doctor, hospital, or emergency responder. The responding party (doctor, hospital, emergency responder) may be able to locate the patient via a global positioning system or information from the mobile device.

In another example implementation, the battery pack 1702 may be adapted to function as a Gaming Processing Unit that may include the capability of turning the mobile device into a real handheld gaming device with joysticks or large PSP/DS type of gaming buttons and communication devices. Consequently, the mobile device may be configured to operate as an input and/or output interface (e.g., via a display on the mobile device or battery pack) for a game.

In yet another example, the battery pack 1702 may be adapted to function as a Home Entertainment Unit that may include the capability of turning the mobile device into a Universal Smart Remote Control which can control all the IR activated units in a home or office (e.g. control garage doors, television sets, security alarm, air conditioning, lighting, etc.). For this purpose, the battery pack 1702 may include various interfaces 1708 that provide the specific infrared and/or wireless protocols and/or signaling to control such devices.

Speakers & Microphone

Another feature may provide for one or more speakers to be included as part of the battery packs or holster (illustrated in FIGS. 1-22). For instance a low-profile speaker may be housed within the back plane of a battery pack so that the sound may be emitted from the rear or sides of the battery pack. When a mobile device is inserted and coupled to the battery pack, it couples to an interface that electrically connects the speaker to the mobile device. The mobile device may send audio or sound signals to the speaker via an interface with the battery pack. This allows a user to listen to audio stored in the mobile device without the need, for headphones.

Similarly, another feature may provide for one or more microphones to be included as part of the battery packs (illustrated in FIGS. 1-22). One or more microphones may be housed within the battery pack (e.g., back plane) so that they may capture sound from a user. The microphone may be electrically coupled to an interface that allows sending captured audio signals to a mobile device that may be coupled to the battery pack.

According to yet another feature, when the mobile device is coupled to the battery pack 1702, it may cause one or more applications to execute on the processors 1706. These applications may continue to operate or execute even if the mobile device is removed or decoupled from the battery pack 1702. For example, the battery pack may continue to collect data (e.g., monitor medical conditions for a patient to which it is coupled) and wirelessly transmits the collected data or an alarm to the mobile device. This is possible since the processors 1706 may be powered by the power cell 1404 and can be configured to operate whether or not the mobile device is coupled to the battery pack.

Integrated Display

In some embodiments of the battery pack 1702, battery pack 1702 may also include an integrated display or screen. For example, the integrated display may be on the outer surface of the back plane of the battery pack. Alternatively, the display 1710 may slide out from within the housing of the battery pack. This integrated display 1720 may allow displaying additional information or data to a user. The additional display screen may be electrically coupled to the mobile device (via an interface) to allow the mobile device to send images or video to the additional display screen.

In another example, the rear of the back plane may house a Braille input and/or output interface that electrically coupled a mobile device mounted within the holster or battery pack.

In yet another embodiment, the rear of the back plane may provide a keypad that serves as an input to the mobile device.

According to another feature, the battery pack and/or holster may provide an external interface (e.g., Bluetooth wireless interface, USB port, infrared port, etc.) that may allow the mobile device mounted in the battery pack and/or holster to communicate via that external interface. Thus the external interface may provide a different wireless interface than provided or supported by the internal system of the mobile device.

Consequently, a battery pack for a mobile communication device is provided comprising: (a) a casing or holster (e.g., FIGS. 4, 402 and/or 404) defining a cavity (FIG. 1, 102) that conforms, at least partially, to the outer shape of the mobile communication device (FIG. 2, 202); and/or (h) one or more rechargeable power cells (FIG. 13, 1306) housed within the thickness (between 1302 and 1304) of the casing. The casing secures the mobile communication device (202) within the cavity (102) while at least one surface (e.g., a display screen) of the mobile communication device remains exposed. An internal interface (106) engages a corresponding interface on the mobile communication device to provide power from the one or more rechargeable cells (1306) to the mobile communication device. An external interface (FIG. 6, 602) electrically couples to the internal interface (106) to transmit signals from the mobile communication device to an external device. The external interface (602) may further serve to recharge the one or more rechargeable power cells. The casing further defines one or more access openings (104, 108, 110, 112) to permit access to integrated interfaces of the mobile communication device (202).

The battery pack (100 or 1502) may further include a recharging device (1704) integrated within the battery pack that wirelessly recharges the one or more rechargeable power cells (1306).

An extendible communication and/or processing platform may be provided to mobile communication device by the battery back. For instance, a plurality of communication interfaces (1708) may be coupled to the internal interface (106 or 1406), wherein the mobile communication device (202) can transmit and receive signals via the communication interfaces (1708). Similarly, at least one processor (1706) may be coupled to the internal interface (106 or 1406), and adapted to collect information via one or more interfaces (1708) of the battery pack and provide the collected information to the mobile communication device (202). At least one processor (1706) may be adapted to execute one or more instructions under the control of the mobile communication device (202). According to one feature, a display interface (1710) may be integrated into the battery pack to display information to a user.

The thickness of the battery pack (100 or 1502) is less than twice the thickness of the mobile communication device. In some embodiments, the thickness of the battery pack may extend, for example, between ten and ninety percent more than the thickness of the mobile communication device. For example, the battery pack may extend a mere thirty to fifty percent more than the thickness of the mobile communication device.

Similarly, a battery pack (100) for a mobile device (202) may include (a) a back plane (304), (h) a first and second sides (306 and 308). (c) a bottom side (312), wherein the back plane (304) and first (306), second (308) and bottom (312) sides define a cavity (102) for mounting the mobile device (202); and (d) one or more battery cells (1306) housed within the thickness of the back plane (304). One or more speakers may be housed within the thickness of the back plane (304) and electrically coupled to an interface (106) to allow a mobile device (202) mounted in the cavity (102) to send audio signals through the one or more speakers. Similarly, one or more microphones may be housed within the thickness of the back plane (304) and electrically coupled to an interface (106) to allow a mobile device (202) mounted in the cavity (102) to receive audio signals from the one or more microphones.

Third Embodiment

Figure 23:
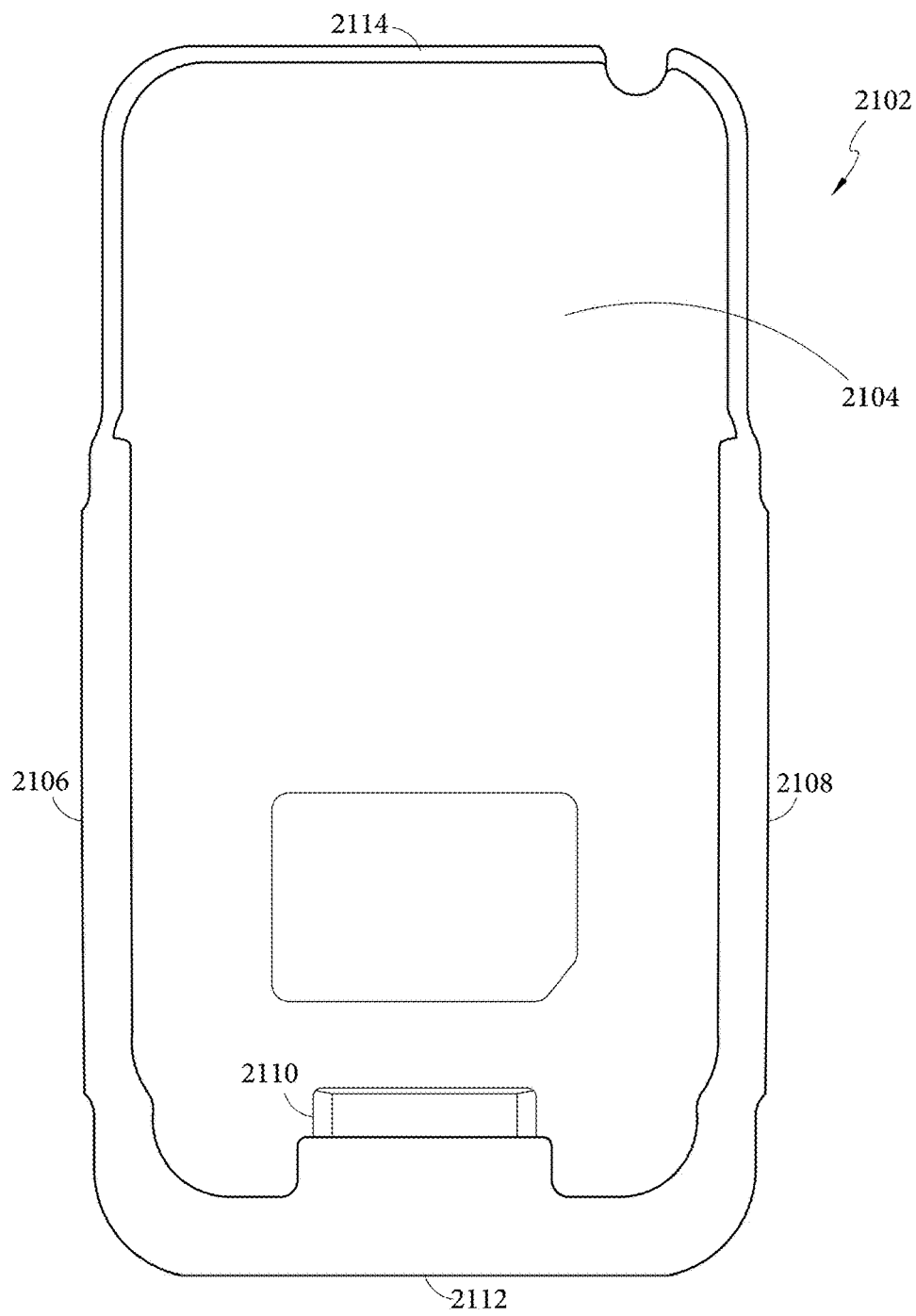
FIGS. 23-27 illustrate one example of a battery pack for a mobile device.

FIGS. 23-27 illustrate one example of a battery pack for a mobile device. FIG. 23 illustrates a front view of the battery pack 2102 includes a back plane 2104, first and second sides 2106 and 2108, and a bottom side 2112. The back plane 2104, first and second sides 2106 and bottom side 2112 may be shaped to form a pocket into which a mobile device to be powered can slide. A top portion 2114 of the battery pack 2102 may remain open to allow insertion and removal of the mobile device. A device interface 2110 may be positioned along the bottom side 2112 to couple with the mobile device. The device interface 2110 may serve for the battery pack 2102 to provide power to the mobile device. The battery pack may be detached from the mobile device to be recharged. In some examples, a user may have two battery packs so that when one is being charged, the other can be powering the mobile device.

Figure 24:
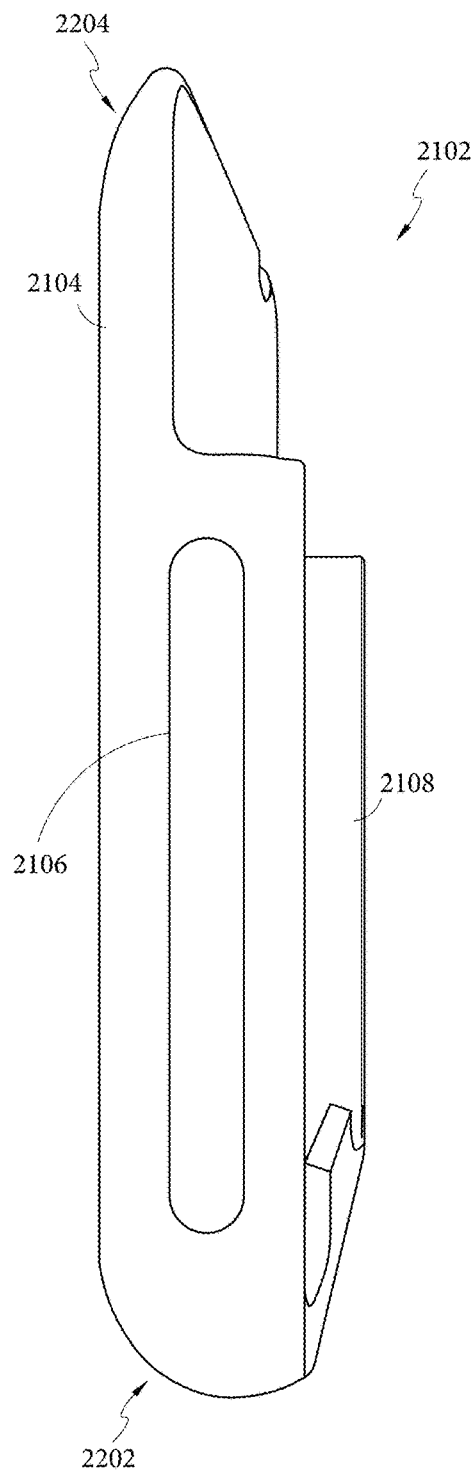

FIG. 24 illustrates a side view of the battery pack 2102. The first and second sides 2106 and 2108 may extend the whole length or a partial length of the battery pack 2102. The sides and ends 2202 and 2204 of the battery pack 2102 may be rounded to provide an ergonomic shape. Additionally, internal rechargeable battery cells may be housed within the thickness of the back plane 2104. The internal rechargeable battery cells may be coupled to the device interface 110 to provide power to the mobile device.

Figure 25:
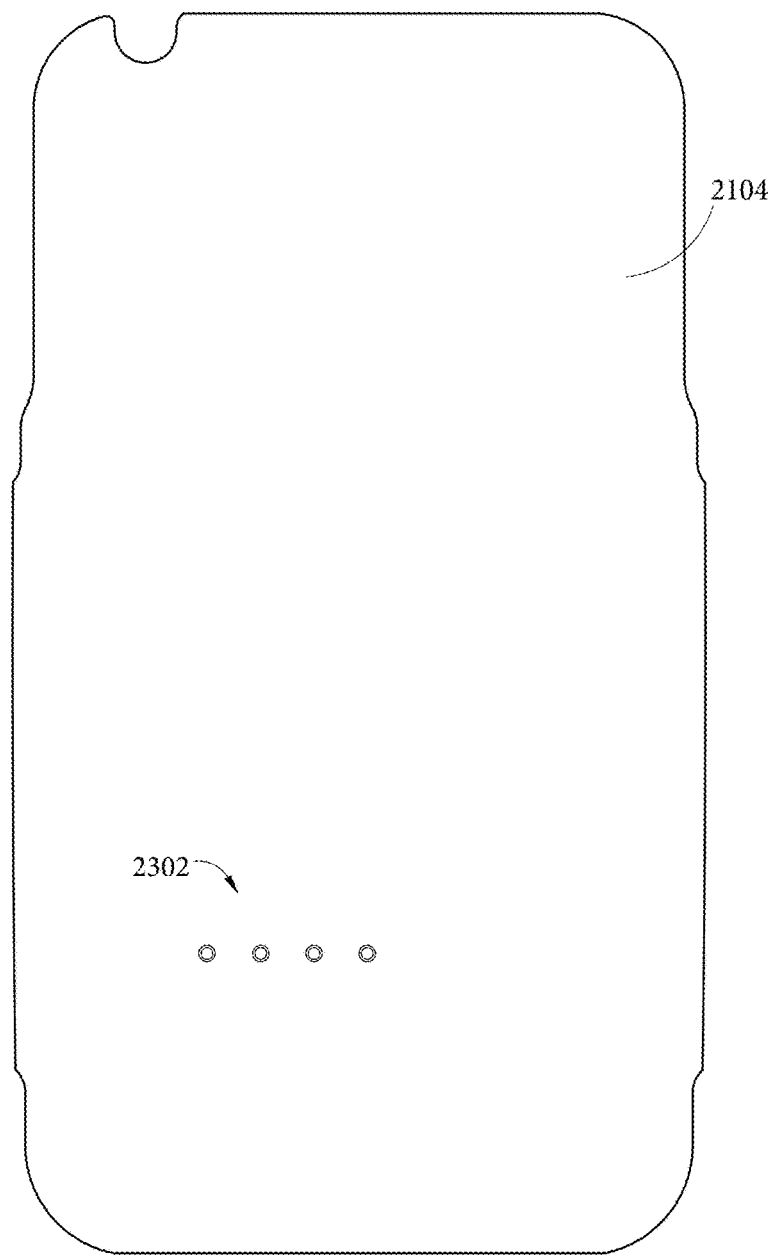

FIG. 25 illustrates a back view of the battery pack 2102. The size or dimensions of the back plane 2104 may be approximately that of the mobile device to which it is intended to provide power. Additionally, a plurality of LEDs 2302 may be mounted on the back surface to indicate the charge status of the internal battery cells of the battery pack 2102.

Figure 26:
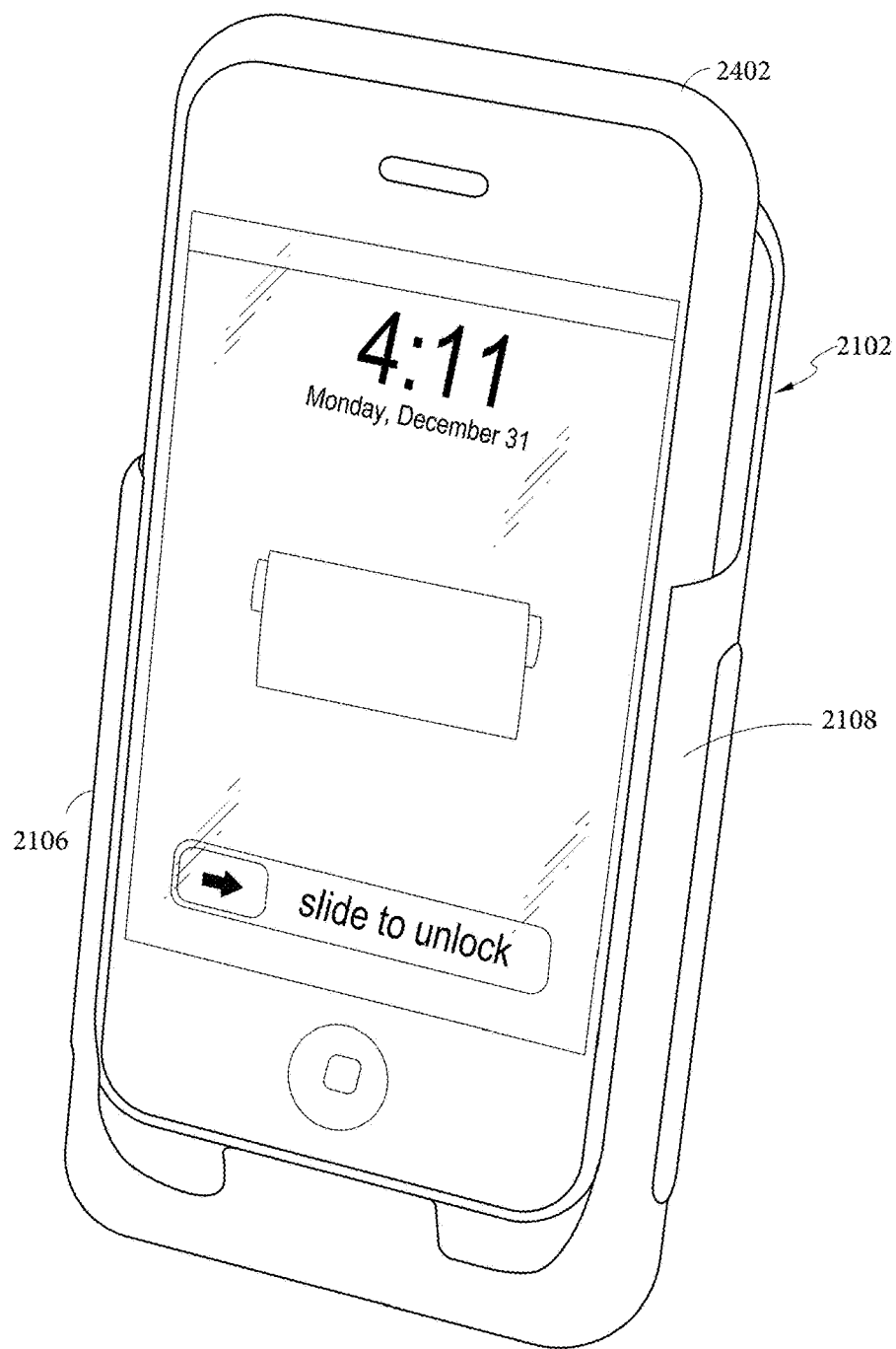
Figure 27:
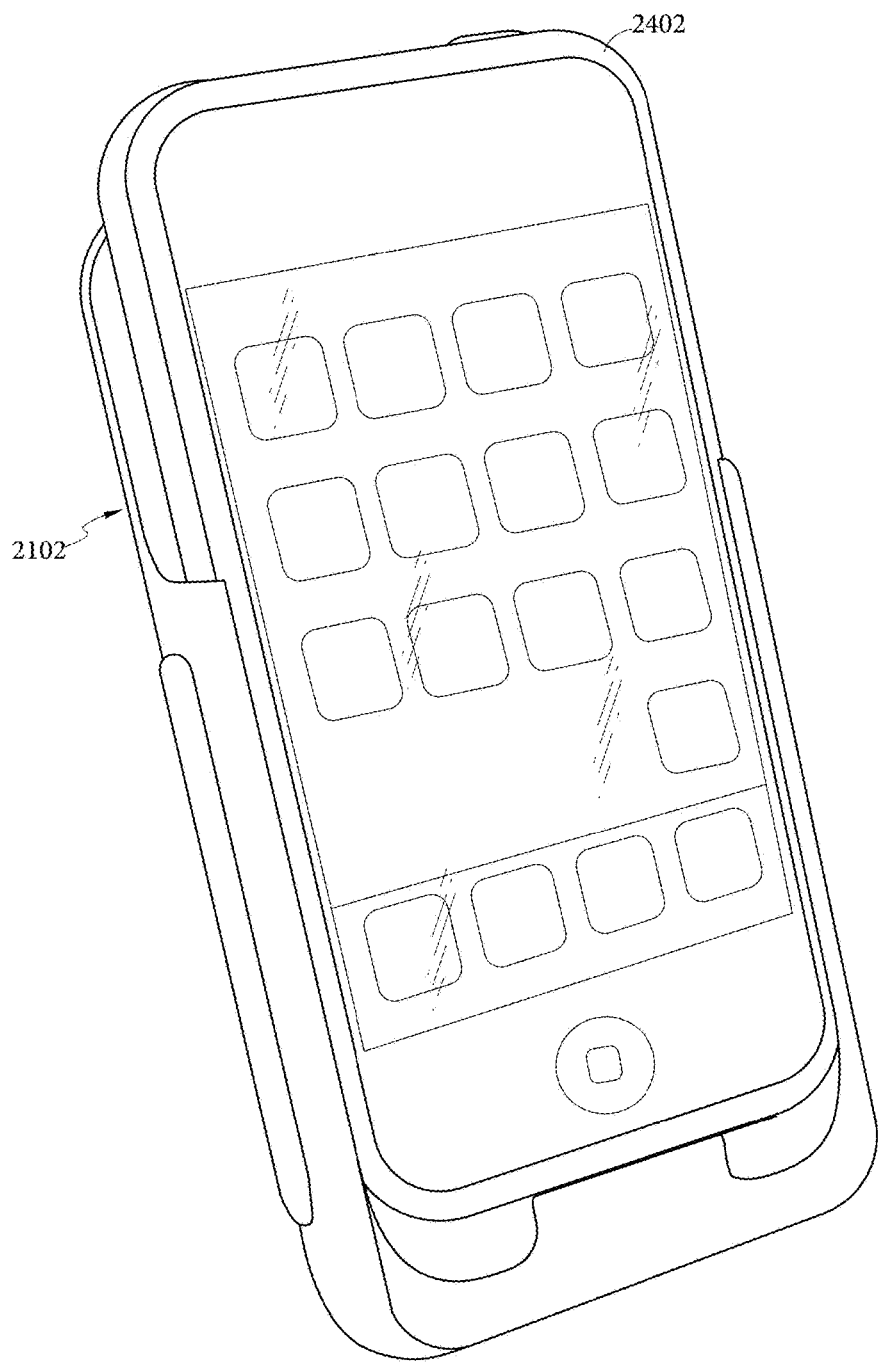
Figure 28:
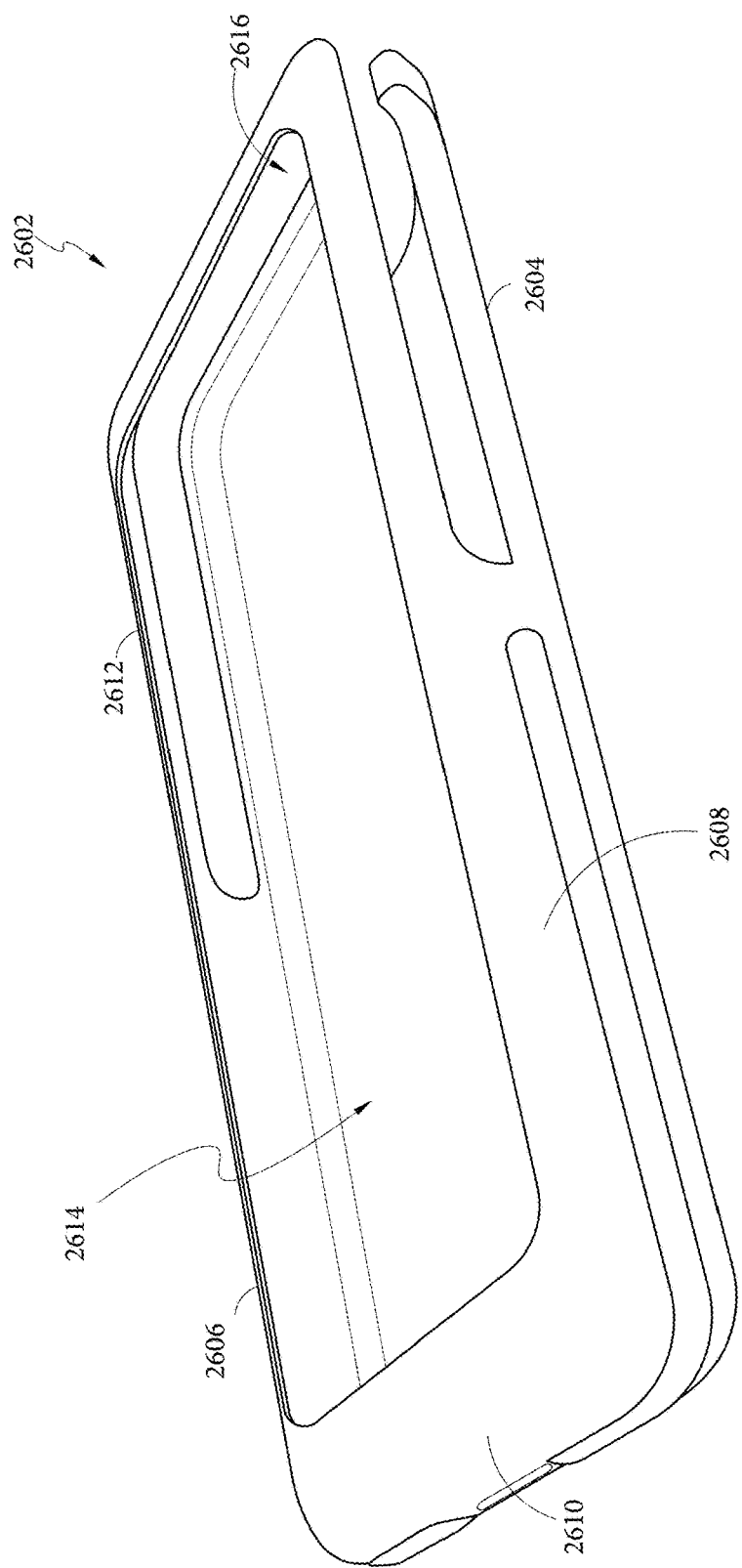
FIGS. 28-31 illustrate an embodiment of a mobile device holster.
Figure 29:
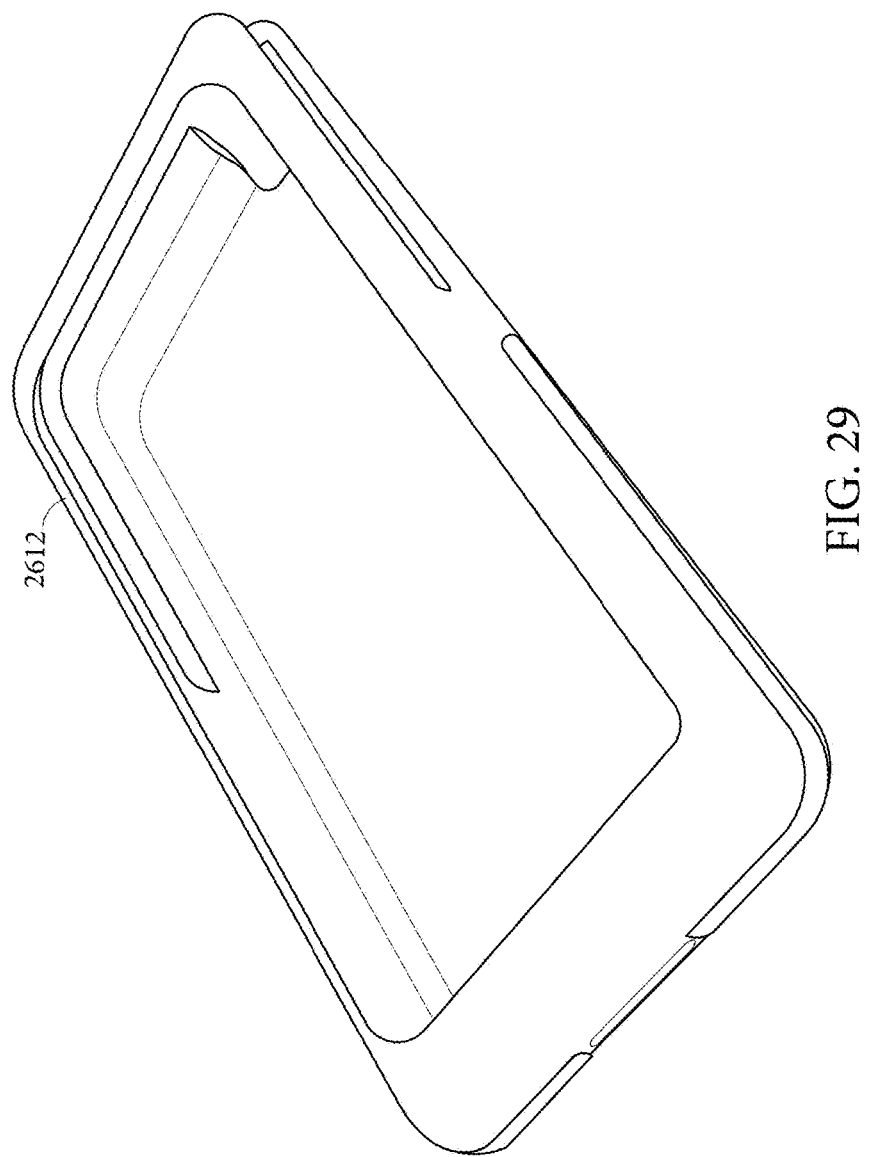
Figure 30:
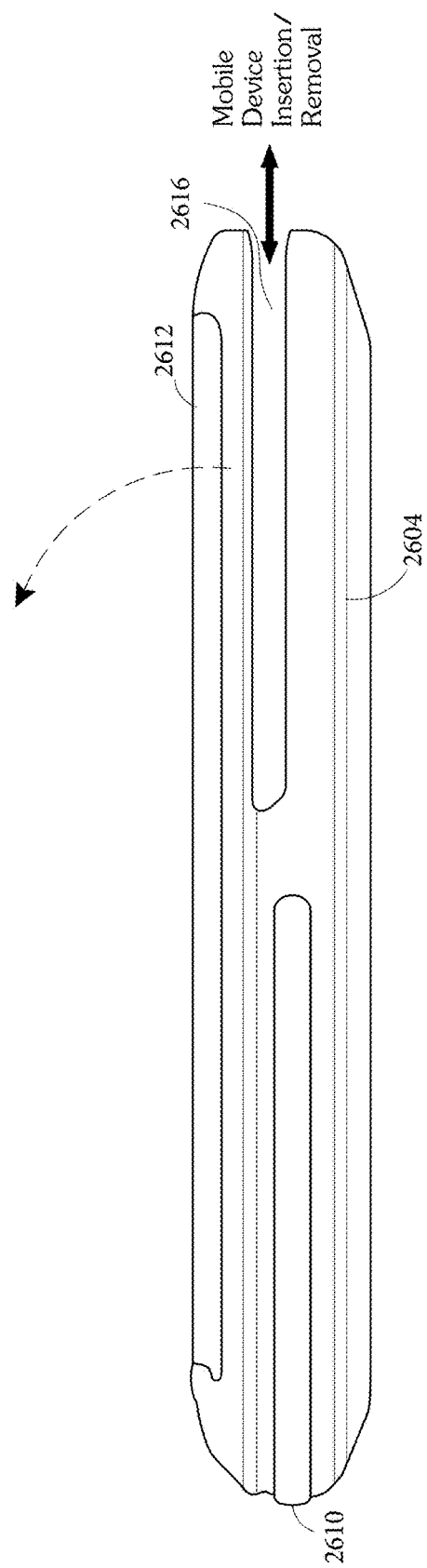

FIGS. 26 and 27 illustrate two different side views of how one type of mobile device 2402 (i.e., an iPhone™ by Apple Inc.) may be mounted or coupled to the battery pack 2102. The mobile device 2402 may slide into the battery pack 2102 and may be held in place or attached by the first and second sides 2106 and 2108 and/or device interface 2110.

Fourth Embodiment

FIGS. 28-31 illustrate an alternative embodiment of a mobile device holster. The holster 2602 may include a back plane 2604, a first and second sides 2606 and 2608, a bottom side 2610, and an upper flange 2612 which define a cavity 2614 for housing a mobile device. An opening 2616 may be defined between the upper flange 2612 and the back plane 2604. The upper flange 2612 may flex (as denoted in FIG. 30) to allow the mobile device to be inserted through the opening 2616 to insert the mobile device. Similarly, the upper flange 2612 may flex back to allow the mobile device to be removed. The upper flange 2612 and first and second sides 2606 and 2608 may be shaped to retain the mobile device when inserted into the holster 2602. In one example, the holster 2602 may include one or more interfaces that couple to the mobile device when the mobile device is housed within the holster. The interface act as a bridge to allow the mobile device to couple to an external device. For instance, the holster 2602 may be adapted to be coupled to an external battery pack to provide power to the mobile device.

Figure 31:
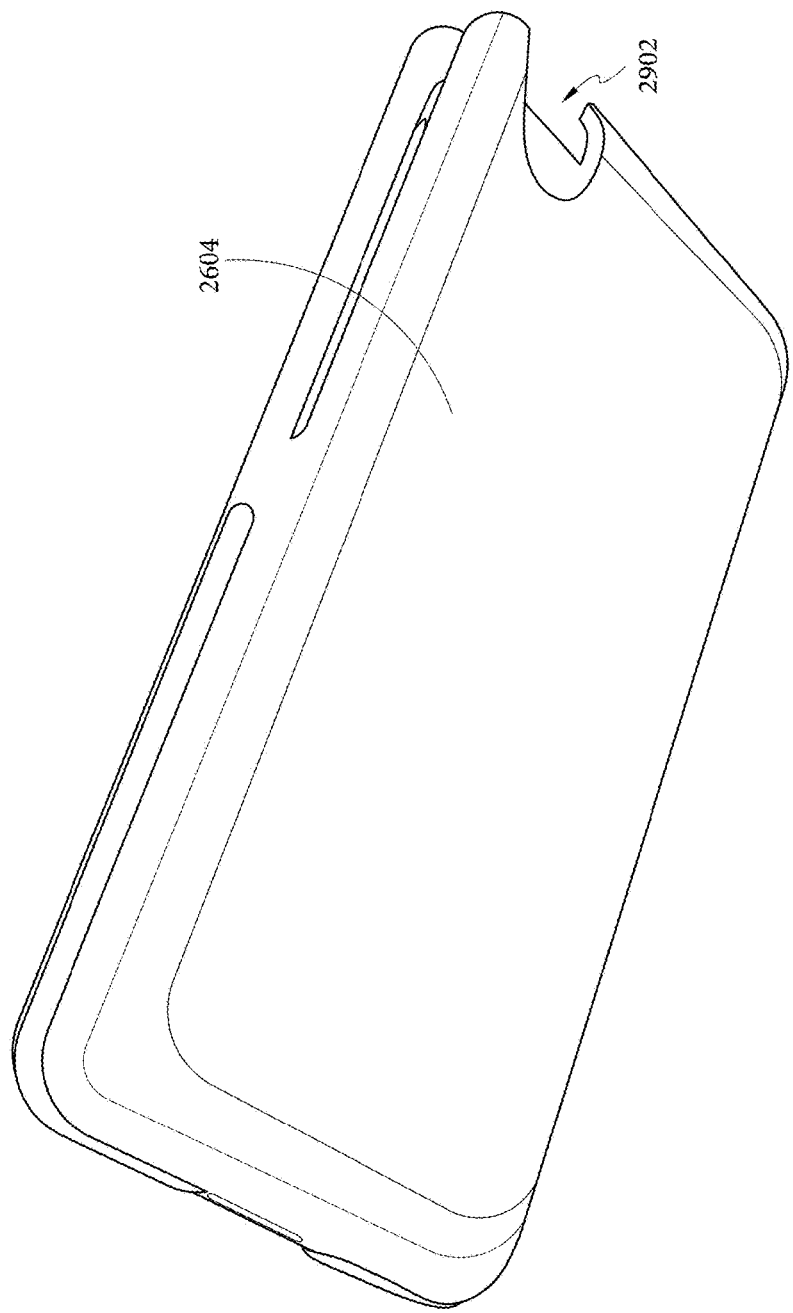
Figure 32:
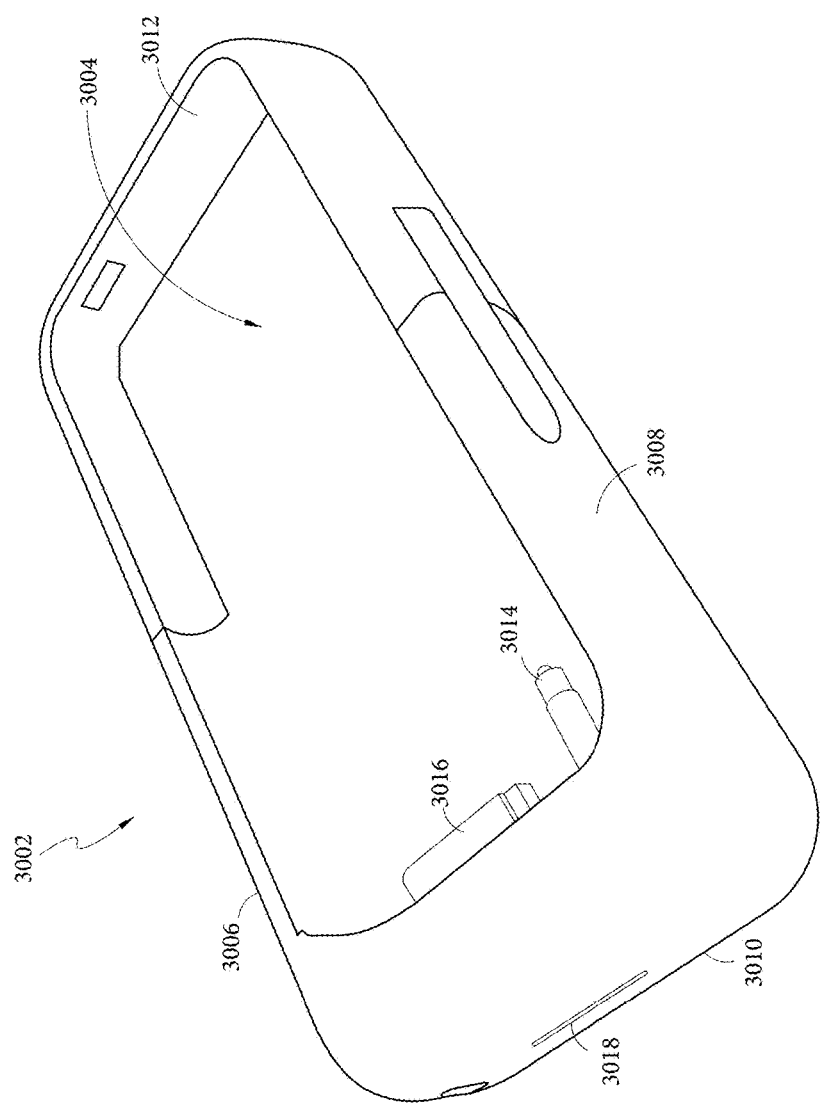
FIGS. 32-35B illustrate an alternative embodiment of a battery pack.
Figure 33A:
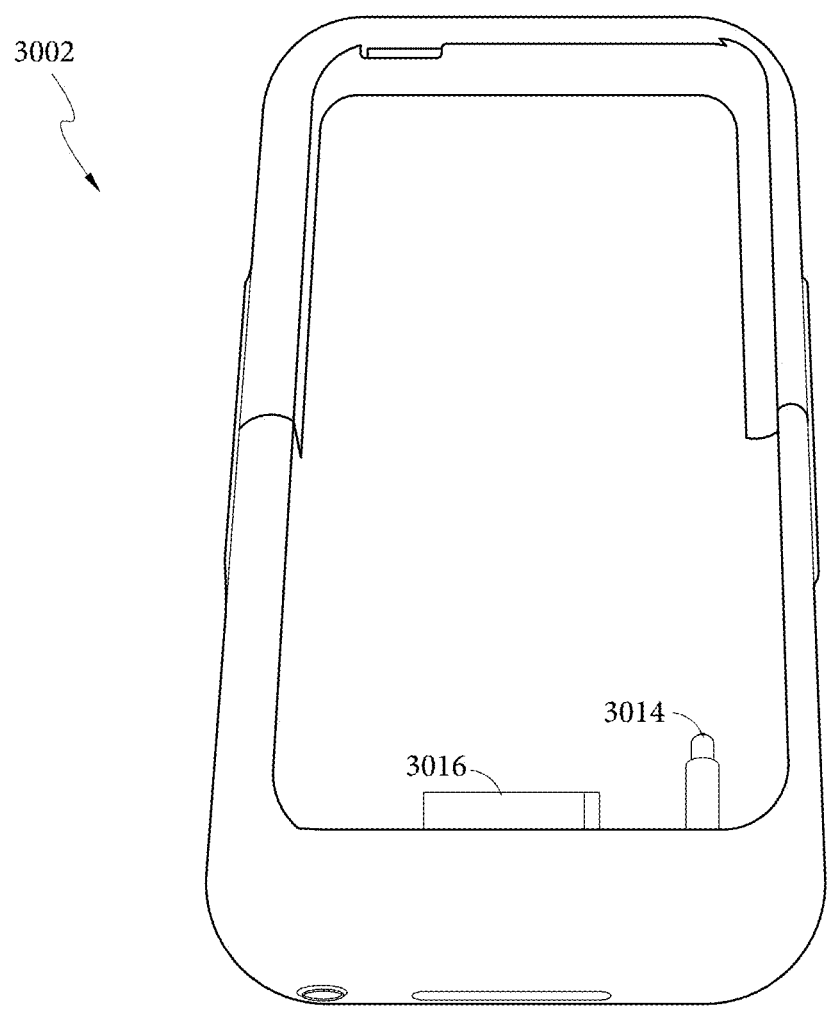
Figure 33B:
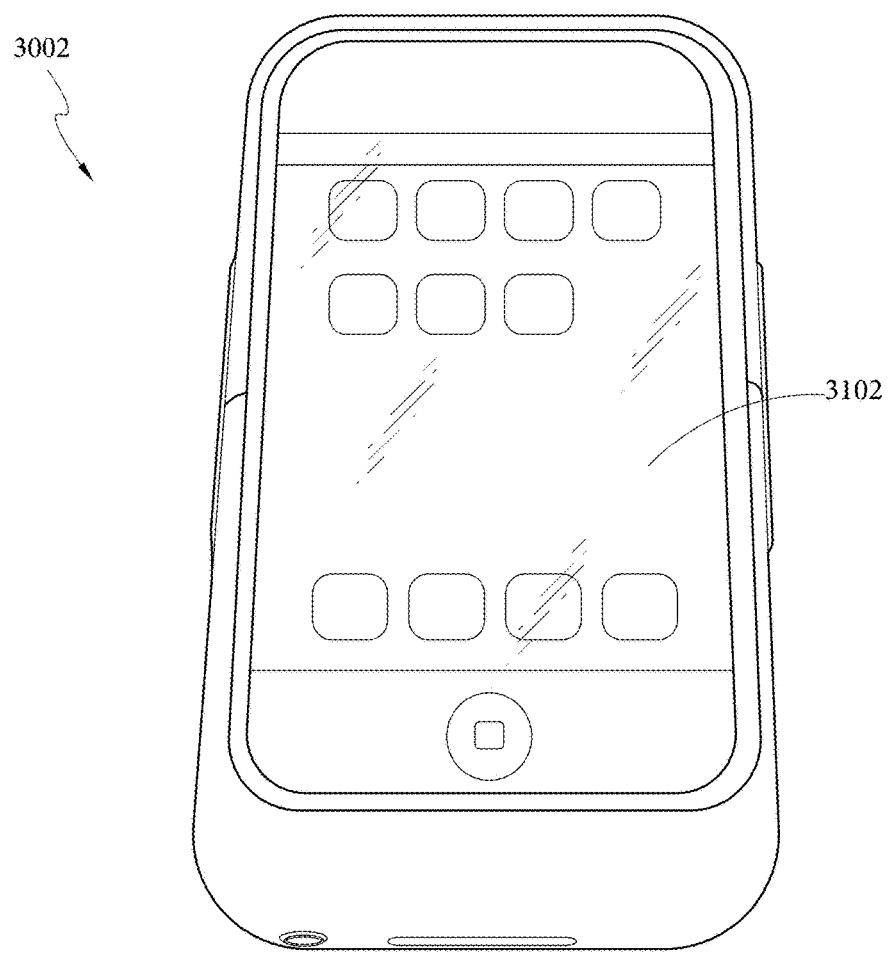

In an alternative embodiment, the holster 2602 may also include one or more rechargeable battery cells within the thickness of the back plane 2604 that can power the mobile device via a device interface. FIG. 31 illustrates one example of a back view of the holster 2612. An opening 2902 may be formed on the back plane 2604 to allow access to a reset or power button on the mobile device.

Fifth Embodiment

FIGS. 32-35 illustrate an alternative embodiment of a battery pack. The battery pack 3002 may include a back plane 3004, a first and second sides 3006 and 3008, a bottom side 3010, and an upper side 3012 which define a cavity 3004 for housing a mobile device. Additionally, the battery pack 3002 may include a first device interface 3014 and a second device interface 3016 (e.g., power connector, audio signals, control signal, data signals, etc.). In one embodiment, the second device interface 3016 may serve to provide power from one or more internal power cells (housed within the thickness of the back plane 3004). The internal power cells may be recharged via a third interface 1018 on the battery pack 3002. As illustrated in FIG. 33B, a mobile device 3102 may be inserted and housed by the battery pack 3002.

Figure 34A:
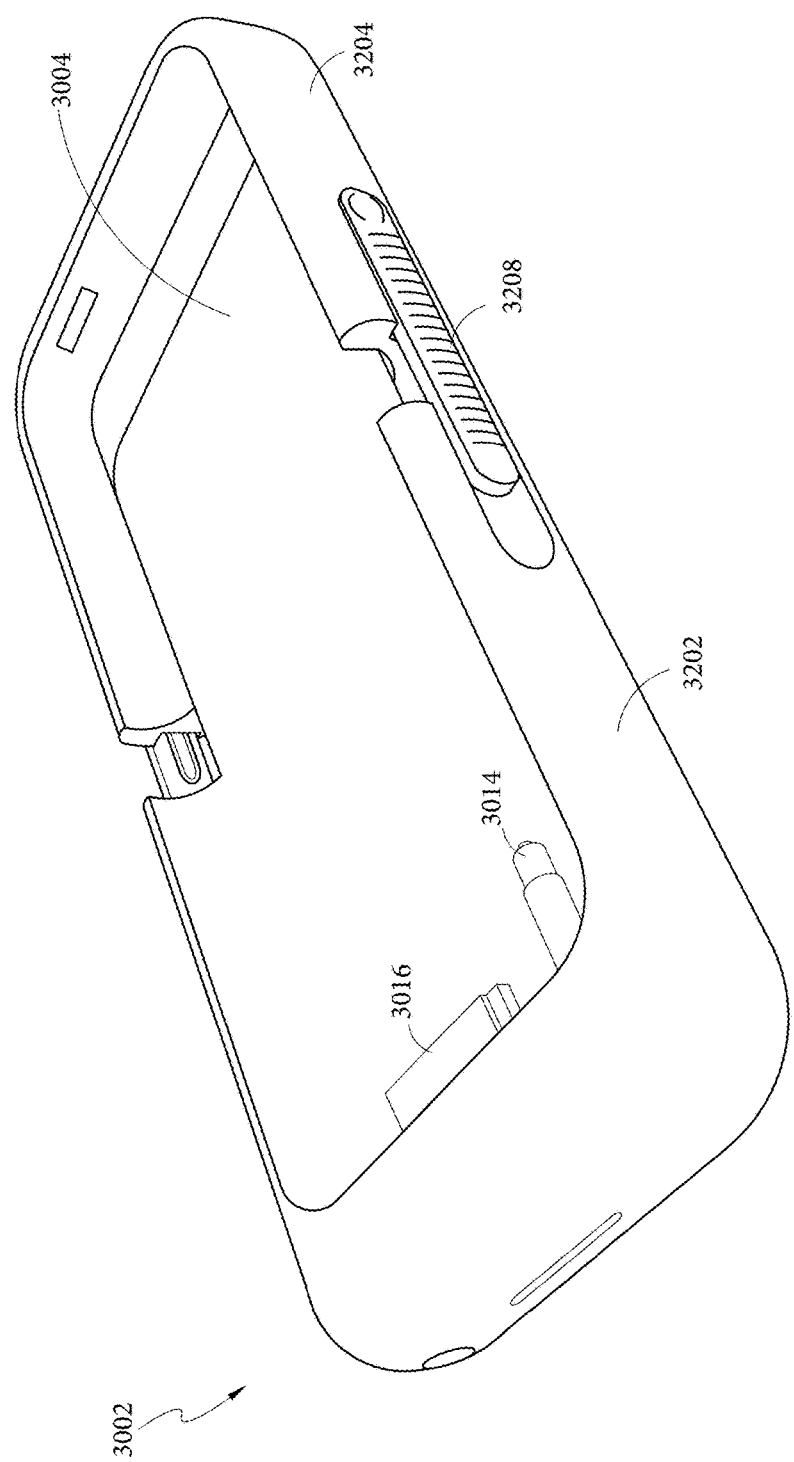
Figure 34B:
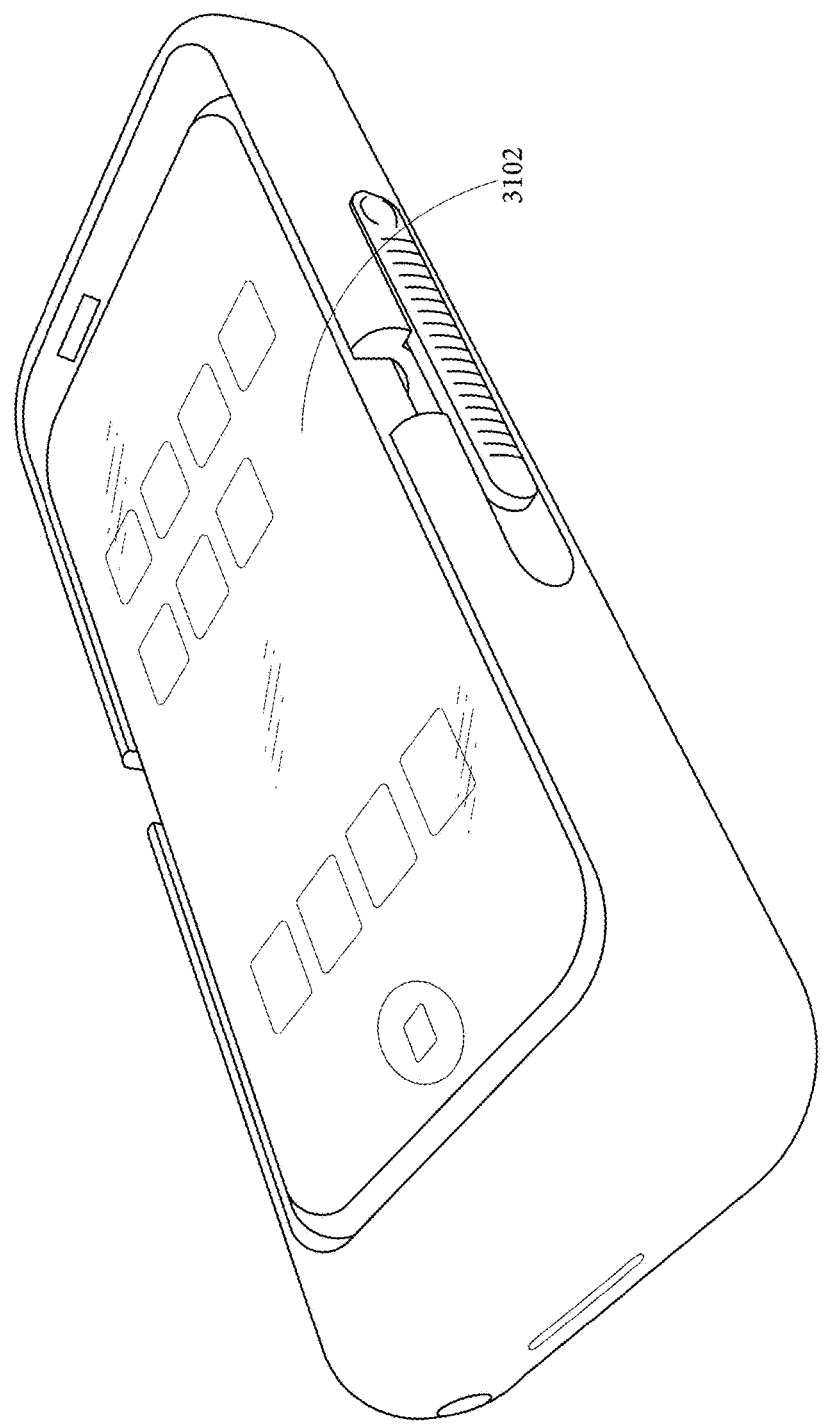
Figure 35A:
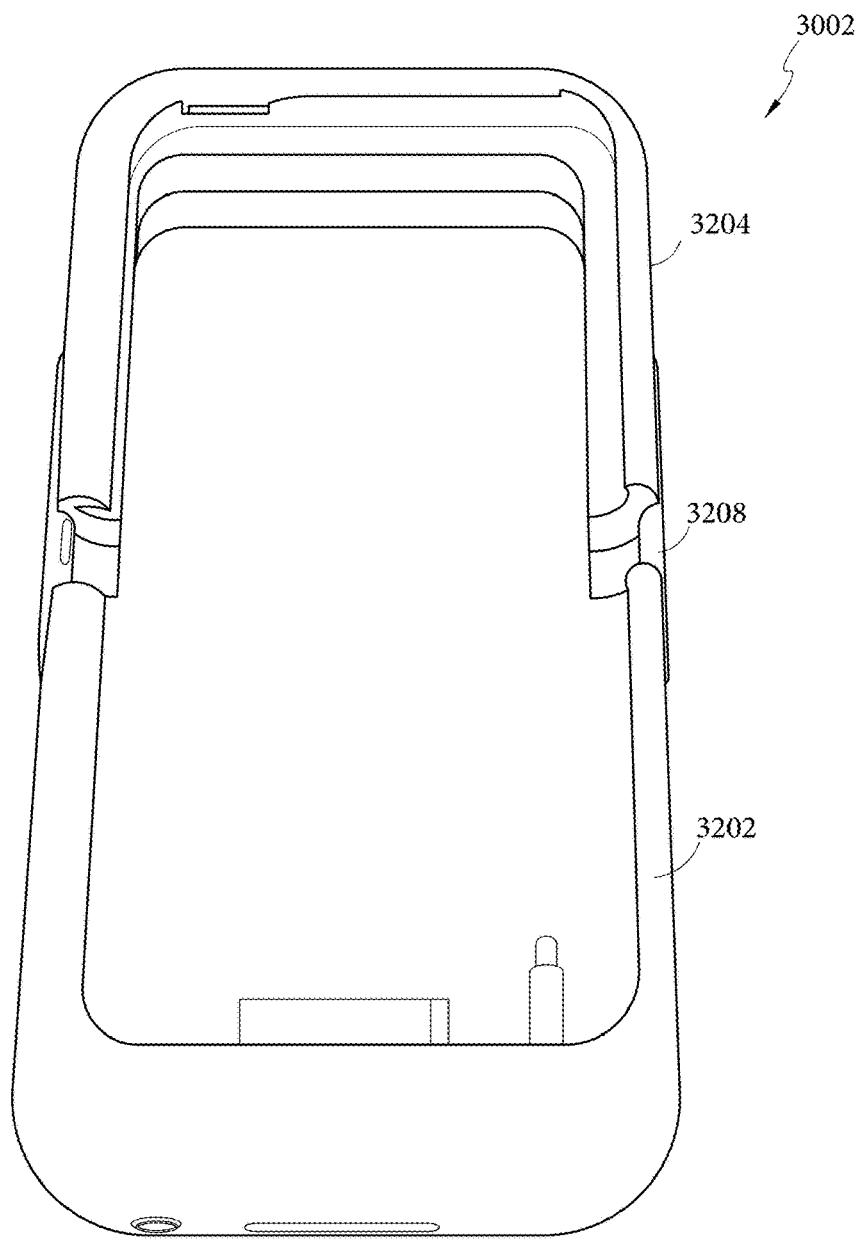
Figure 35B:
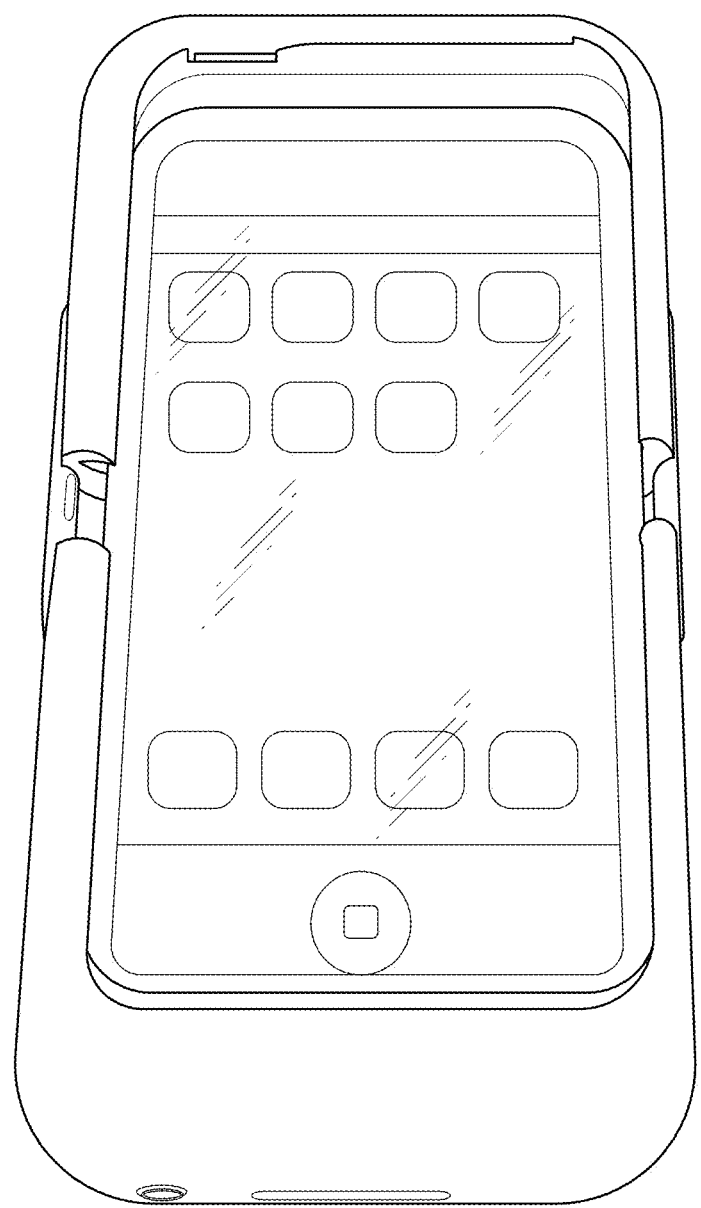
Figure 36A:
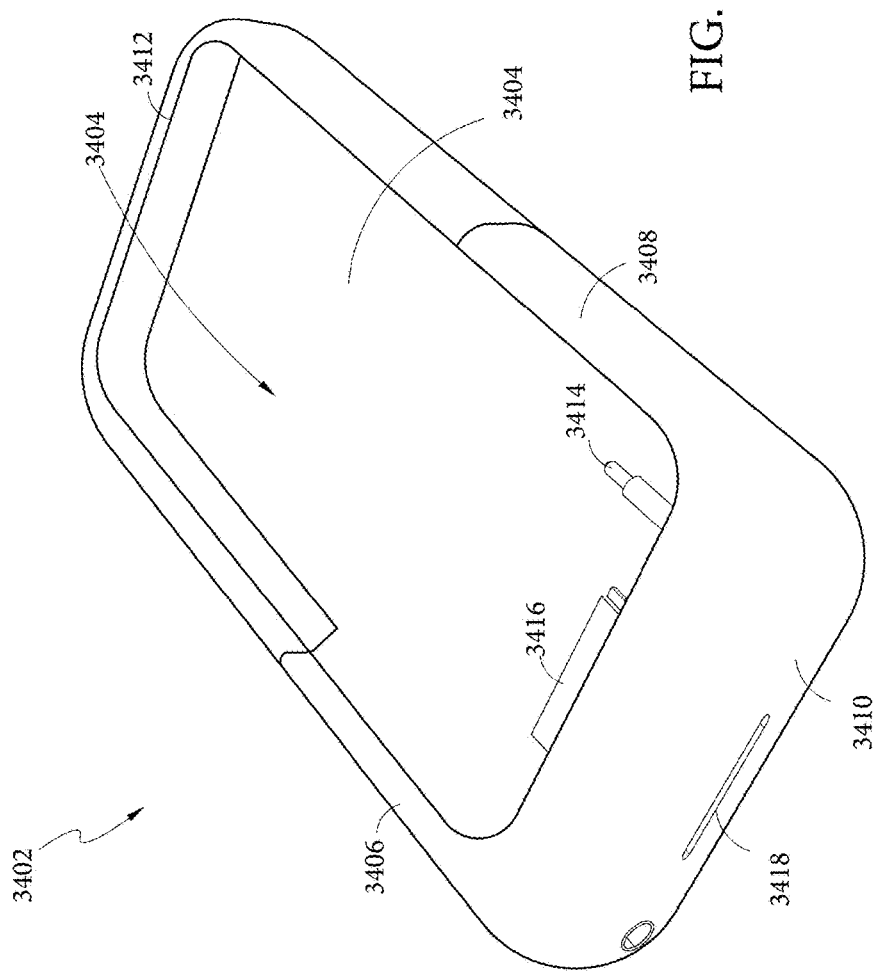
FIGS. 36A-40B illustrate an alternative embodiment of a battery pack.
Figure 36B:
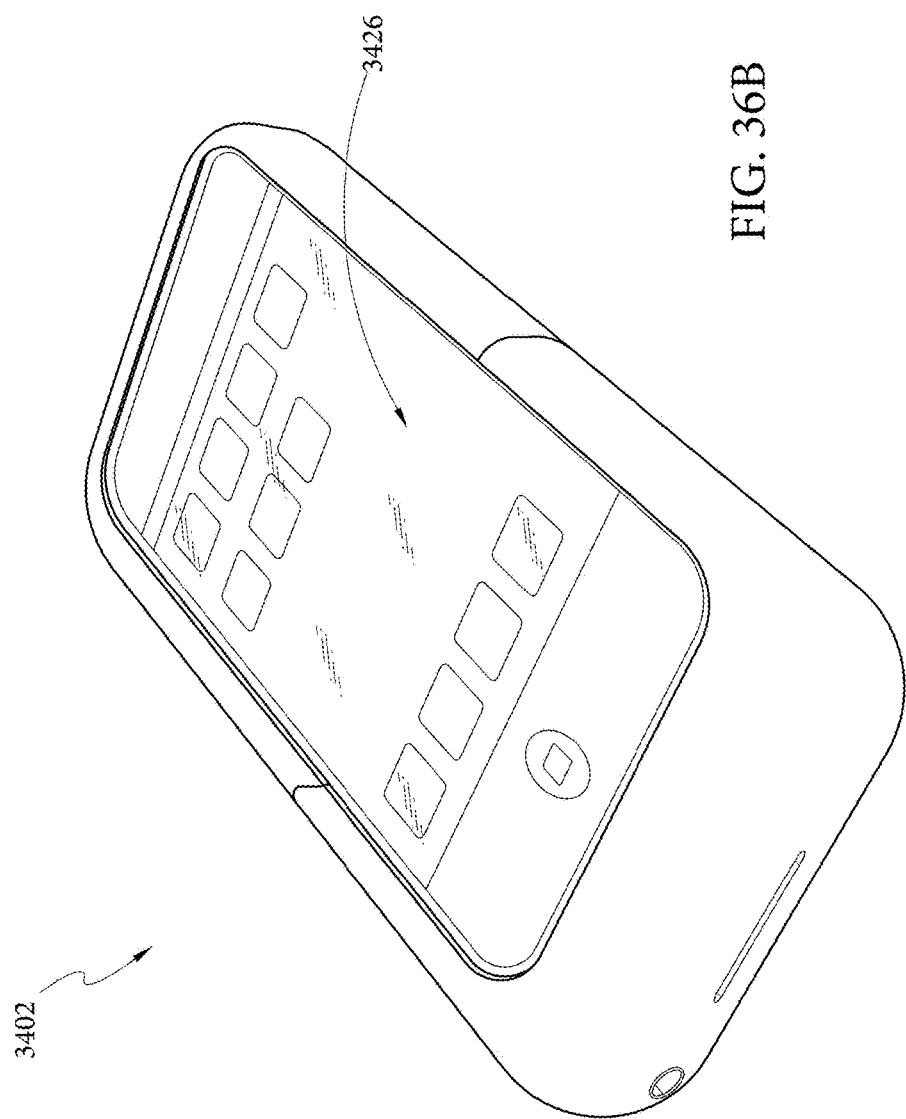
Figure 37A:
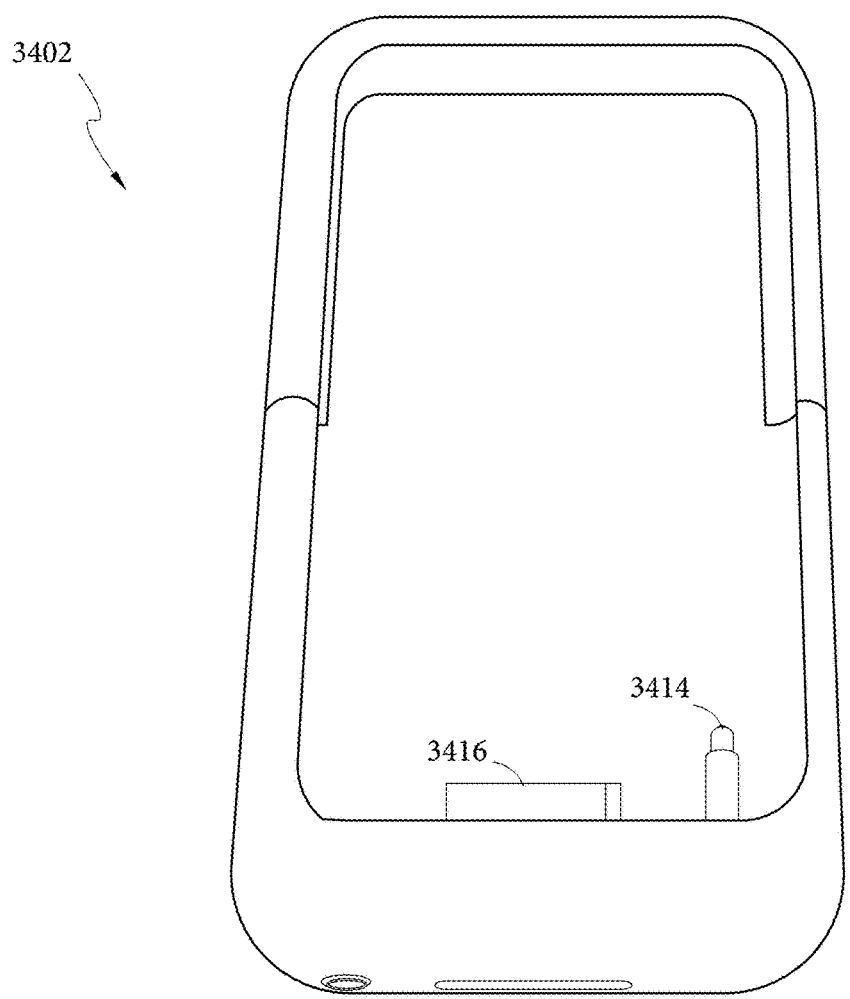
Figure 37B:
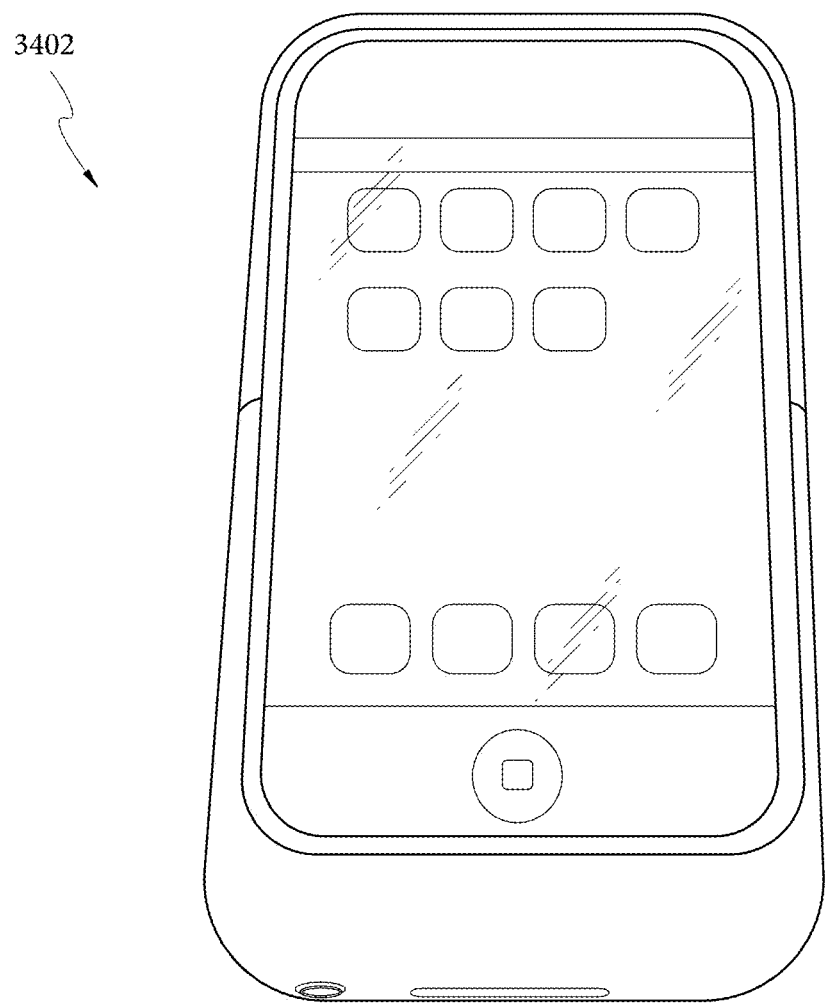
Figure 38A:
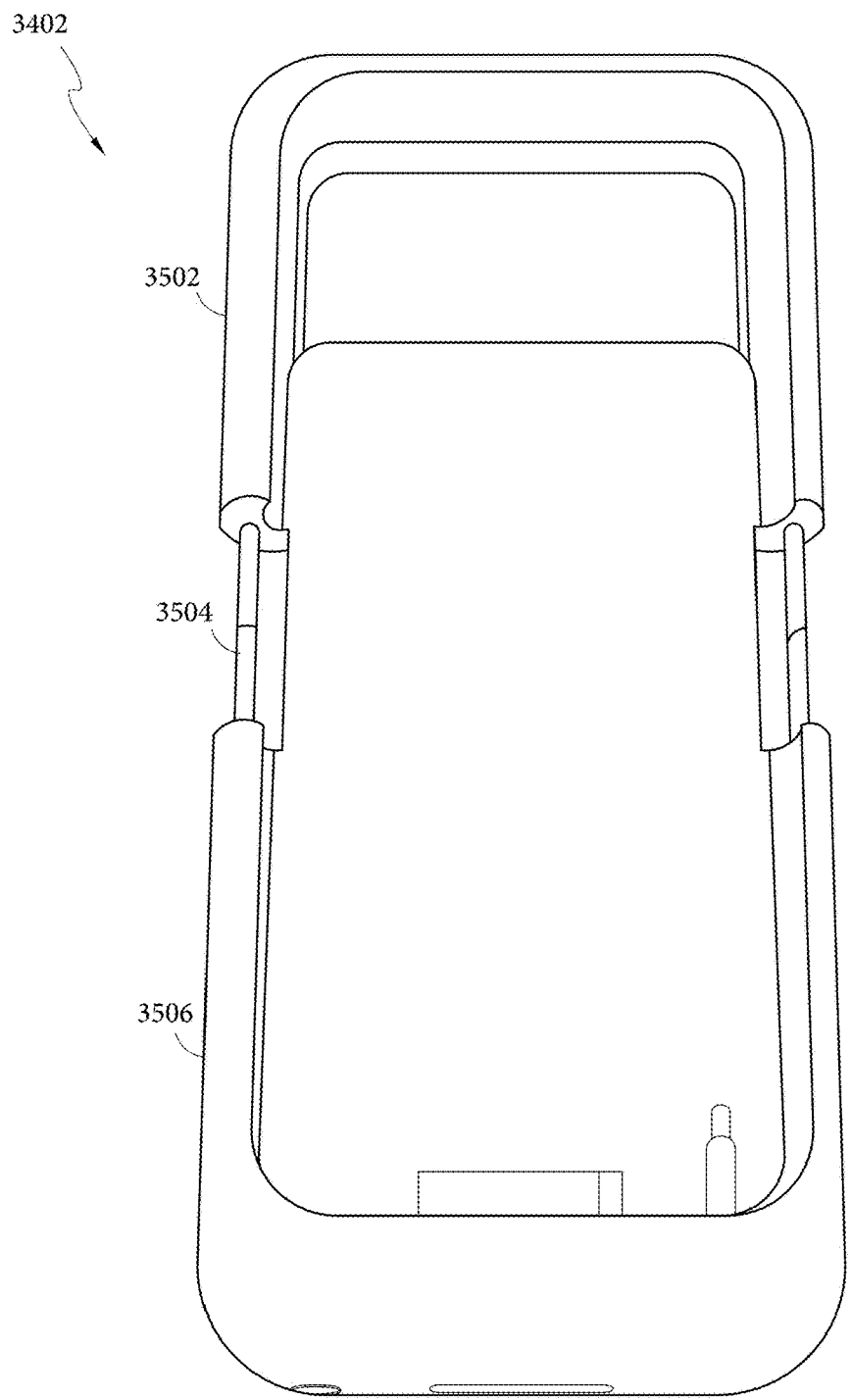
Figure 38B:
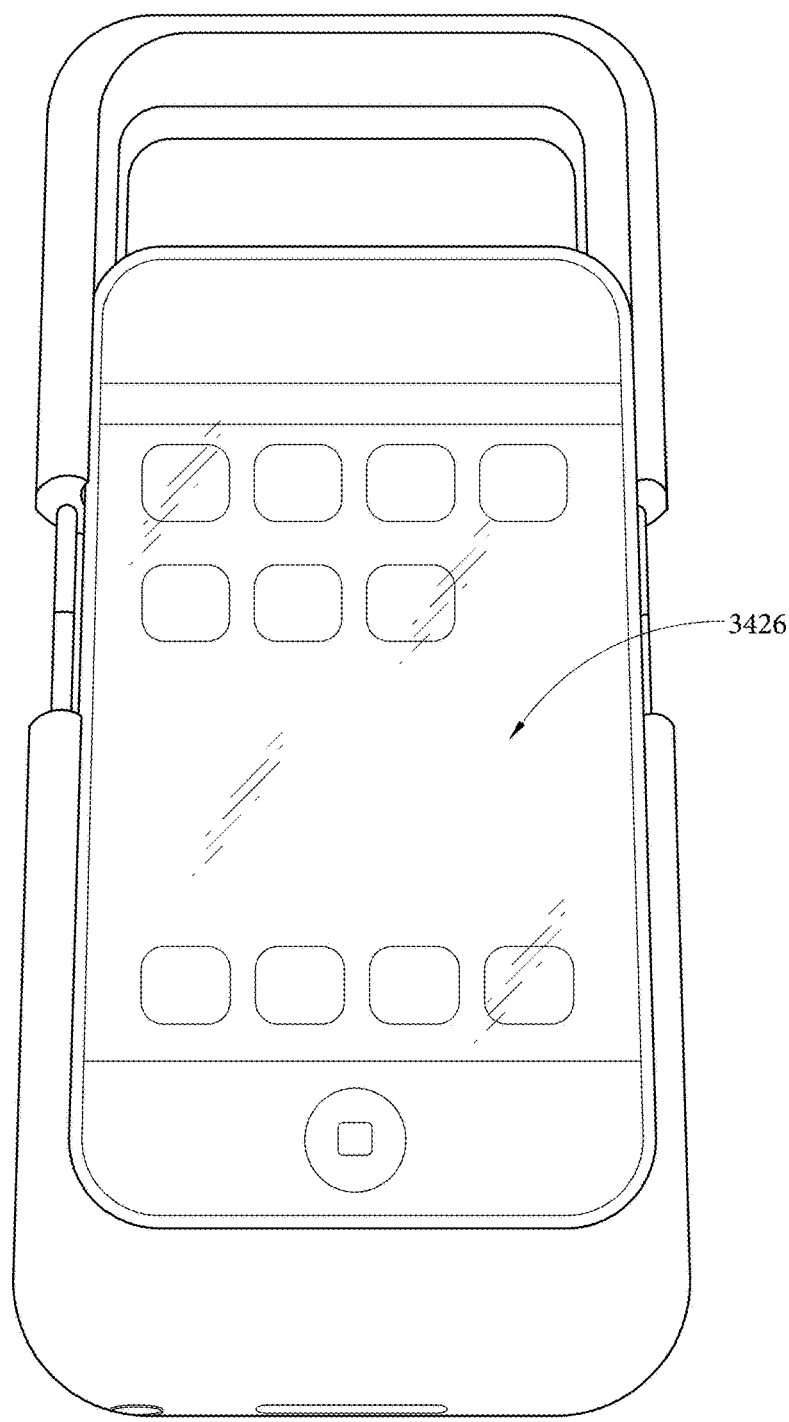
Figure 39A:
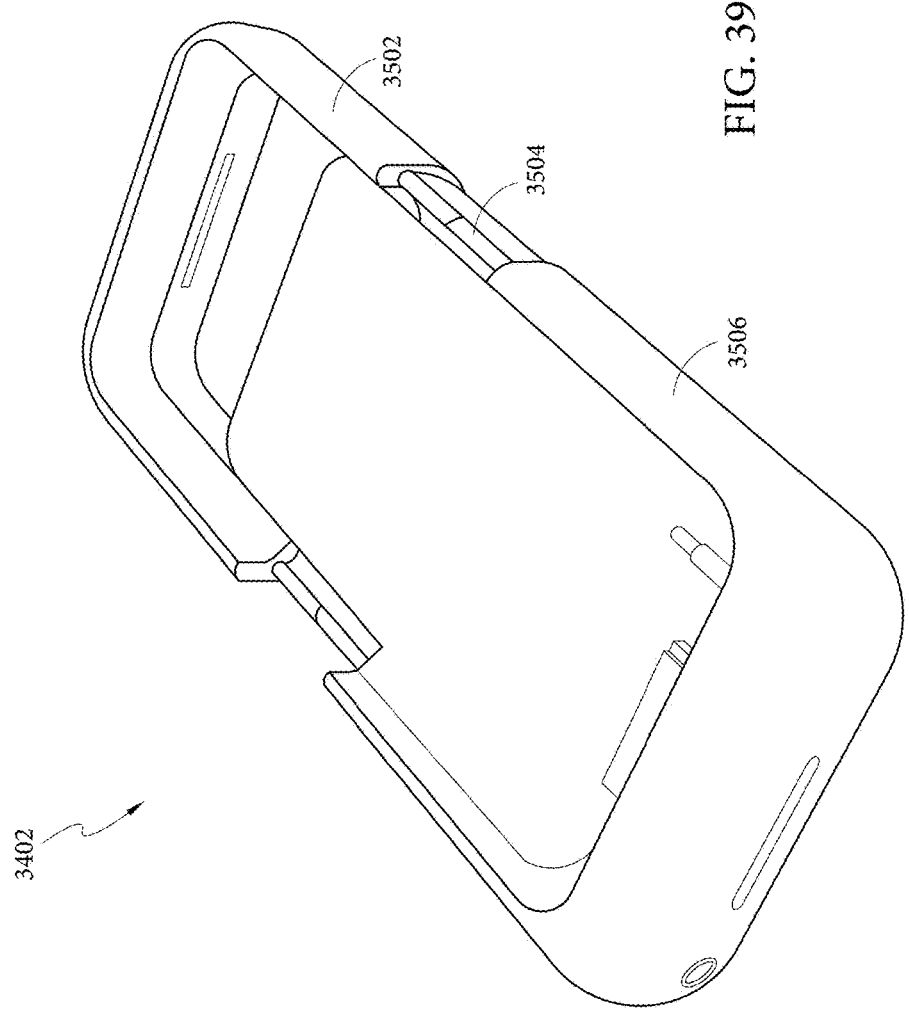
Figure 39B:
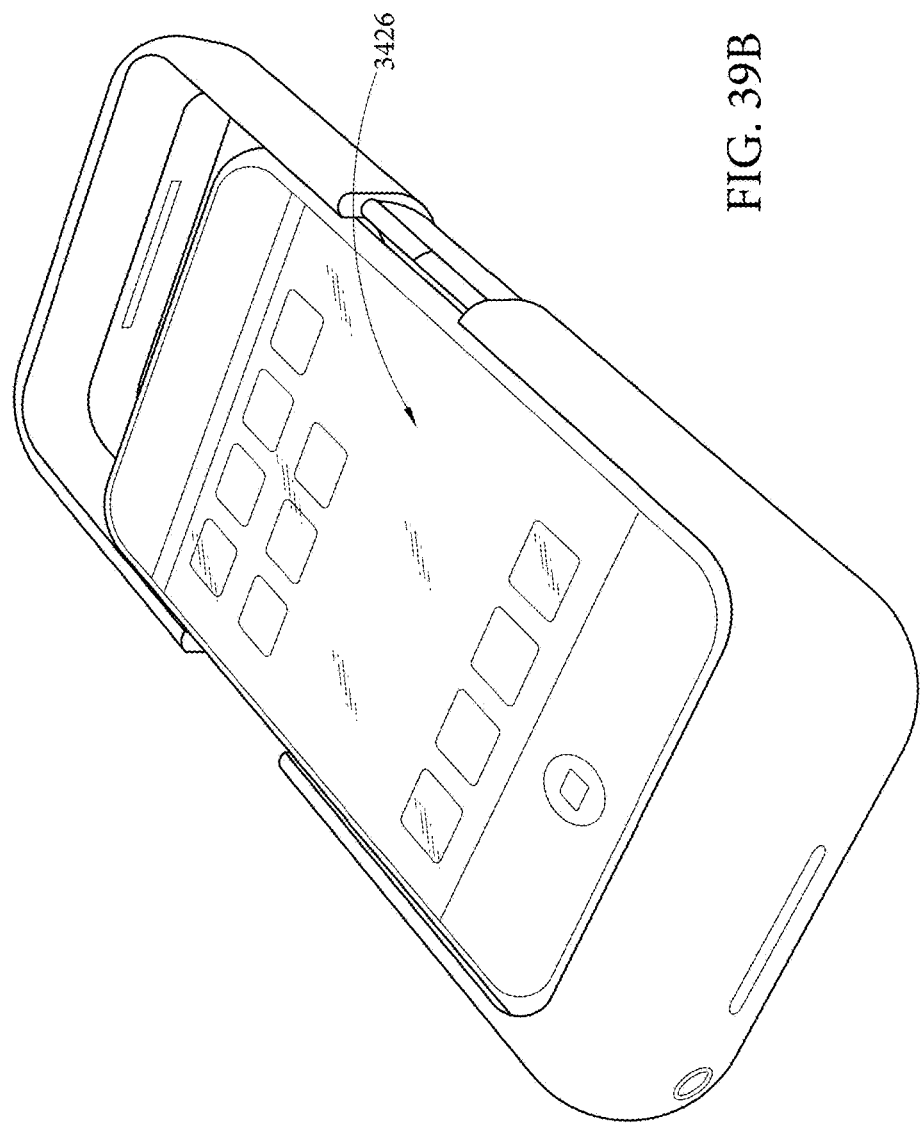
Figure 40B:
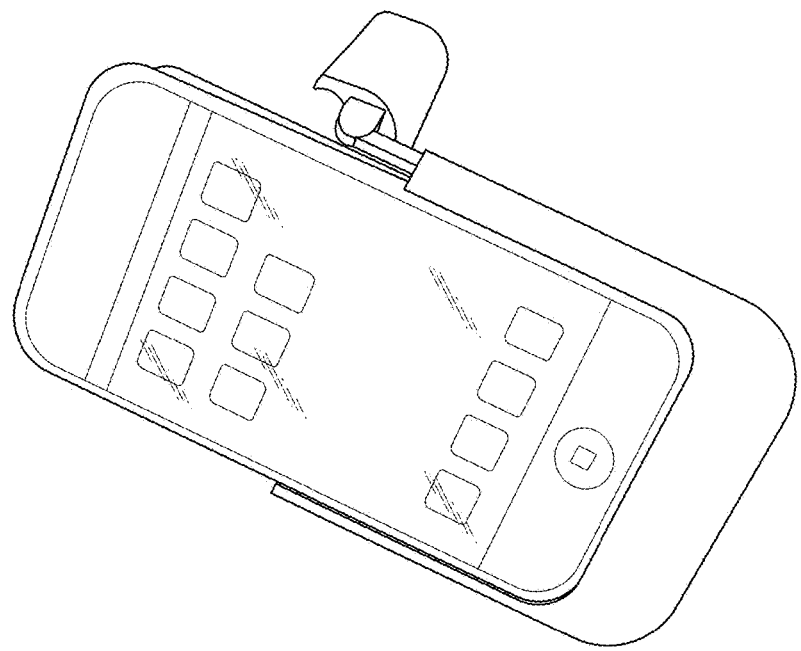
Figure 40A:
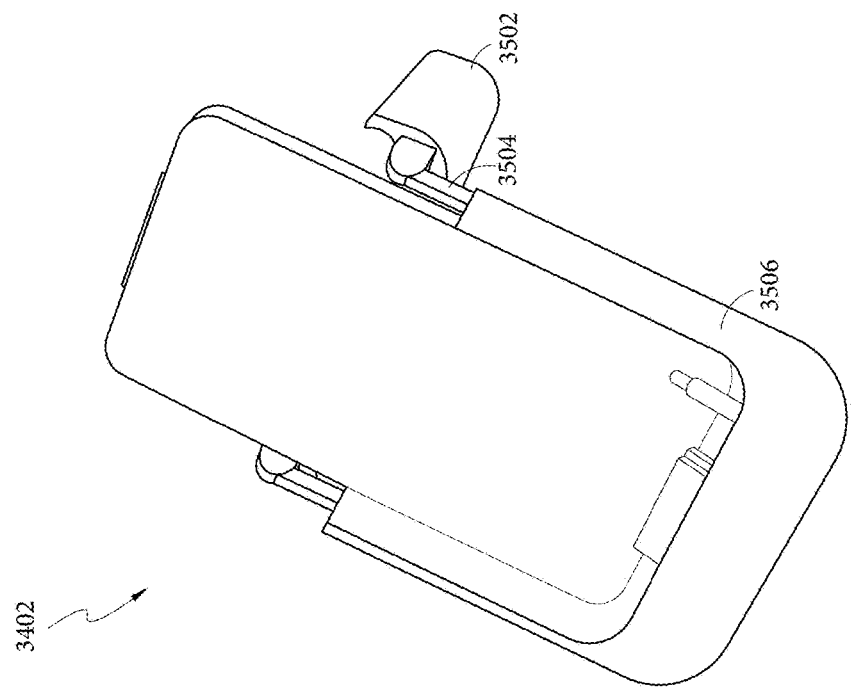

FIGS. 34 and 35 illustrate how the battery pack 3002 may be adapted to allow the mobile device 3102 to be inserted or removed. An upper portion 3204 may be movably separated from a lower portion 3202 of the battery pack 3002. The upper portion 3204 may slide on guides 3208 on both sides to create a space which allows the mobile device 3102 to detach from the interfaces 3014 and/or 3016. Once detached, the mobile device may be removed. Similarly, the space created by the upper portion 3204 sliding away from the bottom portion 3202 allows the mobile device to be inserted into the battery pack 3002.

The guides 3208 may also act as a stopper to prevent the upper portion 3204 from completely separating from the bottom portion 3202 once a separation limit is reached. Similarly, the guides 3208 may also include locking tabs that secure or couple the upper portion 3204 and lower portion 3202 together when they are in a closed position.

Sixth Embodiment

FIGS. 36-40B illustrate an alternative embodiment of a battery pack. The battery pack 3402 may include a back plane 3404, a first and second sides 3406 and 3408, a bottom side 3410, and an upper side 3412 which define a cavity 3404 for housing a mobile device 3426. Additionally, the battery pack 3402 may include a first device interface 3414 and a second device interface 3416 (e.g., power connector, audio signals, control signal, data signals, etc.). In one embodiment, the second device interface 3416 may serve to provide power from one or more internal power cells (housed within the thickness of the back plane 3404). The internal power cells may be recharged via a third interface 3418 on the battery pack 3402. As illustrated in FIG. 36B, a mobile device 3426 may be inserted and housed by the battery pack 3402.

FIGS. 38, 39, and 40A-B illustrate how the battery pack 3402 may be adapted to allow the mobile device 3426 to be inserted or removed. An upper portion 3502 may be movably separated from a lower portion 3506 of the battery pack 3402. The upper portion 3502 may slide on guides 3504 on both sides to create a space which allows the mobile device 3426 to detach from the interfaces 3414 and/or 3416. Once detached, the mobile device 3426 may be removed. Similarly, the space created by the upper portion 3502 sliding away from the bottom portion 3506 allows the mobile device to be inserted into the battery pack 3402.

To make it easier to insert and/or remove the mobile device 3426 from the battery pack 3402, the guides 3504 may include hinge points that allow the upper portion 3502 to fold relative to the bottom portion 3506, thereby allowing the mobile device 3426 to be removed or inserted with greater ease.

Additional Features

In some embodiments the back plane of the battery packs and/or holster of FIGS. 23-40B may house additional devices.

For example, the rear of the back plane may house an additional display screen extend the screen on the mobile device. The additional display screen may be electrically coupled to the mobile device (via an interface) to allow the mobile device to send images or video to the additional display screen.

In another example, the rear of the back plane may house a Braille input and/or output interface that electrically coupled a mobile device mounted within the holster or battery pack.

In yet another embodiment, the rear of the back plane may provide a keypad that serves as an input to the mobile device.

According to another feature, the battery pack and/or holster may provide an external interface (e.g., Bluetooth wireless interface, USB port, infrared port, etc.) that may allow the mobile device mounted in the battery pack and/or holster to communicate via that external interface. Thus the external interface may provide a different wireless interface than provided or supported by the internal system of the mobile device.

One embodiment includes a battery pack for a mobile device, comprising: a back plane, a first and second sides, a bottom side, wherein the back plane and first, second and bottom sides define a cavity or pocket for mounting the mobile device; and one or more battery cells housed within the thickness of the back plane. The one or more battery cells are rechargeable while a mobile device is mounted in the cavity or pocket. The battery pack further comprises an interface to electrically couple the one or more battery cells to the mobile device. The battery pack further comprising one or more speakers housed within the thickness of the back plane and electrically coupled to an interface to allow a mobile device mounted in the cavity or pocket to send audio signals through the one or more speakers. The battery pack further comprising one or more microphones housed within the thickness of the back plane and electrically coupled to an interface to allow a mobile device mounted in the cavity or pocket to receive audio signals from the one or more microphones.

One or more of the features illustrated in FIGS. 1-40B may be rearranged and/or combined into a single component or embodied in several components. Additional components may also be added without departing from the invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The following is claimed:
1. A protective battery case for use with a mobile phone, the protective battery case comprising:
a protective casing comprising:

a back wall configured to be positioned adjacent to at least a portion of a back side of a mobile phone;
an upper wall configured to be positioned adjacent to at least a portion of a top of the mobile phone;
a right side wall configured to be positioned adjacent to at least a portion of a right side of the mobile phone;
a left side wall configured to be positioned adjacent to at least a portion of a left side of the mobile phone;
a front opening configured such that a display of the mobile phone is visible through the front opening;
wherein an external shape of the casing generally conforms to an external shape of the mobile phone such that the mobile phone is usable while inside the casing;
wherein a portion of the casing is flexible to facilitate insertion of the mobile phone into the casing or to facilitate removal of the mobile phone from the casing;
a battery housed within a thickness of the back wall such that the battery is configured to be positioned behind the back side of the mobile phone;
a charge level indicator configured to indicate the charge level of the battery;
a first interface coupled to the battery and configured to charge the mobile phone using the battery;
a second interface coupled to the battery and configured to recharge the battery, wherein the second interface comprises an external port configured to receive a connector for wired recharging of the battery; and
a third interface coupled to the battery and configured to recharge the battery, wherein the third interface comprises a wireless charging device for recharging the battery wirelessly.

2. The case of claim 1, wherein the case is configured to wirelessly transmit signals to the mobile phone.

3. The case of claim 1, wherein the first interface comprises a connector configured to engage a corresponding port on the mobile phone.

4. The case of claim 1, wherein the casing comprises a bottom wall configured to be positioned adjacent to at least a portion of a bottom of the mobile phone, and wherein the first interface comprises a connector that extends upward from the bottom wall.

5. The case of claim 1, wherein the wireless charging device includes an inductive electrical recharging system.

6. The case of claim 1, further comprising a user input element configured to enable a user to start and stop charging from the battery to the mobile phone.

7. The case of claim 1, wherein a thickness of the protective battery case is less than twice the thickness of the mobile phone.

8. A battery case for use with a mobile electronic device, the battery case comprising:
a housing comprising:
a cavity that is configured to receive a mobile electronic device, the mobile electronic device having a primary battery for powering the mobile electronic device; and
a front opening configured such that a display of the mobile electronic device is visible through the front opening; and
a supplemental battery for supplying supplemental power to the mobile electronic device, wherein the supplemental battery is housed within a thickness of the housing such that the supplemental battery is configured to be positioned behind a back side of the mobile electronic device; and
a wireless charging system coupled to the supplemental battery, wherein the wireless charging system is configured to recharge the supplemental battery wirelessly;
wherein the battery case is configured to transmit wireless signals to the mobile electronic device.

9. The case of claim 8, wherein the wireless signals comprise data or an alarm.

10. The case of claim 8, further comprising a battery charge level indicator configured to indicate the charge level of the supplemental battery.

11. The case of claim 8, wherein a portion of the housing is flexible facilitate insertion of the mobile electronic device into the housing or to facilitate removal of the mobile electronic device from the housing.

12. The case of claim 8, wherein the housing comprises a lower housing portion and an upper housing portion configured to couple to the lower housing portion, wherein the upper housing portion is removable from the lower housing portion to facilitate insertion of the mobile electronic device into the housing or to facilitate removal of the mobile electronic device from the housing.

13. The case of claim 8, further comprising a connector that is configured to engage a corresponding port on the mobile electronic device to deliver charge from the supplemental battery to the mobile electronic device.

14. The case of claim 8, further comprising a user input element to start and stop charging from the supplemental battery to the mobile electronic device.

15. The case of claim 8, wherein the battery case is configured for use with a mobile phone, and wherein an outer surface of the housing generally conforms to an external shape of the mobile phone such that the mobile phone is usable while inside the housing.

16. A method of making a protective battery case for use with a mobile phone, the method comprising:
providing a protective casing that comprises:
a back wall configured to be positioned adjacent to at least a portion of a back side of a mobile phone;
an upper wall configured to be positioned adjacent to at least a portion of a top of the mobile phone;
a right side wall configured to be positioned adjacent to at least a portion of a right side of the mobile phone;
a left side wall configured to be positioned adjacent to at least a portion of a left side of the mobile phone;
a front opening configured such that a display of the mobile phone is visible through the front opening;
wherein an external shape of the casing generally conforms to an external shape of the mobile phone such that the mobile phone is usable while inside the casing;
wherein a portion of the casing is flexible to facilitate insertion of the mobile phone into the casing or to facilitate removal of the mobile phone from the casing;
disposing a battery within a thickness of the back wall such that the battery is configured to be positioned behind the back side of the mobile phone;
providing a charge level indicator configured to indicate the charge level of the battery;
providing a first interface coupled to the battery and configured to charge the mobile phone using the battery;
providing a second interface coupled to the battery and configured to recharge the battery, wherein the second interface comprises an external port configured to receive a connector for wired recharging of the battery; and providing a third interface coupled to the battery and configured to recharge the battery, wherein the third interface comprises a wireless charging device for recharging the battery wirelessly.

17. The method of claim 16, wherein the case is configured to wirelessly transmit signals to the mobile phone.

18. The method of claim 16, wherein the first interface comprises a connector configured to engage a corresponding port on the mobile phone.

19. The method of claim 16, wherein the casing comprises a bottom wall configured to be positioned adjacent to at least a portion of a bottom of the mobile phone, and wherein the first interface comprises a connector that extends upward from the bottom wall.

20. The method of claim 16, wherein the wireless charging device includes an inductive electrical recharging system.

21. The method of claim 16, further comprising providing a user input element configured to enable a user to start and stop charging from the battery to the mobile phone.

22. The method of claim 16, wherein a thickness of the protective battery case is less than twice the thickness of the mobile phone.

23. A method of making a battery case for use with a mobile electronic device, the method comprising:
    providing a housing that comprises:
        a cavity that is configured to receive a mobile electronic device, the mobile electronic device having a primary battery for powering the mobile electronic device; and
        a front opening configured such that a display of the mobile electronic device is visible through the front opening; and
    disposing a supplemental battery within a thickness of the housing such that the supplemental battery is configured to be positioned behind a back side of the mobile electronic device, wherein the supplement battery is configured to supply supplemental power to the mobile electronic device; and
    providing a wireless charging system coupled to the supplemental battery, wherein the wireless charging system is configured to recharge the supplemental battery wirelessly;
    wherein the battery case is configured to transmit wireless signals to the mobile electronic device.

24. The method of claim 23, wherein the wireless signals comprise data or an alarm.

25. The method of claim 23, further comprising providing a battery charge level indicator configured to indicate the charge level of the supplemental battery.

26. The method of claim 23, wherein a portion of the housing is flexible facilitate insertion of the mobile electronic device into the housing or to facilitate removal of the mobile electronic device from the housing.

27. The method of claim 23, wherein the housing comprises a lower housing portion and an upper housing portion configured to couple to the lower housing portion, wherein the upper housing portion is removable from the lower housing portion to facilitate insertion of the mobile electronic device into the housing or to facilitate removal of the mobile electronic device from the housing.

28. The method of claim 23, further comprising providing a connector that is configured to engage a corresponding port on the mobile electronic device to deliver charge from the supplemental battery to the mobile electronic device.

29. The method of claim 23, further comprising providing a user input element to start and stop charging from the supplemental battery to the mobile electronic device.

30. The method of claim 23, wherein the battery case is configured for use with a mobile phone, and wherein an outer surface of the housing generally conforms to an external shape of the mobile phone such that the mobile phone is usable while inside the housing.

* * * * *